US010134789B2

(12) United States Patent
Okamoto et al.

(10) Patent No.: US 10,134,789 B2
(45) Date of Patent: Nov. 20, 2018

(54) IMAGING DEVICE AND ELECTRONIC DEVICE

(71) Applicant: Semiconductor Energy Laboratory Co., Ltd., Atsugi-shi, Kanagawa-ken (JP)

(72) Inventors: Yuki Okamoto, Atsugi (JP); Yoshiyuki Kurokawa, Sagamihara (JP); Hiroki Inoue, Atsugi (JP); Takuro Ohmaru, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 27 days.

(21) Appl. No.: 14/746,926

(22) Filed: Jun. 23, 2015

(65) Prior Publication Data

US 2015/0380450 A1  Dec. 31, 2015

(30) Foreign Application Priority Data

Jun. 27, 2014 (JP) .................................. 2014-132831
Jul. 4, 2014 (JP) .................................. 2014-138703

(51) Int. Cl.
| | | |
|---|---|---|
| H01L 27/146 | (2006.01) | |
| H01L 29/786 | (2006.01) | |
| H01L 31/105 | (2006.01) | |
| H01L 31/0272 | (2006.01) | |

(52) U.S. Cl.
CPC .. *H01L 27/14616* (2013.01); *H01L 27/14603* (2013.01); *H01L 27/14621* (2013.01); *H01L 27/14641* (2013.01); *H01L 29/7869* (2013.01); *H01L 31/0272* (2013.01); *H01L 31/105* (2013.01); *H01L 27/14643* (2013.01)

(58) Field of Classification Search
CPC ......... H01L 27/14616; H01L 27/14603; H01L 27/14621; H01L 27/14641; H01L 31/0272; H01L 29/7869; H01L 31/105; H01L 27/14643
See application file for complete search history.

(56) References Cited

U.S. PATENT DOCUMENTS

| | | |
|---|---|---|
| 7,046,282 B1 | 5/2006 | Zhang et al. |
| 8,378,391 B2 | 2/2013 | Koyama et al. |
| 8,605,059 B2 | 12/2013 | Kurokawa et al. |

(Continued)

*Primary Examiner* — Latanya N Crawford
(74) *Attorney, Agent, or Firm* — Fish & Richardson P.C.

(57) ABSTRACT

An imaging device with high productivity and improved dynamic range is provided. The imaging device includes a pixel driver circuit and a photoelectric conversion element including a p-type semiconductor, an n-type semiconductor, and an i-type semiconductor. In a plan view, the total area of a part of the i-type semiconductor overlapped with neither a metal material nor a semiconductor material constituting the pixel driver circuit is preferably greater than or equal to 65%, more preferably greater than or equal to 80%, and still more preferably greater than or equal to 90% of the area of the whole i-type semiconductor. Plural photoelectric conversion elements are provided in the same semiconductor, whereby a process for separating the photoelectric conversion elements can be omitted. The i-type semiconductors in the plural photoelectric conversion elements are separated from each other by the p-type semiconductor or the n-type semiconductor.

30 Claims, 37 Drawing Sheets

(56) References Cited

U.S. PATENT DOCUMENTS

| | | |
|---|---|---|
| 8,610,696 B2 | 12/2013 | Kurokawa |
| 8,654,231 B2 | 2/2014 | Kurokawa et al. |
| 8,698,782 B2 | 4/2014 | Kurokawa |
| 8,716,712 B2 | 5/2014 | Kozuma et al. |
| 8,772,701 B2 | 7/2014 | Kurokawa et al. |
| 8,803,164 B2 | 8/2014 | Kurokawa et al. |
| 8,836,626 B2 | 9/2014 | Ikeda |
| 8,872,120 B2 | 10/2014 | Kurokawa et al. |
| 8,928,053 B2 | 1/2015 | Kurokawa |
| 8,952,313 B2 | 2/2015 | Tamura |
| 8,976,155 B2 | 3/2015 | Kurokawa et al. |
| 8,987,651 B2 | 3/2015 | Kurokawa |
| 9,006,635 B2 | 4/2015 | Kurokawa et al. |
| 9,035,301 B2 | 5/2015 | Takahashi et al. |
| 2011/0108706 A1 | 5/2011 | Koyama |
| 2011/0176038 A1 | 7/2011 | Kurokawa et al. |
| 2011/0198483 A1* | 8/2011 | Kurokawa .......... H01L 27/1225 250/214 R |
| 2011/0221704 A1 | 9/2011 | Kurokawa et al. |
| 2011/0221723 A1 | 9/2011 | Kurokawa et al. |
| 2011/0255046 A1* | 10/2011 | Kurokawa .......... G02F 1/13338 349/140 |
| 2011/0310061 A1 | 12/2011 | Ikeda et al. |
| 2011/0310063 A1 | 12/2011 | Kurokawa et al. |
| 2012/0056252 A1* | 3/2012 | Aoki .................... G09G 3/3648 257/292 |
| 2013/0015332 A1 | 1/2013 | Kozuma |
| 2013/0044917 A1 | 2/2013 | Kurokawa |
| 2013/0075594 A1 | 3/2013 | Kozuma |
| 2013/0100330 A1* | 4/2013 | Yamada .................. H04N 5/32 348/333.01 |
| 2013/0129050 A1* | 5/2013 | Kimura .................. H04N 3/155 378/62 |
| 2013/0162778 A1 | 6/2013 | Kurokawa |
| 2013/0222584 A1 | 8/2013 | Aoki et al. |
| 2013/0234027 A1 | 9/2013 | Kurokawa |
| 2013/0250274 A1* | 9/2013 | Kurokawa ............ G01S 7/4816 356/5.01 |
| 2013/0285046 A1 | 10/2013 | Yamazaki |
| 2014/0056405 A1 | 2/2014 | Kurokawa et al. |
| 2015/0021598 A1 | 1/2015 | Ikeda et al. |
| 2015/0034831 A1 | 2/2015 | Miyake et al. |
| 2015/0060675 A1 | 3/2015 | Akimoto et al. |
| 2015/0380451 A1* | 12/2015 | Kurokawa ........ H01L 27/14621 257/43 |

\* cited by examiner

FIG. 31A1
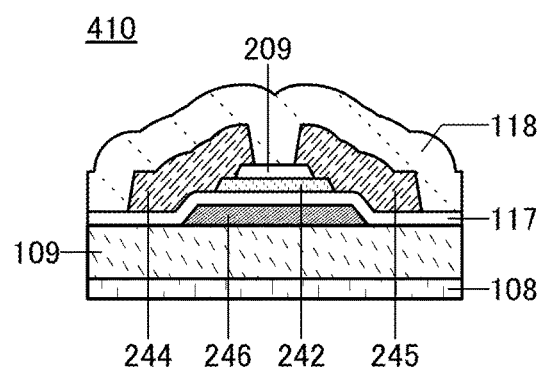
FIG. 31A2
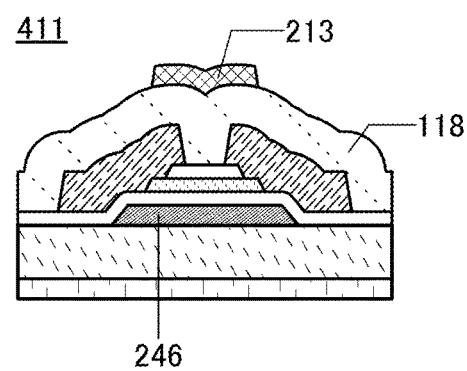
FIG. 31B1
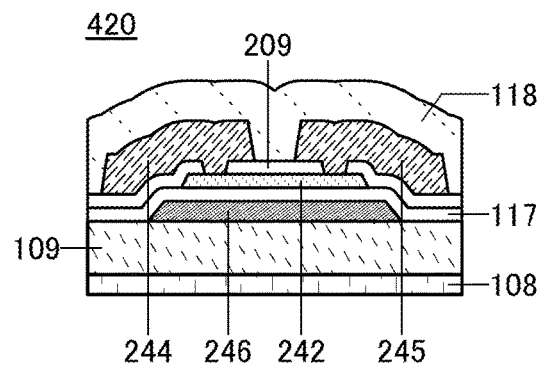
FIG. 31B2
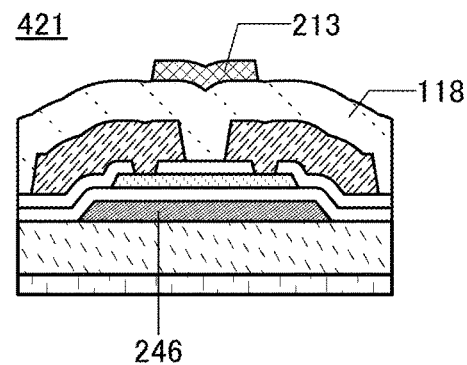

FIG. 32A1
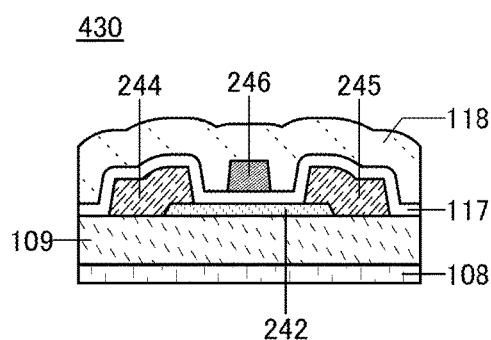
FIG. 32A2
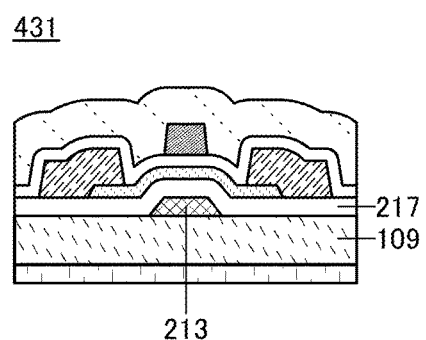
FIG. 32A3
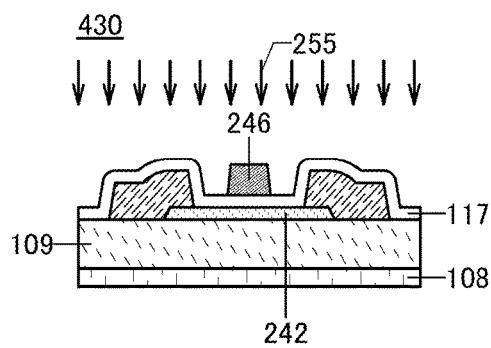
FIG. 32B1
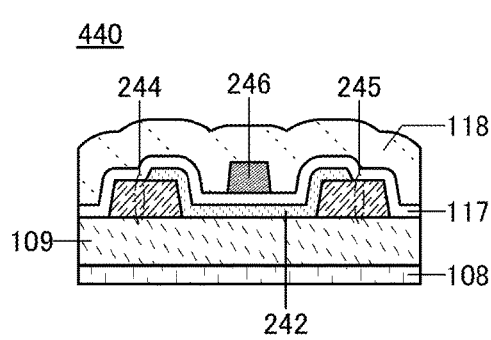
FIG. 32B2
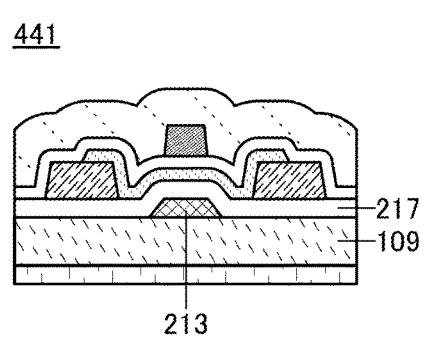

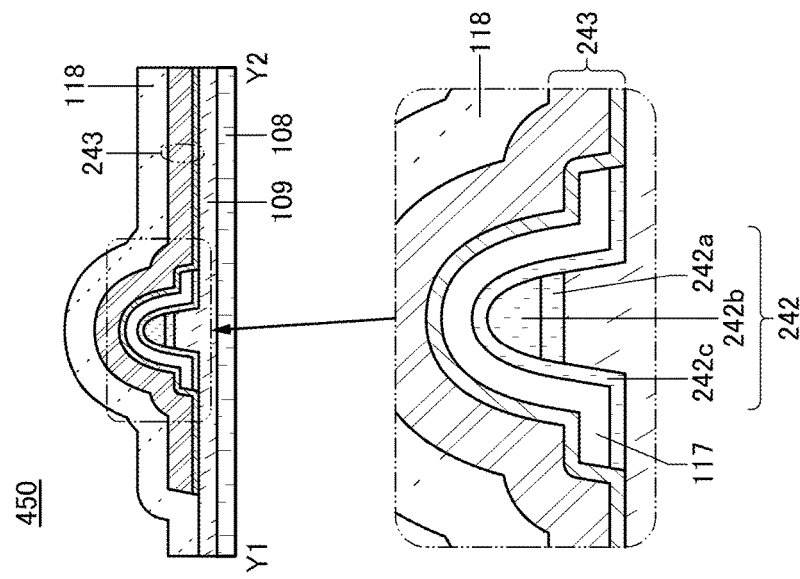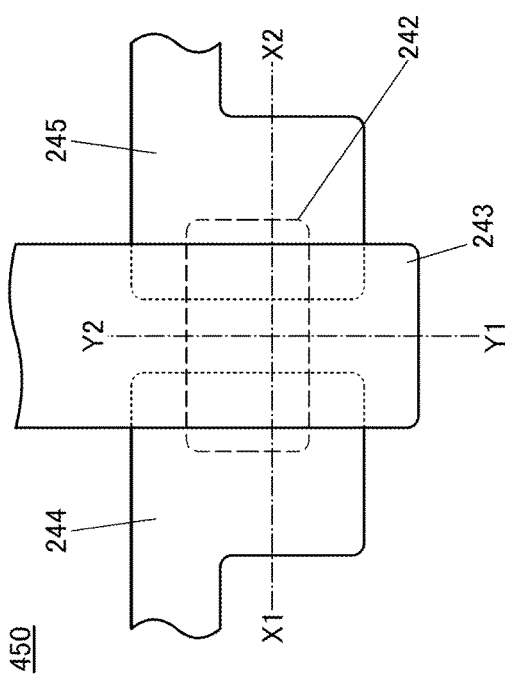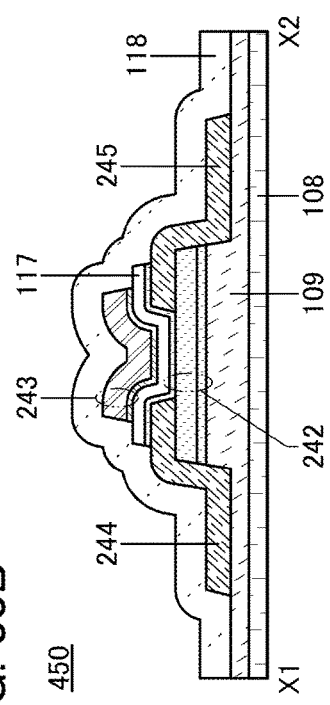

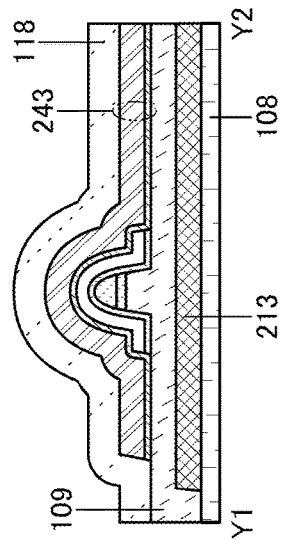
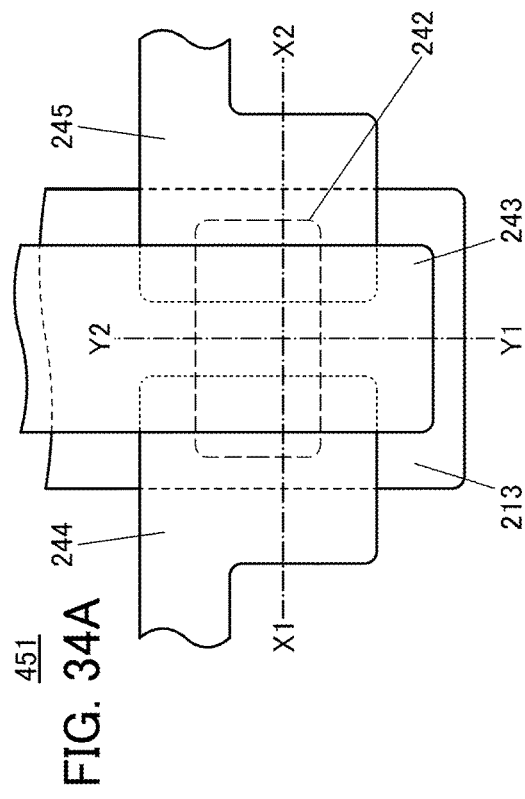
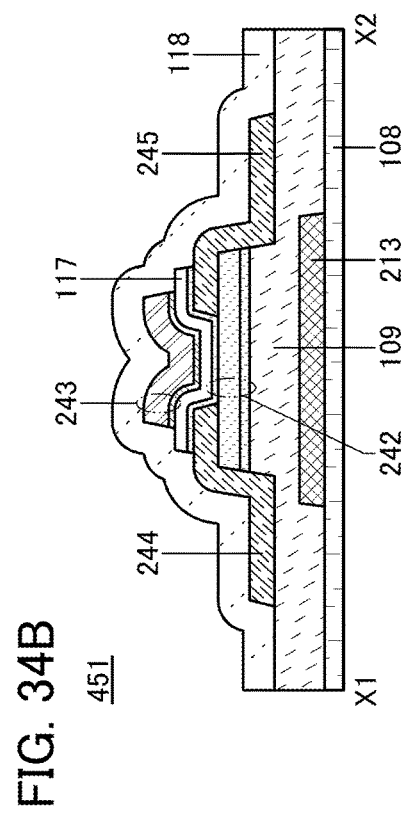
FIG. 34A
FIG. 34B
FIG. 34C

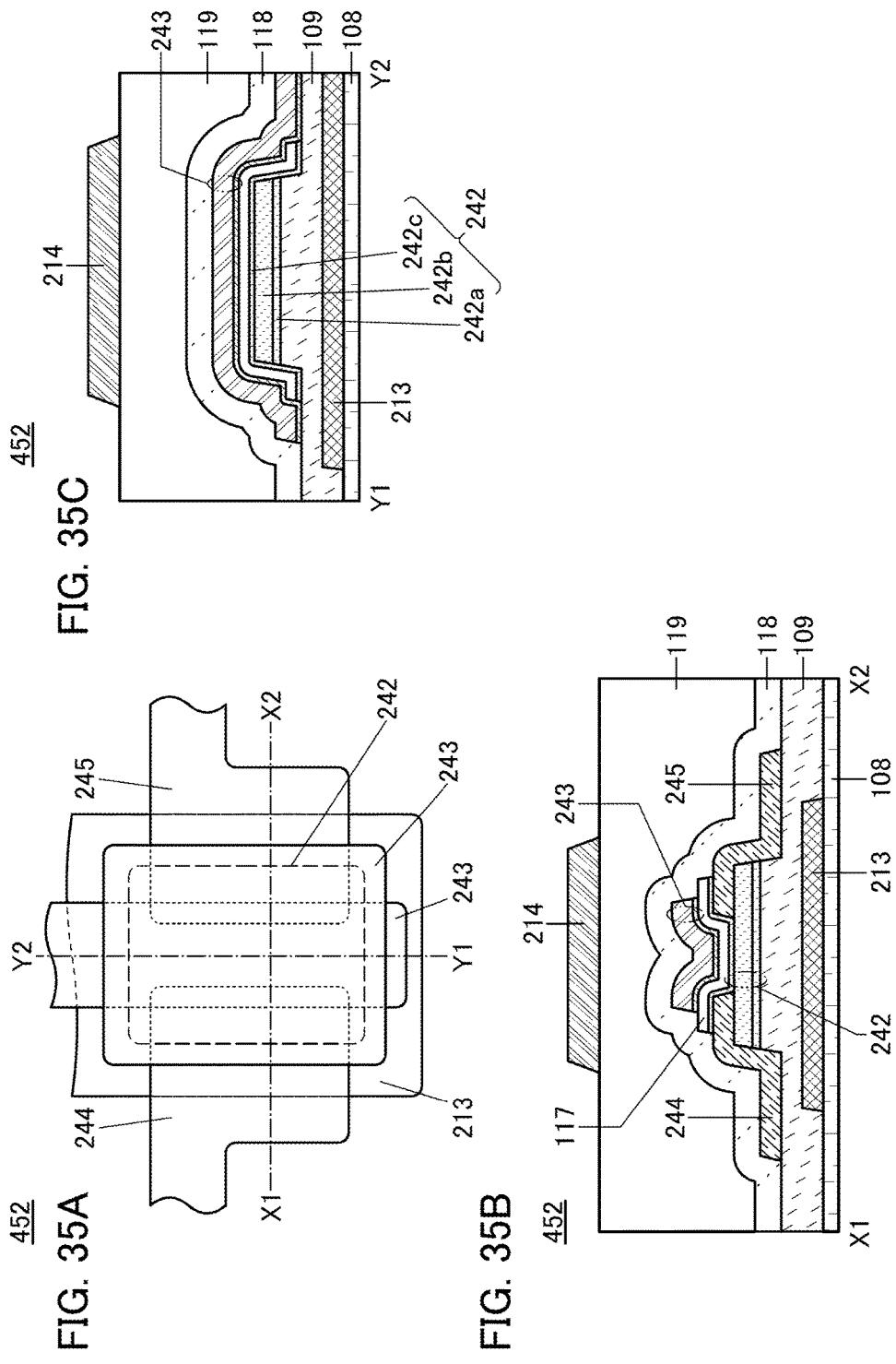

IMAGING DEVICE AND ELECTRONIC DEVICE

BACKGROUND OF THE INVENTION

1. Field of the Invention

One embodiment of the present invention relates to an imaging device. Specifically, one embodiment of the present invention relates to an imaging device including a plurality of pixels provided with photosensors. Further, one embodiment of the present invention relates to an electronic device including the imaging device.

Note that one embodiment of the present invention is not limited to the above technical field. For example, one embodiment of the present invention relates to an object, a method, or a manufacturing method. One embodiment of the present invention relates to a process, a machine, manufacture, or a composition of matter. Further, one embodiment of the present invention relates to a memory device, a processor, a driving method thereof, or a manufacturing method thereof.

In this specification and the like, a semiconductor device generally means a device that can function by utilizing semiconductor characteristics. Thus, a semiconductor element such as a transistor or a diode and a semiconductor circuit are semiconductor devices. A display device, a light-emitting device, a lighting device, an electro-optical device, an imaging device, an electronic device, and the like may include a semiconductor element or a semiconductor circuit. Therefore, a display device, a light-emitting device, a lighting device, an electro-optical device, an imaging device, an electronic device, and the like include a semiconductor device in some cases.

2. Description of the Related Art

Imaging devices are normally incorporated in mobile phones, and have come into widespread use (e.g., Patent Document 1). In particular, CMOS imaging sensors have advantages of low price, high resolution, low power consumption, and the like as compared with CCD image sensors. Many of imaging devices of recent years are formed using CMOS image sensors.

REFERENCE

Patent Document

[Patent Document 1] U.S. Pat. No. 7,046,282

SUMMARY OF THE INVENTION

Improvement in dynamic range is required for imaging devices using CMOS imaging sensors in order that imaging under a variety of environments becomes possible.

In addition, low power consumption is one of the important performances for evaluation of the performance of an imaging device. For a portable electronic device such as a mobile phone, high power consumption by an imaging device shortens the amount of time for which the electronic device can operate continuously.

An object of one embodiment of the present invention is to provide an imaging device with improved dynamic range, or the like. Another object of one embodiment of the present invention is to provide an imaging device with which an image with high quality can be captured, or the like. Another object of one embodiment of the present invention is to provide a low-power-consumption imaging device, or the like. Another object of one embodiment of the present invention is to provide an imaging device with high productivity, or the like. Another object of one embodiment of the present invention is to provide a novel imaging device, a novel semiconductor device, or the like.

Note that the descriptions of these objects do not preclude the existence of other objects. In one embodiment of the present invention, there is no need to achieve all the objects. Other objects will be apparent from and can be derived from the description of the specification, the drawings, the claims, and the like.

One embodiment of the present invention is an imaging device including a photoelectric conversion element and a first circuit. The first circuit includes a first transistor, a second transistor, a third transistor, a fourth transistor, a fifth transistor, a capacitor, a first wiring, a second wiring, a third wiring, a fourth wiring, a fifth wiring, a sixth wiring, a seventh wiring; an eighth wiring, and a ninth wiring. The photoelectric conversion element includes an n-type semiconductor and a p-type semiconductor. The first wiring is electrically connected to one of the n-type semiconductor and the p-type semiconductor. The other of the n-type semiconductor and the p-type semiconductor is electrically connected to a first node. One of a source and a drain of the first transistor is electrically connected to the first node. A gate of the first transistor is electrically connected to the second wiring. The other of the source and the drain of the first transistor is electrically connected to the seventh wiring. One of a source and a drain of the second transistor is electrically connected to the eighth wiring. The other of the source and the drain of the second transistor is electrically connected to one of a source and a drain of the third transistor. A gate of the second transistor is electrically connected to the third wiring. The other of the source and the drain of the third transistor is electrically connected to the fourth wiring. A gate of the third transistor is electrically connected to a second node. One of a source and a drain of the fourth transistor is electrically connected to the first node. The other of the source and the drain of the fourth transistor is electrically connected to the second node. A gate of the fourth transistor is electrically connected to the sixth wiring. One of a source and a drain of the fifth transistor is electrically connected to the ninth wiring. The other of the source and the drain of the fifth transistor is electrically connected to the first node. One electrode of the capacitor is electrically connected to the second node. The other electrode of the capacitor is electrically connected to the fourth wiring. A gate of the fifth transistor is electrically connected to the fifth wiring.

It is preferable that the photoelectric conversion element include an i-type semiconductor, and that the total area of a part of the i-type semiconductor overlapped with neither a metal material or a semiconductor material that is included in the first circuit be greater than or equal to 65% of the area of the whole i-type semiconductor in a plan view.

It is preferable that each of the first to fifth transistors include an oxide semiconductor as a semiconductor in which a channel is formed.

The semiconductor included in each of the first to fifth transistor may have a band gap different from a band gap of the i-type semiconductor in the photoelectric conversion element.

Another embodiment of the present invention is an imaging device including a first photoelectric conversion element and a second photoelectric conversion element. The first photoelectric conversion element and the second photoelectric conversion element each include an i-type semiconductor. The i-type semiconductor included in the first photoelectric conversion element and the i-type semiconductor included in the second photoelectric conversion element are next to each other with an n-type semiconductor or a p-type semiconductor positioned therebetween.

According to one embodiment of the present invention, an imaging device with improved dynamic range, an imaging device with which the quality of taken images is improved, an imaging device with short duration of image capturing, an imaging device with low power consumption, an imaging device with high productivity, a novel imaging device, a novel semiconductor device, or the like can be provided.

Note that the description of these effects does not preclude the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

In the accompanying drawings:

FIGS. 31A1, 31A2, 31B1, and 31B2 each illustrate one embodiment of a transistor;

FIGS. 32A1, 32A2, 32A3, 32B1, and 32B2 each illustrate one embodiment of a transistor;

FIGS. 33A to 33C illustrate one embodiment of a transistor;

FIGS. 34A to 34C illustrate one embodiment of a transistor;

FIGS. 35A to 35C illustrate one embodiment of a transistor;

DETAILED DESCRIPTION OF THE INVENTION

Figure 1A:
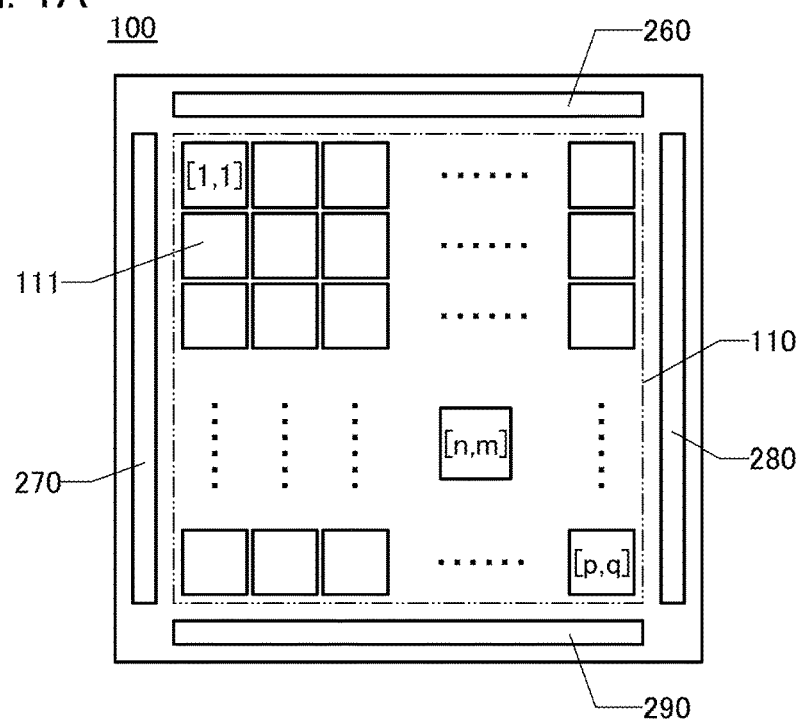
FIGS. 1A and 1B each illustrate a configuration example of an imaging device of one embodiment of the present invention.

Embodiments of the present invention will be described below in detail with reference to the drawings. However, the present invention is not limited to the description below, and it is easily understood by those skilled in the art that modes and details disclosed herein can be modified in various ways. Further, the present invention is not construed as being limited to description of the embodiments. Note that in all drawings used to illustrate the embodiments, portions that are identical or portion having similar functions are denoted by the same reference numerals, and their repetitive description may be omitted.

In addition, in this specification and the like, the term such as an "electrode" or a "wiring" does not limit a function of a component. For example, an "electrode" is used as part of a "wiring" in some cases, and vice versa. Further, the term "electrode" or "wiring" can also mean a combination of a plurality of "electrodes" and "wirings" formed in an integrated manner.

In this specification and the like, when it is explicitly described that X and Y are connected, the case where X and Y are electrically connected, the case where X and Y are functionally connected, and the case where X and Y are directly connected are included therein. Accordingly, another element may be provided between elements having a connection relation illustrated in drawings and texts, without limitation on a predetermined connection relation, for example, the connection relation illustrated in the drawings and the texts.

Here, X and Y each denote an object (e.g., a device, an element, a circuit, a wiring, an electrode, a terminal, a conductive film, a layer, or the like).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch has a function of becoming conducting or not conducting (being turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y, even when another circuit is provided between X and Y, X and Y are functionally connected. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X the source (or the first terminal or the like) of the transistor, the drain (or the second terminal or the like) of the transistor, and Y are electrically connected to each other in this order", "a source (or a first terminal or the like) of a transistor is electrically connected to X a drain (or a second terminal or the like) of the transistor is electrically connected to Y, and X the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". It is also possible to use the expression "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that in this specification and the like, a transistor can be formed using a variety of substrates. The type of a substrate is not limited to a certain type. As the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used, for example. As an example of a glass substrate, a barium borosilicate glass substrate, an aluminoborosilicate glass substrate, soda lime glass substrate, and the like can be given. For a flexible substrate, a flexible synthetic resin such as plastics typified by polyethylene terephthalate (PET), polyethylene naphthalate (PEN), and polyether sulfone (PES), or acrylic can be used, for example. Examples of the material for an attachment film include vinyl such as polyvinyl fluoride or vinyl chloride, polypropylene and polyester. For a base material film, polyester, polyamide, polyimide, an inorganic vapor deposition film, paper, or the like can be used, for example. Specifically, when a transistor is formed using a semiconductor substrate, a single crystal substrate, an SOI substrate, or the like, it is possible to form a transistor with few variations in characteristics, size, shape, or the like and with high current supply capability and a small size. By forming a circuit with the use of such a transistor, power consumption of the circuit can be reduced or the circuit can be highly integrated.

Note that a transistor may be formed using one substrate, and then the transistor may be transferred to another substrate. In addition to the above substrates over which the transistor can be formed, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, or the like can be used as a substrate to which the transistor is transferred. By using such a substrate, a transistor with excellent properties or a transistor with low power consumption can be formed, a device with high durability can be formed, heat resistance can be provided, or reduction in weight or thickness can be achieved.

The position, size, range, and the like of each component illustrated in the drawings and the like are not accurately represented in some cases to facilitate understanding of the invention. Therefore, the disclosed invention is not necessarily limited to the position, the size, the range, or the like disclosed in the drawings and the like. For example, in the actual manufacturing process, a resist mask or the like might be unintentionally reduced in size by treatment such as etching, which is not illustrated in some cases for easy understanding.

Especially in a top view (also referred to as a plan view), some components might not be illustrated for easy understanding. In addition, some hidden lines and the like might not be shown.

Note that the term "over" or "under" in this specification and the like does not necessarily mean that a component is placed "directly on" or "directly below" and "directly in contact with" another component. For example, the expression "electrode B over insulating layer A" does not necessarily mean that the electrode B is on and in direct contact with the insulating layer A and can mean the case where another component is provided between the insulating layer A and the electrode B.

Further, functions of the source and the drain might be switched depending on operation conditions, e.g., when a transistor having a different polarity is employed or a direction of current flow is changed in circuit operation. Accordingly, it is difficult to define whichever electrode serves as a source or a drain. Thus, the terms "source" and "drain" can be switched in this specification.

In this specification, the term "parallel" indicates that the angle formed between two straight lines is greater than or equal to $-10°$ and less than or equal to $10°$, and accordingly also includes the case where the angle is greater than or equal to $-5°$ and less than or equal to $5°$. A term "substantially parallel" indicates that the angle formed between two straight lines is greater than or equal to $-30°$ and less than or equal to $30°$. In addition, the term "perpendicular" or "orthogonal" indicates that the angle formed between two straight lines is greater than or equal to $80°$ and less than or equal to $100°$, and accordingly also includes the case where the angle is greater than or equal to $85°$ and less than or equal to $95°$. A term "substantially perpendicular" indicates that the angle formed between two straight lines is greater than or equal to $60°$ and less than or equal to $120°$.

A voltage usually refers to a potential difference between a given potential and a reference potential (e.g., a source potential or a ground potential (a GND potential)). A voltage can be referred to as a potential and vice versa.

Note that an impurity in a semiconductor refers to, for example, elements other than the main components of the semiconductor. For example, an element with a concentration lower than 0.1 atomic % can be regarded as an impurity. When an impurity is contained, the density of states (DOS) in a semiconductor may be increased, the carrier mobility may be decreased, or the crystallinity may be decreased. In the case where the semiconductor is an oxide semiconductor, examples of an impurity that changes the characteristics of the semiconductor include Group 1 elements, Group 2 elements, Group 13 elements, Group 14 elements, Group 15 elements, and transition metals other than the main components; specific examples are hydrogen (included in water), lithium, sodium, silicon, boron, phosphorus, carbon, and nitrogen. In the case of an oxide semiconductor, oxygen vacancy may be formed by entry of impurities such as hydrogen. Further, in the case where the semiconductor is silicon, examples of an impurity that changes characteristics of the semiconductor include oxygen, Group 1 elements except hydrogen, Group 2 elements, Group 13 elements, and Group 15 elements.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among components. In addition, a term with an ordinal number in this specification and the like might be provided with a different ordinal number in a claim. Moreover, a term with an ordinal number in this specification and the like might not be provided with any ordinal number in a claim.

Note that in this specification, the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions do not necessarily have the same value. In other words, the channel width of one transistor is not limited to one value in some cases. Therefore, in this specification, a channel width is any one of values, the maximum value, the minimum value, or the average value in a region where a channel is formed.

Note that depending on transistor structures, a channel width in a region where a channel is actually formed (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of a semiconductor in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Further, in this specification, in the case where the term "channel width" is simply used, it may denote a surrounded channel width or an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

The high power supply potential $V_{DD}$ (hereinafter also simply referred to as $V_{DD}$ or H potential) is a power supply potential higher than the low power supply potential $V_{SS}$. The low power supply potential $V_{SS}$ (hereinafter also simply referred to as $V_{SS}$ or L potential) is a power supply potential lower than the high power supply potential $V_{DD}$. In addition, a ground potential can be used as $V_{DD}$ or $V_{SS}$. For example, in the case where a ground potential is used as $V_{DD}$, $V_{SS}$ is lower than the ground potential, and in the case where a ground potential is used as $V_{SS}$, $V_{DD}$ is higher than the ground potential.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

(Embodiment 1)

In this embodiment, an imaging device of one embodiment of the present invention will be described with reference to the drawings.

<Configuration Example of Imaging Device 100>

FIG. 1A is a plan view illustrating a configuration example of an imaging device 100 of one embodiment of the present invention. The imaging device 100 includes a pixel portion 110, a first circuit 260, a second circuit 270, a third circuit 280, and a fourth circuit 290. The pixel portion 110 includes a plurality of pixels (imaging elements) 111 arranged in a matrix with p rows and q columns (p and q are each a natural number greater than or equal to 2). The first circuit 260, the second circuit 270, the third circuit 280, and the fourth circuit 290 are each connected to the plurality of pixels 111 and each have a function of supplying a signal for driving the plurality of pixels 111. In this specification and the like, the first circuit 260 to the fourth circuit 290 and the like may be referred to as "peripheral circuit" or "driving circuit". For example, the first circuit 260 can be regarded as part of the peripheral circuit.

For example, the first circuit 260 or the fourth circuit 290 has a function of processing analog signals output from the pixels 111. For example, the first circuit 260 may include a signal processing circuit 261, a column driver circuit 262, an output circuit 263, and the like, as shown in FIG. 2.

Figure 2:
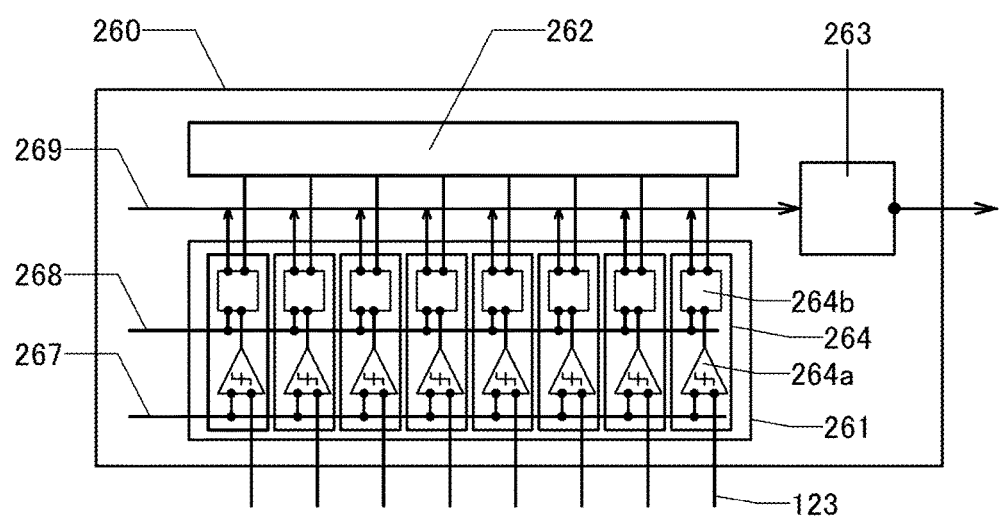
FIG. 2 illustrates a configuration example of a peripheral circuit.

The signal processing circuit 261 shown in FIG. 2 includes circuits 264 each of which is provided for each column. The circuit 264 can have a function of performing signal processing such as removal of noise and analog-digital conversion. The signal processing circuit 261 can function as a column-parallel (column type) analog-digital conversion device.

The circuit 264 includes a comparator 264a and a counter circuit 264b. The comparator 264a has a function of comparing potentials of an analog signal input from a wiring 123 that is provided per column and a reference potential signal (e.g., a ramp signal) input from a wiring 267. A clock signal is input to the counter circuit 264b from a wiring 268. The counter circuit 264b has a function of measuring the length of a period in which a first value is output owing to the comparison operation in the comparator 264a and holding the measurement result as an N-bit digital value.

The column driver circuit 262 is also referred to as a column selection circuit, a horizontal driver circuit, or the like. The column driver circuit 262 generates a selection signal for selecting a column from which a signal is read. The column driver circuit 262 can be formed using a shift register or the like. Columns are sequentially selected by the column driver circuit 262, and a signal output from the circuit 264 in the selected column is input to the output circuit 263 via a wiring 269. The wiring 269 can function as a horizontal transfer line.

A signal input to the output circuit 263 is processed in the output circuit 263, and is output outside the imaging device 100. The output circuit 263 can be formed using a buffer circuit, for example. The output circuit 263 may have a function of controlling the timing at which a signal is output outside the imaging device 100.

The second circuit 270 or the third circuit 280 has a function of generating and outputting a selection signal for selecting the pixel 111 from which a signal is read. Note that the second circuit 270 or the third circuit 280 may also be referred to as a row selection circuit or a vertical driver circuit.

The peripheral circuit includes at least one of a logic circuit, a switch, a buffer, an amplifier circuit, and a conversion circuit. Transistors or the like included in the peripheral circuit may be formed using part of a semiconductor that is formed to fabricate an after-mentioned photoelectric conversion element 136. Alternatively, transistors or the like included in the peripheral circuit may be formed using part of a semiconductor that is formed to fabricate an after-mentioned pixel driver circuit 112. Alternatively, transistors or the like included in the peripheral circuit may be a combination of transistors formed using part of the semiconductor for fabricating the photoelectric conversion element 136 and transistors formed using part of the semiconductor for fabricating the pixel driver circuit 112. Further, a part of or the whole of the peripheral circuit may be fabricated using a semiconductor device such as an IC.

Note that in the peripheral circuit, at least one of the first to the fourth circuits (260 to 290) may be omitted. For example, when one of the first circuit 260 and the fourth circuit 290 additionally has a function of the other of the first circuit 260 and the fourth circuit 290, the other of the first circuit 260 and the fourth circuit 290 may be omitted. For another example, when one of the second circuit 270 and the third circuit 280 additionally has a function of the other of the second circuit 270 and the third circuit 280, the other of the second circuit 270 and the third circuit 280 may be omitted. For further another example, a function of another peripheral circuit may be added to one of the first to fourth circuits (260 to 290) to omit that peripheral circuit.

Figure 1B:
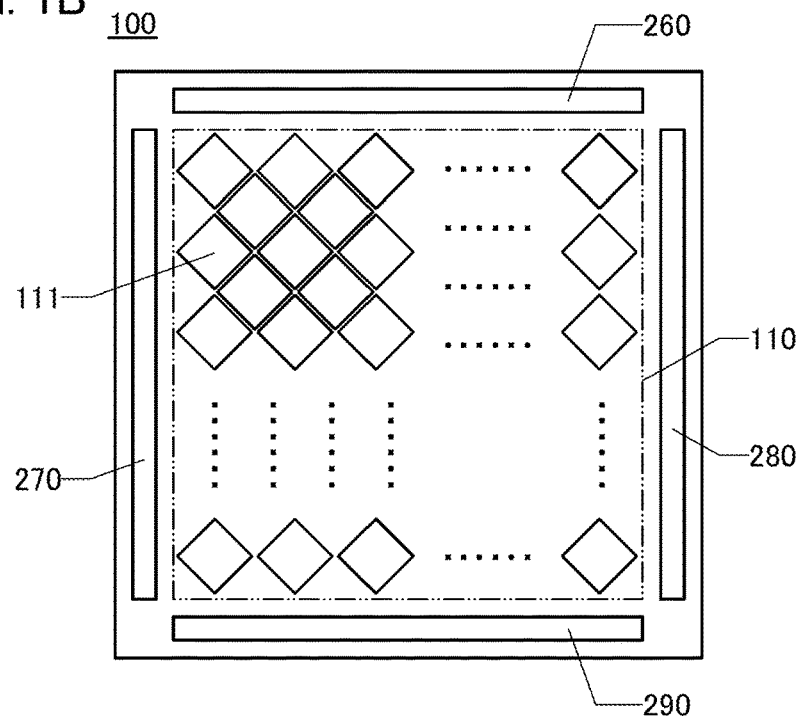

As illustrated in FIG. 1B, the pixels 111 may be provided to be inclined in the pixel portion 110 included in the imaging device 100. When the pixels 111 are inclined, the space between the pixels in the row direction and the column direction (pitch) can be decreased. Accordingly, the quality of an image taken with the imaging device 100 can be improved.

[Configuration Example of Pixel 111]

A configuration example of the pixel 111 will be described with reference to FIGS. 3A and 3B, FIGS. 4A and 4B, and FIG. 5. The pixel 111 includes functional elements such as a transistor 131, a transistor 132, a transistor 133, a transistor 134, a capacitor 135, and a photoelectric conversion element 136. Among the functional elements included in the pixel 111, the functional elements except the photoelectric conversion element 136 constitute a circuit that is referred to as a pixel driver circuit 112. The pixel driver circuit 112 is electrically connected to the photoelectric conversion element 136. The pixel driver circuit 112 has a function of generating an analog signal corresponding to the amount of light received by the photoelectric conversion element 136.

Figure 3A:
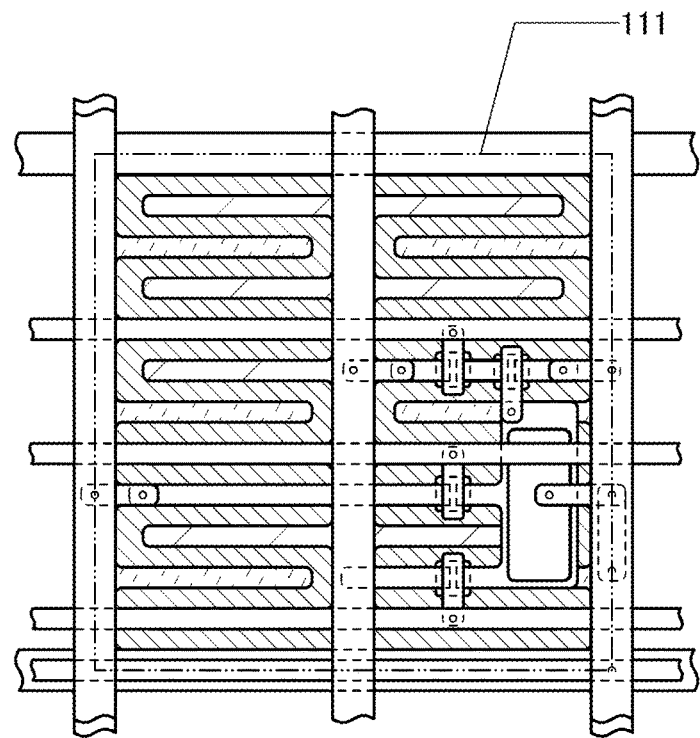
FIGS. 3A and 3B illustrate pixel configuration examples.
Figure 3B:
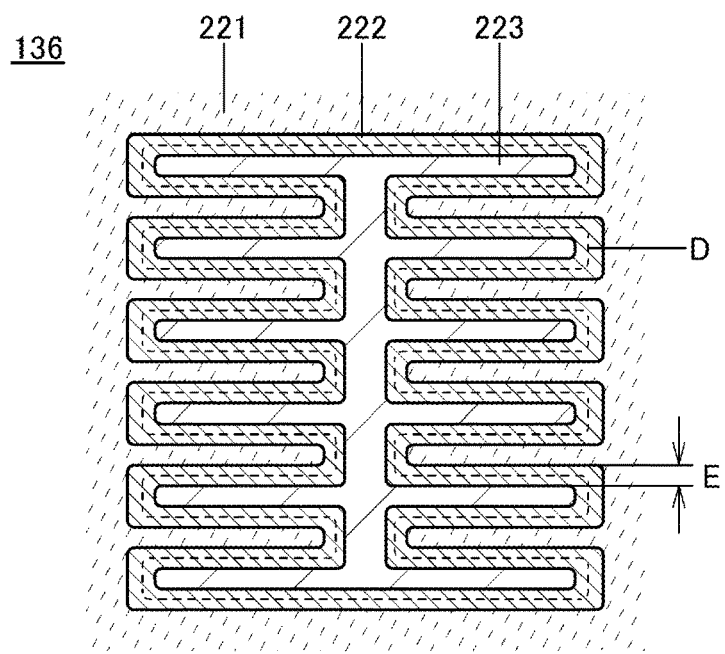
Figure 4A:
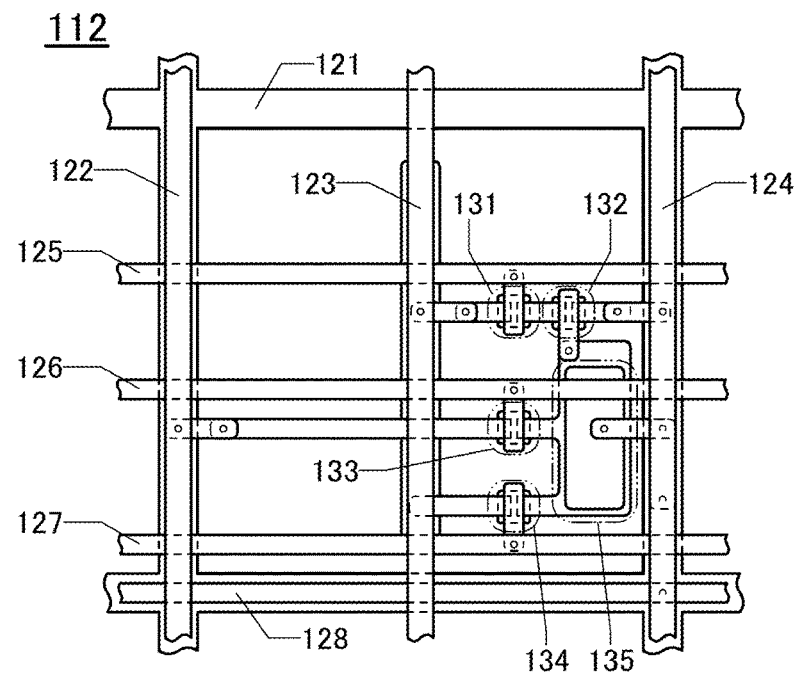
FIG. 4A is a plan view of a pixel driver circuit and FIG. 4B is a pixel circuit diagram.
Figure 4B:
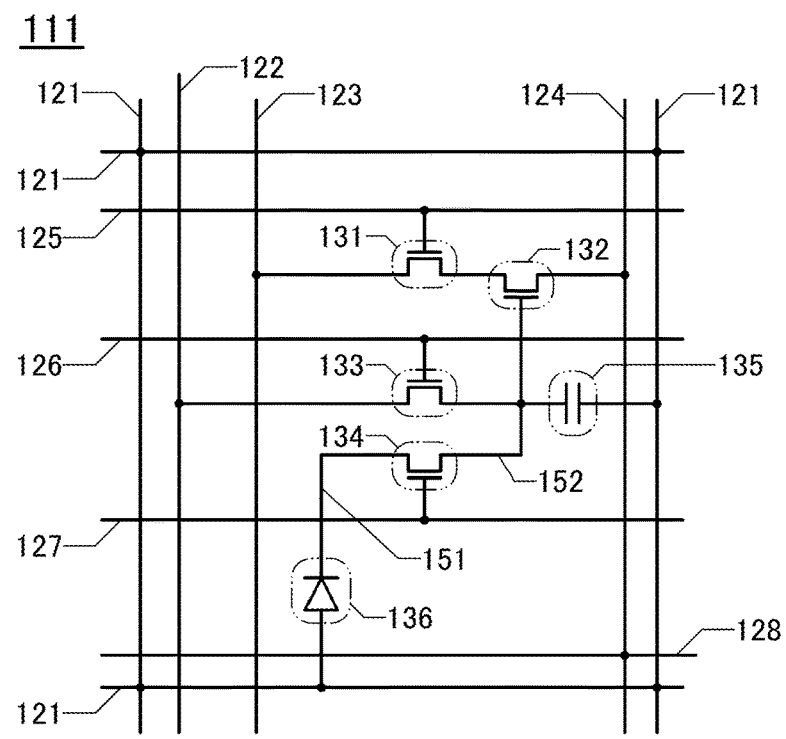
Figure 5:
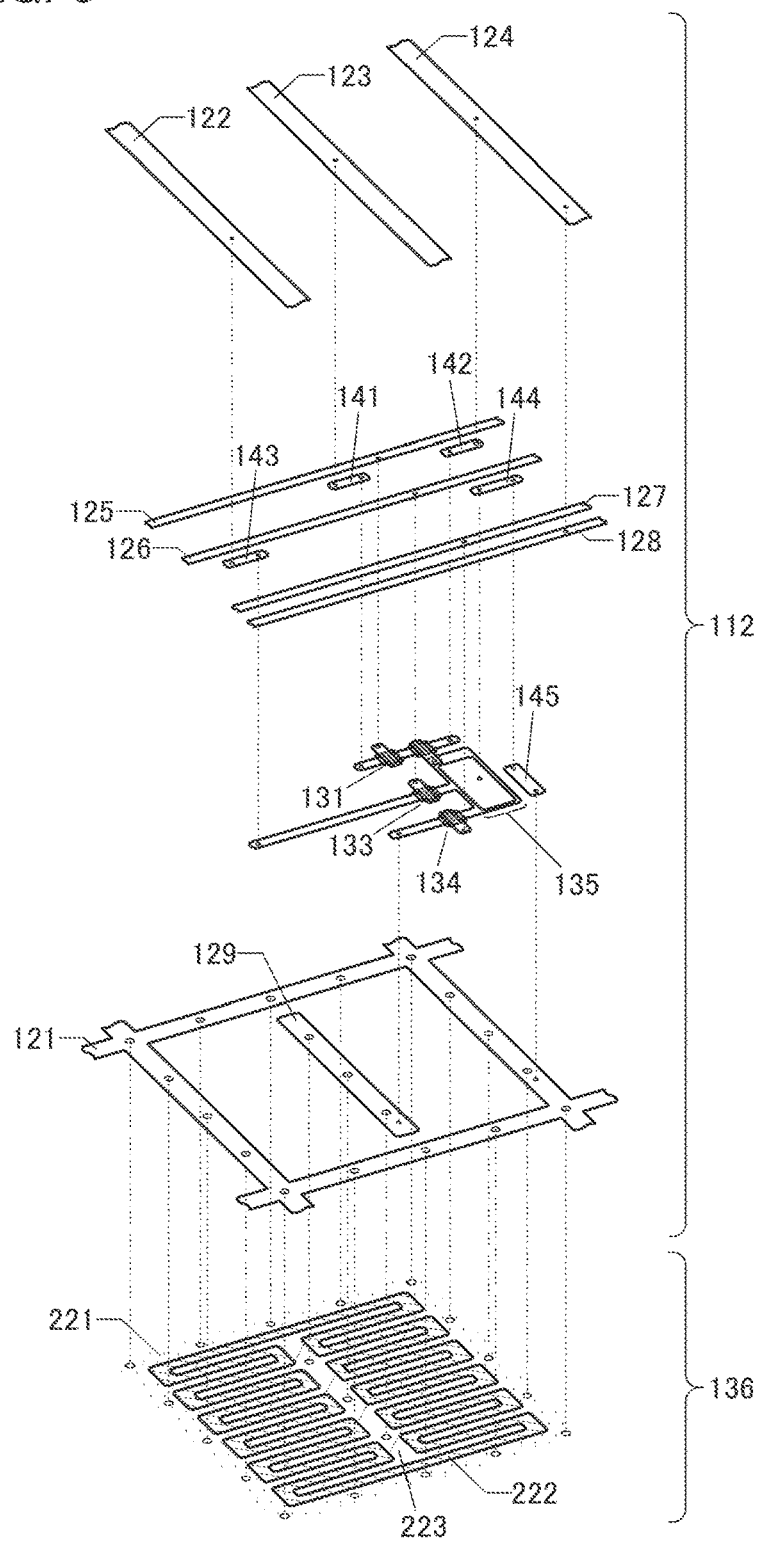
FIG. 5 is a perspective view illustrating a pixel configuration example.

FIG. 3A is a plan view of the pixel 111. FIG. 3B is a plan view of the photoelectric conversion element 136. FIG. 4A is a plan view of the pixel driver circuit 112. FIG. 4B is a circuit diagram of the pixel 111. FIG. 5 is a perspective view illustrating a configuration of the pixel 111. The pixel 111 includes the pixel driver circuit 112 over the photoelectric conversion element 136.

The photoelectric conversion element 136 includes a p-type semiconductor 221, an i-type semiconductor 222, and an n-type semiconductor 223. When seen in a plan view, the photoelectric conversion element 136 has a structure in which the i-type semiconductor 222 is positioned between the p-type semiconductor 221 and the n-type semiconductor 223. Although the photoelectric conversion element 136 may be made up of the p-type semiconductor 221 and the n-type semiconductor 223 without the i-type semiconductor 222 provided, the provision of the i-type semiconductor 222 in the photoelectric conversion element 136 can increase the detection sensitivity.

Note that an intrinsic semiconductor (i-type semiconductor) is ideally a semiconductor, which does not include impurities and whose Fermi level lies substantially in the middle of the band gap; but in this specification and the like, a semiconductor to which an impurity serving as a donor or an impurity serving as an acceptor is added and whose Fermi level lies substantially in the middle of the band gap is also included in the category of the intrinsic semiconductor. Even when a semiconductor includes an impurity serving as a donor or an impurity serving as an acceptor, the semiconductor is included in the category of intrinsic semiconductors as long as the semiconductor can function as an intrinsic semiconductor.

It is preferable that the p-type semiconductor 221 and the n-type semiconductor 223 be each formed into a comb-like shape in a plan view and engage with each other with the i-type semiconductor 222 positioned therebetween. When the p-type semiconductor 221 and the n-type semiconductor 223 each have a comb-like shape, the length D of a line along which the p-type semiconductor 221 and the n-type semiconductor 223 face each other can be increased. The length D can be defined as the length of a center line that extends on the i-type semiconductor 222 positioned between the p-type semiconductor 221 and the n-type semiconductor 223 in a plan view. Increase in the length D can improve the detection sensitivity of the photoelectric conversion element 136. Thus, the imaging device 100 with high detection sensitivity can be provided. In FIG. 3B, a dashed line shows the position of the length D. In the case where the pixel 111 detects visible light, the distance E from the p-type semiconductor 221 to the n-type semiconductor 223 (i.e., the width of the i-type semiconductor 222) in a plan view is preferably greater than or equal to 800 nm (see FIG. 3B).

The photoelectric conversion element 136 may be formed using a single crystal semiconductor substrate or a polycrystalline semiconductor substrate. The photoelectric conversion element 136 using a single crystal semiconductor substrate or a polycrystalline semiconductor substrate has such high light detection sensitivity that the formation of the i-type semiconductor 222 can be omitted in some cases.

Further, the photoelectric conversion element 136 may be formed using a material capable of generating electrical charges by absorbing radiation. Examples of a material capable of generating electrical charges by absorbing radiation include selenium, lead iodide, mercury iodine, gallium arsenide, CdTe, and CdZn.

The use of selenium for the photoelectric conversion element 136 enables the photoelectric conversion element 136 to have a favorable light absorption coefficient over a wide wavelength range including X-rays and gamma rays in addition to visible light and ultraviolet light, for example.

One of a source and a drain of the transistor 131 is electrically connected to the wiring 123, and the other of the source and the drain of the transistor 131 is electrically connected to one of a source and a drain of the transistor 132. A gate of the transistor 131 is electrically connected to a wiring 125. The other of the source and the drain of the transistor 132 is electrically connected to a wiring 124, and a gate of the transistor 132 is electrically connected to a node 152. One of a source and a drain of the transistor 133 is electrically connected to a wiring 122, and the other of the source and the drain of the transistor 133 is electrically connected to the node 152. A gate of the transistor 133 is electrically connected to a wiring 126. One of a source and a drain of the transistor 134 is electrically connected to a node 151, and the other of the source and the drain of the transistor 134 is electrically connected to the node 152. A gate of the transistor 134 is electrically connected to a wiring 127. One electrode (e.g., a cathode) of the photoelectric conversion element (photodiode) 136 is electrically connected to the node 151, and the other electrode (e.g., an anode) of the photoelectric conversion element 136 is electrically connected to a wiring 121 (see FIGS. 4A and 4B).

The node 152 functions as a charge storage portion. The transistor 134 can function as a transfer transistor for transferring a charge (potential) corresponding to the amount of light received by the photoelectric conversion element 136 to the node 152. The transistor 133 can function as a reset transistor for resetting a potential of the node 152. The transistor 132 can function as an amplifier transistor for amplifying a charge stored in the node 152. The transistor 131 can function as a reading transistor for reading a signal that has been amplified by the transistor 132.

An analog signal generated by the photoelectric conversion element 136 and the pixel driver circuit 112 can be supplied to the wiring 123. The wiring 121 has a function of supplying a potential VPD, for example. The wiring 122 has a function of supplying a potential VRS, for example. The wiring 124 has a function of supplying a potential VPI, for example. The wiring 125 has a function of supplying a potential SEL, for example. The wiring 126 has a function of supplying a potential PR, for example. The wiring 127 has a function of supplying a potential TX, for example. The wiring 128 has a function of supplying a potential VPI, for example.

In this embodiment, the wiring 121 is provided in a net shape to surround the periphery of each of the pixels 111. The wiring 121 is electrically connected to the p-type semiconductor 221. The provision of the wiring 121 in a net shape can decrease variations in potential of the wiring 121 in the pixel portion 110, stabilize the operation of the imaging device 100, and improve the reliability of the imaging device 100. The one of the source and the drain of the transistor 134 may be electrically connected to a wiring 129, and the wiring 129 may be electrically connected to the n-type semiconductor 223 (see FIG. 5). The one of the source and the drain of the transistor 131 may be electrically connected to a wiring 141, and the wiring 141 may be electrically connected to the wiring 123. The other of the source and the drain of the transistor 132 may be electrically connected to a wiring 142, and the wiring 142 may be electrically connected to the wiring 124. The one of the source and the drain of the transistor 133 may be electrically connected to a wiring 143, and the wiring 143 may be electrically connected to the wiring 122. The other electrode of the capacitor 135 may be electrically connected to a wiring 144, the wiring 144 may be electrically connected to a wiring 145, and the wiring 145 may be electrically connected to the wiring 121. In this embodiment, an example in which a wiring 128 that crosses and is electrically connected to the wiring 124 is provided is shown. The provision of the wiring 128 can decrease variations in potential of the wiring 124 in the pixel portion 110, stabilize the operation of the imaging device 100, and improve the reliability of the imaging device 100. Parasitic capacitance of a transistor or transistors may be used as the capacitor 135.

It is preferable that functional elements and wirings (electrodes) included in the pixel 111 be formed over the p-type semiconductor 221 and/or the n-type semiconductor 223 as much as possible and overlap the i-type semiconductor 222 as little as possible. Specifically, the area of the i-type semiconductor 222 that is overlapped with the functional elements and wirings in a plan view is preferably less than or equal to 35%, more preferably less than or equal to 20%, and still more preferably less than or equal to 10% of the area of the i-type semiconductor 222 in a plan view.

In the case where the pixel 111 detects visible light, for example, the total area where a metal material or a semiconductor material included in the pixel driver circuit 112 overlaps the i-type semiconductor 222 is preferably less than or equal to 35%, more preferably less than or equal to 20%, and still more preferably less than or equal to 10% of the area of the whole i-type semiconductor 222.

Alternatively, the area where a light-blocking material included in the pixel driver circuit 112 overlaps the i-type semiconductor 222 is preferably less than or equal to 35%, more preferably less than or equal to 20%, and still more preferably less than or equal to 10% of the area of the whole i-type semiconductor 222 in a plan view. Note that the light-blocking material in this specification and the like refers to a material whose light transmittance is less than or equal to 15%. More specifically, the light-blocking material in this specification and the like refers to a material whose transmittance of light detected by the photoelectric conversion element 136 is less than or equal to 15%.

Alternatively, the proportion of the area of a part of the i-type semiconductor 222 actually capable of receiving light with respect to the area of the whole i-type semiconductor 222 (the proportion is also referred to as "effective aperture ratio") is preferably greater than or equal to 65%, more preferably greater than or equal to 80%, and still more preferably greater than or equal to 90%.

For example, the total area of a part of the i-type semiconductor 222 overlapped with neither the metal material nor the semiconductor material that is included in the pixel driver circuit 112 is preferably greater than or equal to 65%, more preferably greater than or equal to 80%, and still more preferably greater than or equal to 90% of the area of the whole i-type semiconductor 222.

Alternatively, the total area of a part of the i-type semiconductor 222 not overlapped with the light-blocking material included in the pixel driver circuit 112 is preferably greater than or equal to 65%, more preferably greater than or equal to 80%, and still more preferably greater than or equal to 90% of the area of the whole i-type semiconductor 222 in a plan view.

Improving the effective aperture ratio to increase the exposed area of the i-type semiconductor 222 can improve the detection sensitivity of the imaging device 100. Furthermore, the dynamic range of the imaging device 100 can be increased.

Figure 6:
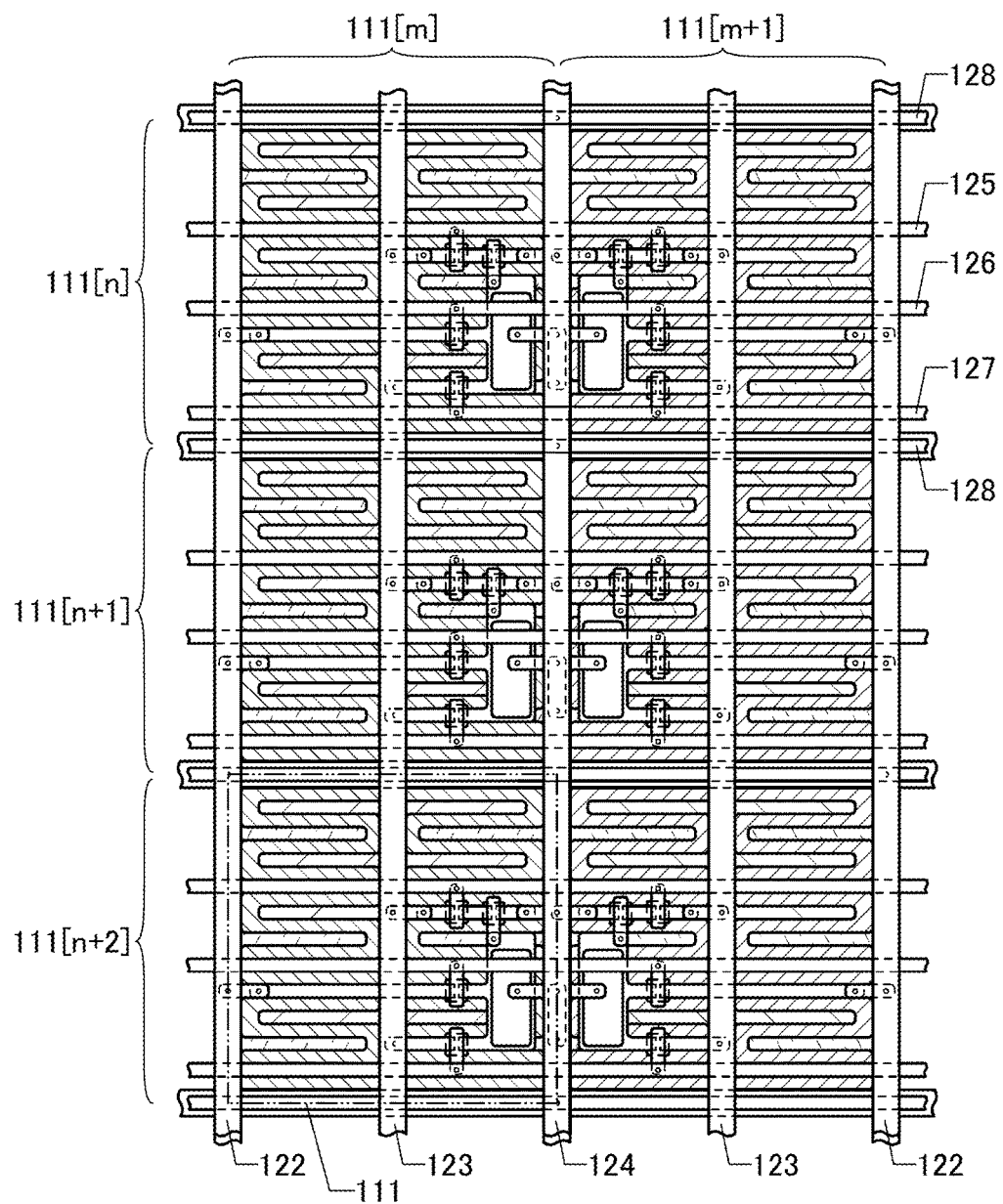
FIG. 6 illustrates an example where pixels are arranged in a matrix.
Figure 7:
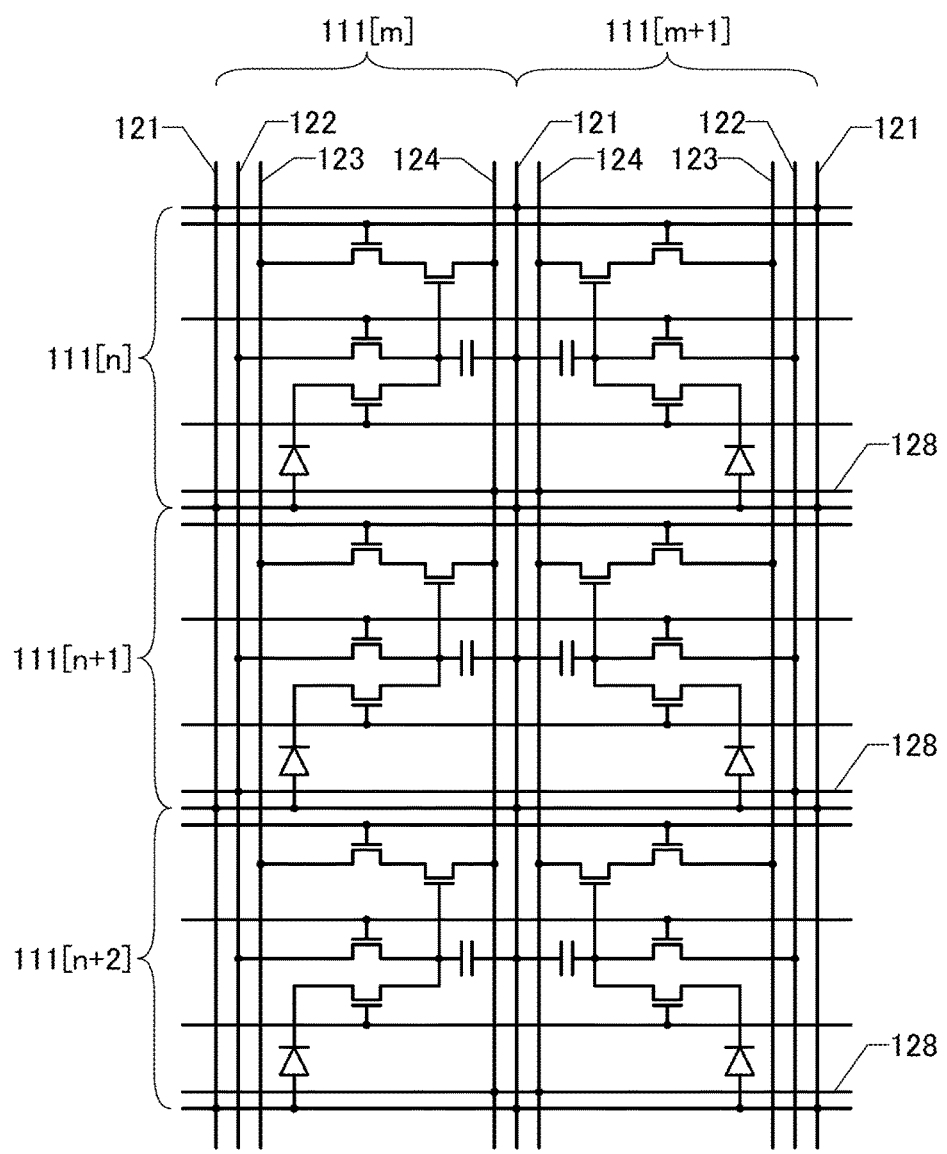
FIG. 7 illustrates a circuit configuration example of pixels arranged in a matrix.

An example of arranging the plurality of pixels 111 in a matrix is shown in FIG. 6 and FIG. 7. FIG. 6 is a plan view showing an example in which the pixels 111 are arranged in a matrix with three rows (n to n+2) and two columns (m and m+1). FIG. 7 is a circuit diagram corresponding to FIG. 6. FIG. 6 and FIG. 7 show an example in which the configuration of the pixel 111 in the column m (e.g., an odd number column) and the configuration of the pixel 111 in the column m+1 (e.g., an even number column) are different and mirror symmetrical.

The wiring 128 in the n-th row is electrically connected to the wiring 124 having a function of supplying the potential VPI, and the wiring 128 in the n+1-th row is electrically connected to the wiring 122 having a function of supplying the potential VRS. In this manner, whether the wiring 128 is electrically connected to the wiring 122 or the wiring 124 is changed in every predetermined rows, whereby variations in the potential VPI and the potential VRS in the pixel portion 110 can be decreased, the operation of the imaging device 100 can be stabilized, and the reliability of the imaging device 100 can be improved.

Figure 8:
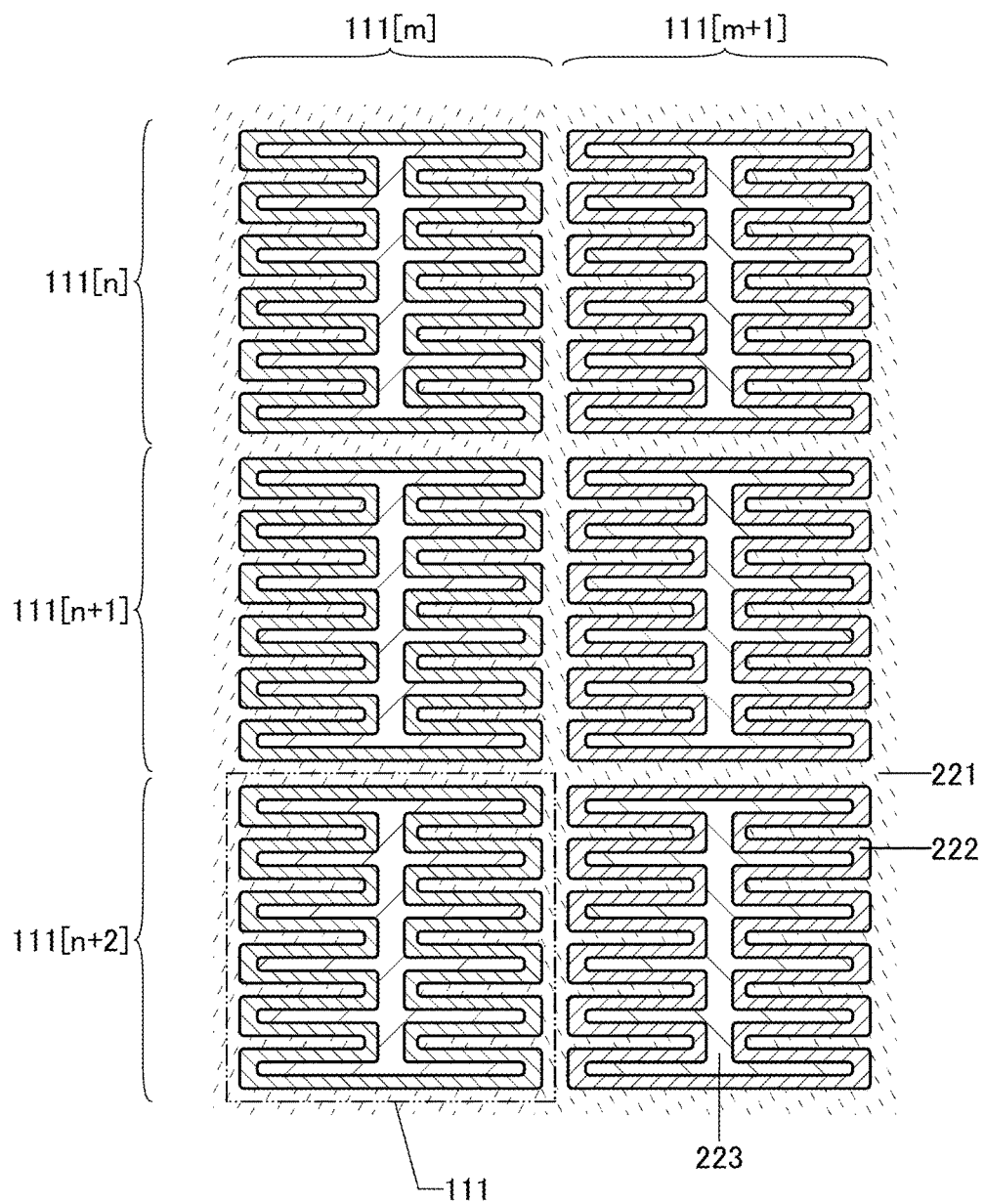
FIG. 8 illustrates an example where photoelectric conversion elements are arranged in a matrix.

FIG. 8 is a plan view showing an example in which the photoelectric conversion elements 136 included in the pixels 111 are arranged in a matrix with three rows (n to n+2) and two columns (m and m+1). The photoelectric conversion element 136 can be formed in each of the pixels 111 without dividing a semiconductor layer. Specifically, the semiconductor layer is formed in the entire pixel portion 110, and regions functioning as the p-type semiconductor 221, the n-type semiconductor 223, and the i-type semiconductor 222 can be formed therein using an ion implantation method, an ion doping method, or the like. Further, the p-type semiconductor 221 surrounds the i-type semiconductor 222 in every pixel, whereby electric interference between the i-type semiconductors 222 in adjacent pixels can be prevented. Since it is not necessary that the semiconductor layer for constituting the photoelectric conversion element 136 be divided for each pixel, the photoelectric conversion element 136 can be efficiently provided in the pixel 111. Accordingly, the detection sensitivity of the imaging device 100 can be improved.

Further, the p-type semiconductor 221 can be used as part of a wiring for supplying power supply potential. The use of the p-type semiconductor 221 as part of the wiring for supplying power supply potential can reduce variations in power supply potential in the pixel portion 110. Note that the p-type semiconductor 221 and the n-type semiconductor 223 are interchangeable.

[Color Filter and the like]

The pixels 111 included in the imaging device 100 are used as subpixels, and each of the plurality of pixels 111 is provided with a filter that transmits light with a different wavelength band (color filter), whereby data for achieving color image display can be obtained.

Figure 9A:
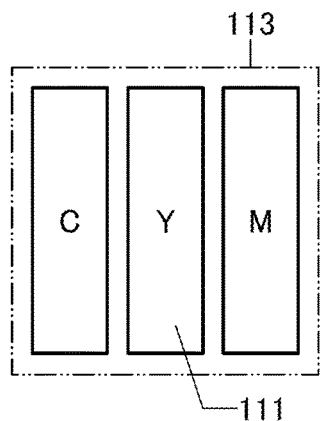
FIGS. 9A to 9E illustrate pixel configuration examples.
Figure 9B:
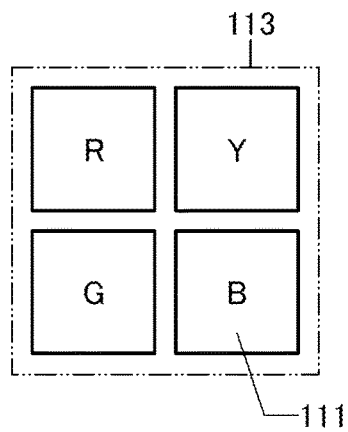
Figure 9C:
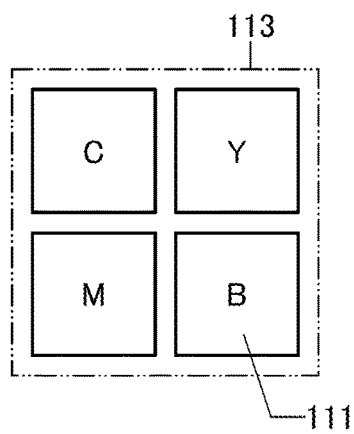
Figure 9D:
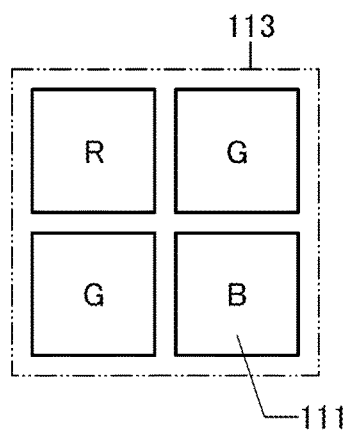
Figure 9E:
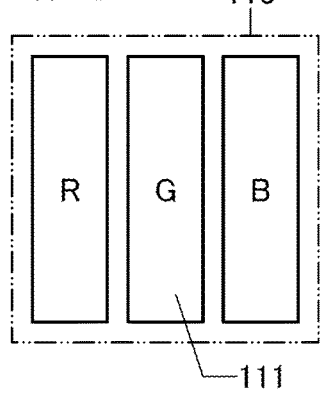

FIG. 9E is a plan view showing an example of the pixel 111 with which a color image is obtained. In FIG. 9E, a pixel 111 provided with a color filter that transmits light with a red (R) wavelength band (also referred to as "pixel 111R"), a pixel 111 provided with a color filter that transmits light with a green (G) wavelength band (also referred to as "pixel 111G"), and a pixel 111 provided with a color filter that transmits light with a blue (B) wavelength band (also referred to as "pixel 111B") are provided. The pixel 111R, the pixel 111G, and the pixel 111B collectively function as one pixel 113.

The color filter used in the pixel 111 is not limited to red (R), green (G), and blue (B) color filters, and as illustrated in FIG. 9A, color filters that transmit light of cyan (C), yellow (Y), and magenta (M) may be used. The pixels 111 that sense light with three different wavelength bands are provided in one pixel 113, whereby a full-color image can be obtained.

FIG. 9B illustrates the pixel 113 including a pixel 111 provided with a color filter that transmits yellow (Y) light, in addition to the pixels 111 provided with the color filters that transmit red (R), green (G), and blue (B) light. FIG. 9C illustrates the pixel 113 including a pixel 111 provided with a color filter that transmits blue (B) light, in addition to the pixels 111 provided with the color filters that transmit cyan (C), yellow (Y), and magenta (M) light. When the pixels 111 that sense light with four different wavelength bands are provided in one pixel 113, the reproducibility of colors of an obtained image can be increased.

The pixel number ratio (or the ratio of light receiving area) of the pixel 111R to the pixel 111G and the pixel 111B need not necessarily be 1:1:1. The pixel number ratio (the ratio of light receiving area) of red to green and blue may be 1:2:1 (Bayer arrangement), as illustrated in FIG. 9D. Alternatively, the pixel number ratio (the ratio of light receiving area) of red to green and blue may be 1:6:1.

Although the number of pixels 111 provided in the pixel 113 may be one, two or more is preferable. For example, when two or more pixels 111 that sense the same wavelength band are provided, the redundancy is increased, and the reliability of the imaging device 100 can be increased.

When an infrared (IR) filter that transmits infrared light and absorbs or reflects light with wavelength shorter than or equal to that of visible light is used as the filter, the imaging device 100 that detects infrared light can be achieved. Alternatively, when an ultra violet (UV) filter that transmits ultraviolet light and absorbs or reflects light with a wavelength longer than or equal to visible light is used as the filter, the imaging device 100 that detects ultraviolet light can be achieved. Alternatively, when a scintillator that turns a radiant ray into ultraviolet light or visible light is used as the filter, the imaging device 100 can be used as a radiation detector that detects an X-ray or a γ-ray.

When a neutral density (ND) filter (dimming filter) is used as a filter 602, a phenomenon of output saturation, which is caused when an excessive amount of light enters a photoelectric conversion element (light-receiving element), can be prevented. With a combination of ND filters with different dimming capabilities, the dynamic range of the imaging device can be increased.

Figure 10A:
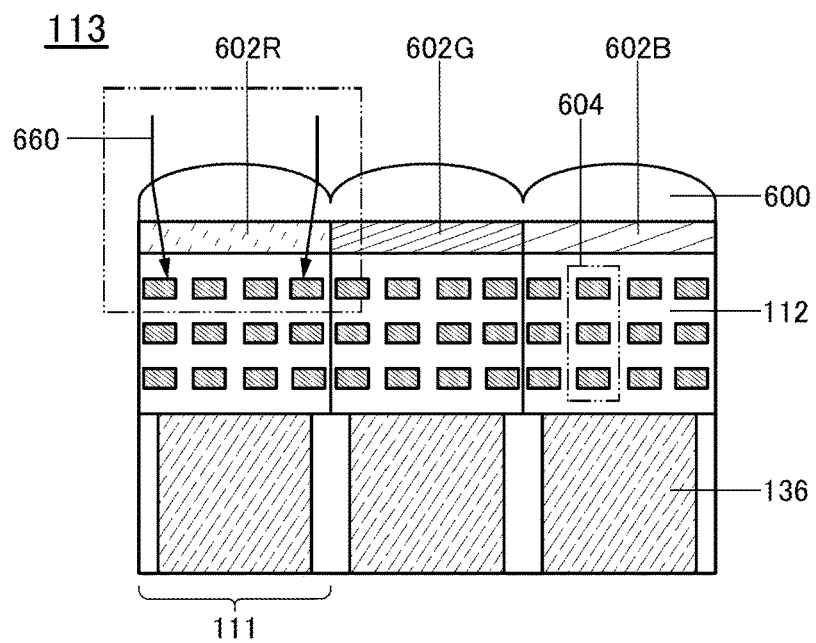
FIGS. 10A and 10B illustrate pixel configuration examples.

Besides the above-described filter, the pixel 113 may be provided with a lens. An arrangement example of the pixel 113, the filter 602, and a lens 600 will be described with reference to cross-sectional views in FIGS. 10A and 10B. With the lens 600, incident light can be efficiently received by a photoelectric conversion element. Specifically, as illustrated in FIG. 10A, light 660 enters the photoelectric conversion element 136 through the lens 600, the filter 602 (a filter 602R, a filter 602G, or a filter 602B), a pixel driver circuit 112, and the like formed in the pixel 113.

Figure 10B:
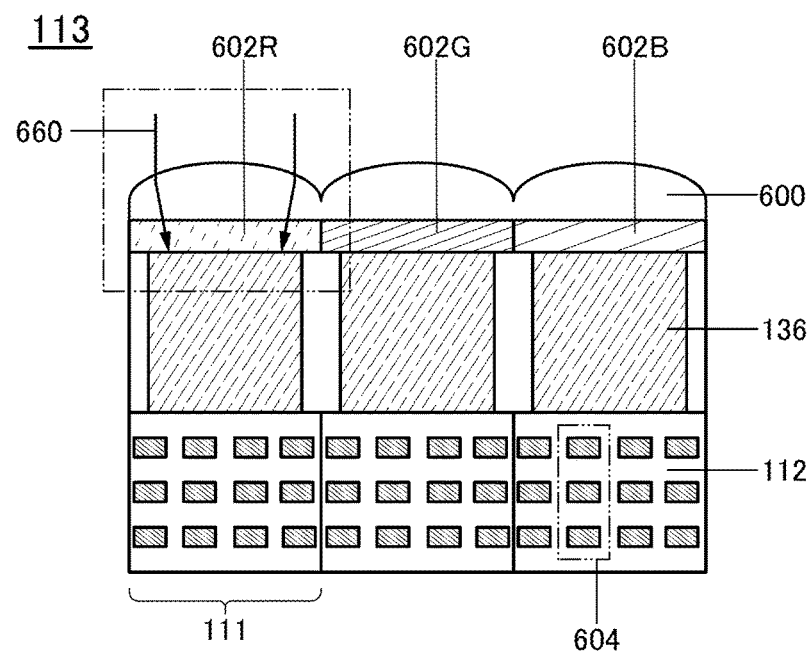

However, as illustrated in a region surrounded by a two-dot chain line, part of light 660 indicated by arrows may be blocked by part of a wiring layer 604. Thus, a structure in which the lens 600 and the filter 602 are provided on the photoelectric conversion element 136 side, as illustrated in FIG. 10B, may be employed such that the incident light is efficiently received by the photoelectric conversion element 136. When the light 660 is incident on the photoelectric conversion element 136 side, the imaging device 100 with high sensitivity can be provided.

This embodiment can be implemented in an appropriate combination with any of the structures described in the other embodiments.

(Embodiment 2)

In this embodiment, a pixel 111a having a configuration different from that of the pixel 111 will be described with reference to drawings. The pixel 111a includes a pixel driver circuit 512 instead of the pixel driver circuit 112. In other words, the pixel 111a includes the pixel driver circuit 512 and the photoelectric conversion element 136. The pixel 111a can be fabricated using a material and a method similar to those of the pixel 111. To reduce overlapping description, explanation of the pixel 111a mainly as to differences from the pixel 111 will be made in this embodiment. For understanding the part of the pixel 111a that is not explained in this embodiment, the other embodiments can be referred to.

Figure 11A:
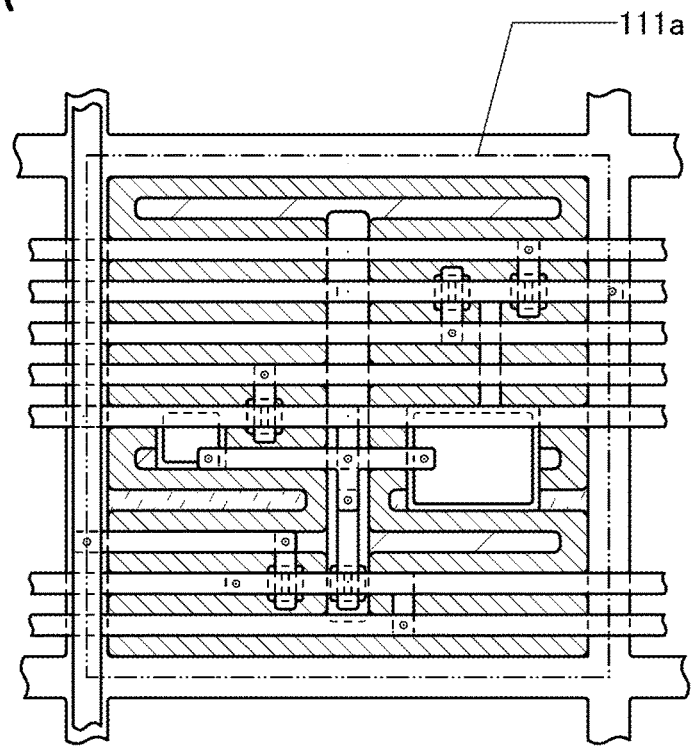
FIGS. 11A and 11B illustrate pixel configuration examples.
Figure 11B:
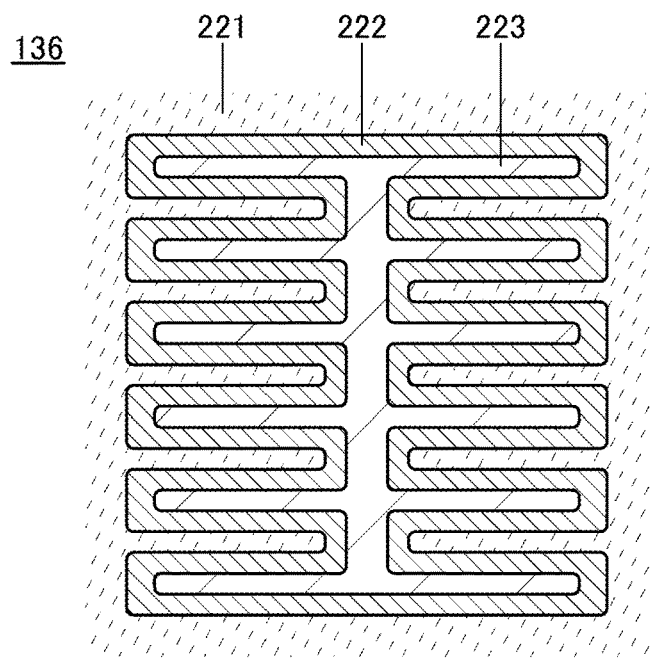
Figure 12A:
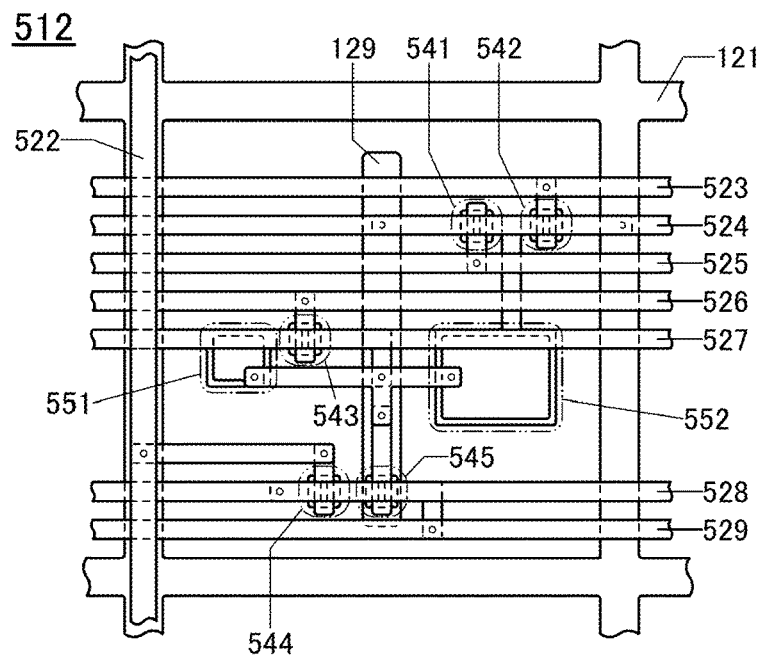
FIG. 12A is a plan view of a pixel driver circuit and FIG. 12B is a pixel circuit diagram.
Figure 12B:
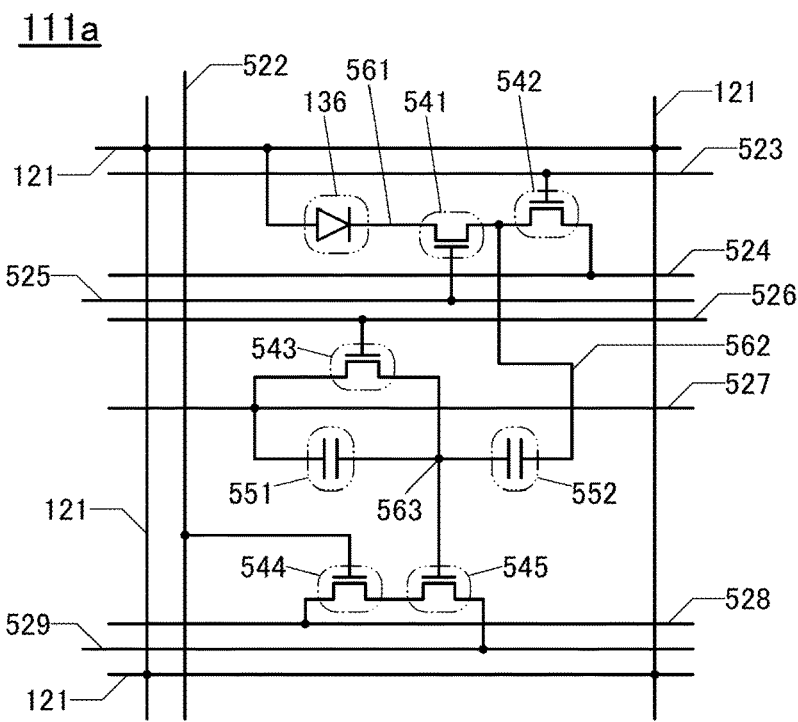
Figure 13:
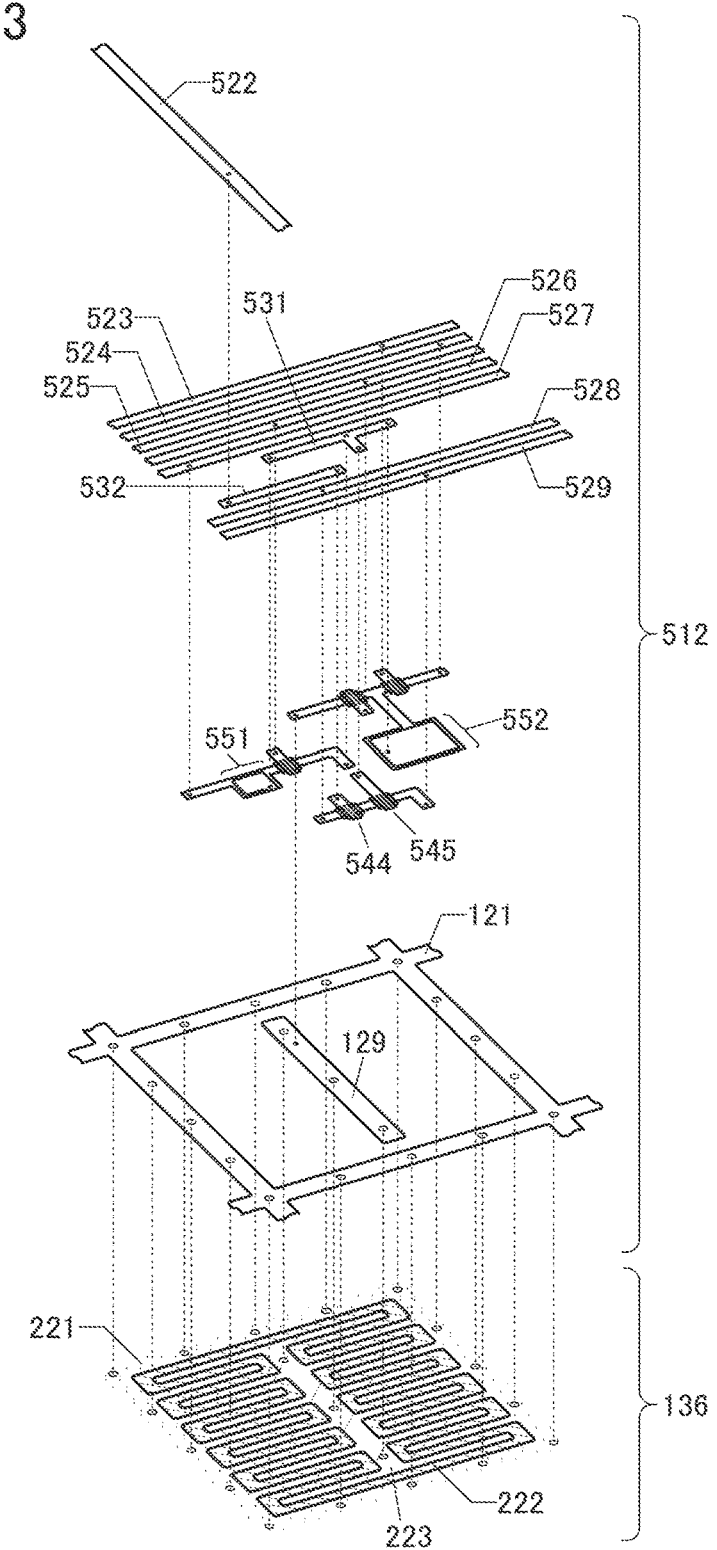
FIG. 13 is a perspective view illustrating a pixel configuration example.

FIG. 11A is a plan view of the pixel 111a. FIG. 11B is a plan view of the photoelectric conversion element 136. FIG. 12A is a plan view of the pixel driver circuit 512. FIG. 12B is a circuit diagram of the pixel 111a. FIG. 13 is a perspective view illustrating a configuration of the pixel 111a. The pixel 111a includes the pixel driver circuit 512 over the photoelectric conversion element 136.

The pixel 111a includes functional elements such as a transistor 541, a transistor 542, a transistor 543, a transistor 544, a transistor 545, a capacitor 551, a capacitor 552, and the photoelectric conversion element 136. Among the functional elements included in the pixel 111a, the functional elements except the photoelectric conversion element 136 constitute the pixel driver circuit 512. The pixel driver circuit 512 is electrically connected to the photoelectric conversion element 136 (see FIGS. 12A and 12B). The pixel driver circuit 512 has a function of generating an analog signal that corresponds to the amount of light received by the photoelectric conversion element 136.

In the pixel 111a, one electrode (e.g., a cathode) of the photoelectric conversion element 136 is electrically connected to a node 561, and the other electrode (e.g., an anode) of the photoelectric conversion element 136 is electrically connected to a wiring 121. One of a source and a drain of the transistor 541 is electrically connected to the node 561, and the other of the source and the drain of the transistor 541 is electrically connected to a node 562. A gate of the transistor 541 is electrically connected to a wiring 525. One of a source and a drain of the transistor 542 is electrically connected to the node 562, and the other of the source and the drain of the transistor 542 is electrically connected to a wiring 524. A gate of the transistor 542 is electrically connected to a wiring 523. One of a source and a drain of the transistor 543 is electrically connected to a wiring 527, and the other of the source and the drain of the transistor 543 is electrically connected to a node 563. A gate of the transistor 543 is electrically connected to a wiring 526. One of a source and a drain of the transistor 544 is electrically connected to a wiring 528, and the other of the source and the drain of the transistor 544 is electrically connected to one of a source and a drain of a transistor 545. A gate of the transistor 544 is electrically connected to a wiring 522. The other of the source and the drain of the transistor 545 is electrically connected to a wiring 529, and a gate of the transistor 545 is electrically connected to the node 563. One electrode of the capacitor 551 is electrically connected to the wiring 527, and the other electrode of the capacitor 551 is electrically connected to the node 563. One electrode of the capacitor 552 is electrically connected to the node 563, and the other electrode of the capacitor 552 is electrically connected to the node 562.

The node 562 and the node 563 function as charge storage portions. The transistor 541 can function as a transfer transistor for transferring a charge (potential) corresponding to the amount of light received by the photoelectric conversion element 136 to the node 562. The transistor 542 can function as a reset transistor for resetting a potential of the node 562. The transistor 543 can function as a reset transistor for resetting a potential of the node 563. The transistor 545 can function as an amplifier transistor for amplifying a charge stored in the node 563. The transistor 544 can function as a reading transistor for reading a signal that has been amplified by the transistor 545.

The wiring 121 has a function of supplying a potential VPD, for example. The wiring 522 has a function of supplying a potential SEL, for example. The wiring 523 has a function of supplying a potential PR, for example. The wiring 524 has a function of supplying a potential VRS, for example. The wiring 525 has a function of supplying a potential TX, for example. The wiring 526 has a function of supplying a potential W, for example. The wiring 527 has a function of supplying a potential CS, for example. The wiring 529 has a function of supplying a potential VPI, for example.

The one of the source and the drain of the transistor 541 may be electrically connected to a wiring 129, and the wiring 129 may be electrically connected to an n-type semiconductor 223 (see FIG. 13). The gate of the transistor 545 may be electrically connected to a wiring 531, and the wiring 531 may be electrically connected to the node 563. The other electrode of the capacitor 551 may be electrically connected to the wiring 531. The one electrode of the capacitor 552 may be electrically connected to the wiring 531. The wiring 531 can function as the node 563. The gate of the transistor 544 may be electrically connected to a wiring 532, and the wiring 532 may be electrically connected to the wiring 522.

Electrostatic capacitance of the capacitor 552 is preferably greater than electrostatic capacitance of the capacitor 551. Specifically, the electrostatic capacitance of the capacitor 552 is preferably greater than or equal to twice, more preferably greater than or equal to five times, and still more preferably greater than or equal to 10 times that of the capacitor 551.

The pixel 111a can supply an analog signal generated by the photoelectric conversion element 136 and the pixel driver circuit 512 to the wiring 528. Specifically, an analog signal determined in accordance with the amount of light received by the photoelectric conversion element 136 can be held in the node 562 and the node 563, amplified by the transistor 545, and then output to the wiring 528.

Further, the pixel driver circuit 512 can function as a difference arithmetic circuit. The imaging device 100 using the pixel 111a can compare data of an image taken in a first frame and data of an image taken in a second frame, and detect the difference. The imaging device 100 using the pixel 111a can detect the difference between two images taken in nonconsecutive frames. Specifically, the data of an image taken in the first frame is held in the node 563, and the data of an image taken in the second frame or after that is held in the node 562, whereby the difference from the data of the image taken in the first frame can be detected.

In other words, the imaging device 100 using the pixel 111a can detect changes in an image. Thus, a device having a function of outputting a signal (or stopping outputting a signal) when a change in the image is detected, or a function of outputting a signal (or stopping outputting a signal) when there is no change in the image can be provided. For example, the imaging device 100 that starts recording when there is a change in the image and stops recording when there is no change in the image can be provided.

Figure 14:
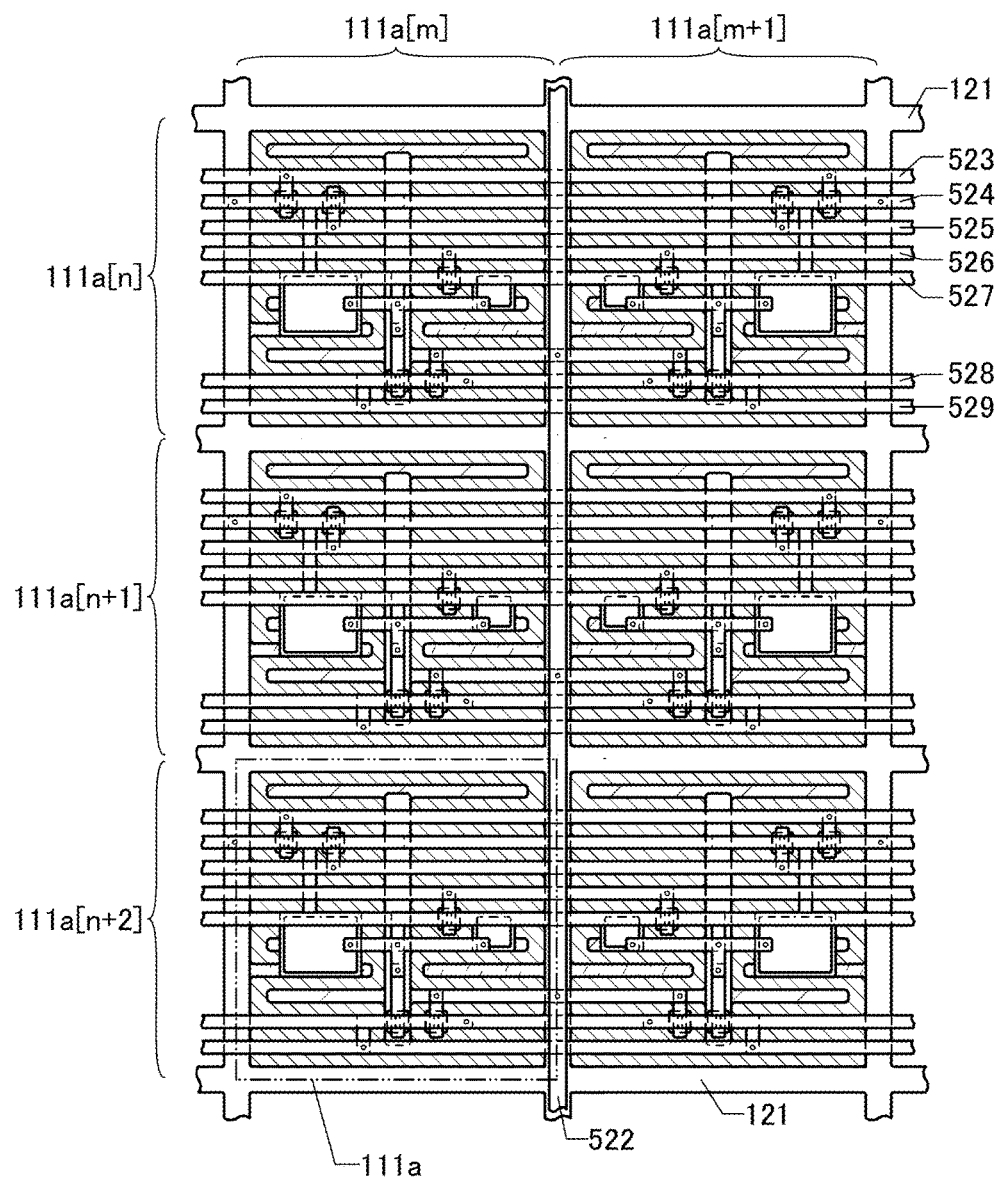
FIG. 14 illustrates an example where pixels are arranged in a matrix.
Figure 15:
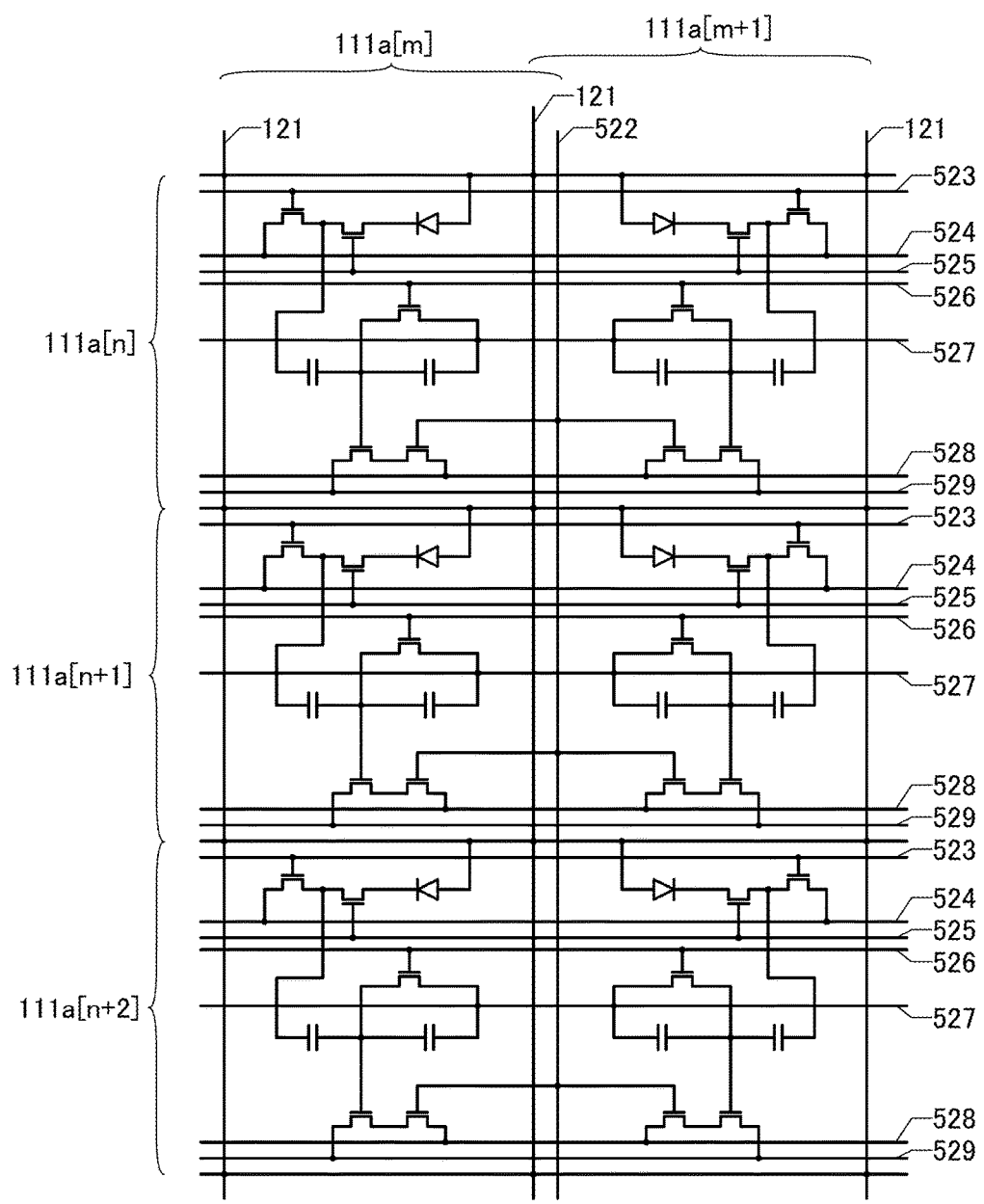
FIG. 15 illustrates a circuit configuration example of pixels arranged in a matrix.

An example of arranging the plurality of pixels 111a in a matrix is shown in FIG. 14 and FIG. 15. FIG. 14 is a plan view showing an example in which the pixels 111a are arranged in a matrix with three rows (n to n+2) and two columns (m and m+1). FIG. 15 is a circuit diagram corresponding to FIG. 14. FIG. 14 and FIG. 15 show an example in which the configuration of the pixel 111a in the column m (e.g., an odd number column) and the configuration of the pixel 111a in the column m+1 (e.g., an even number column) are different and mirror symmetrical. Further, the wiring 522 in the m-th column and the wiring 522 in the m+1-th column are the same one wiring 522.

This embodiment can be implemented in an appropriate combination with any of the structures described in the other embodiments.

(Embodiment 3)

In this embodiment, a pixel 111b having a configuration different from that of the pixel 111 or that of the pixel 111a will be described with reference to drawings. The pixel 111b includes a pixel driver circuit 712 instead of the pixel driver circuit 112 included in the pixel 111. In other words, the pixel 111b includes the pixel driver circuit 712 and the photoelectric conversion element 136. The pixel 111b can be fabricated using a material and a method similar to those of the pixel 111. To reduce overlapping description, explanation of the pixel 111b mainly as to differences from the pixel 111 will be made. For understanding the part of the pixel 111b that is not explained in this embodiment, the other embodiments can be referred to.

Figure 16A:
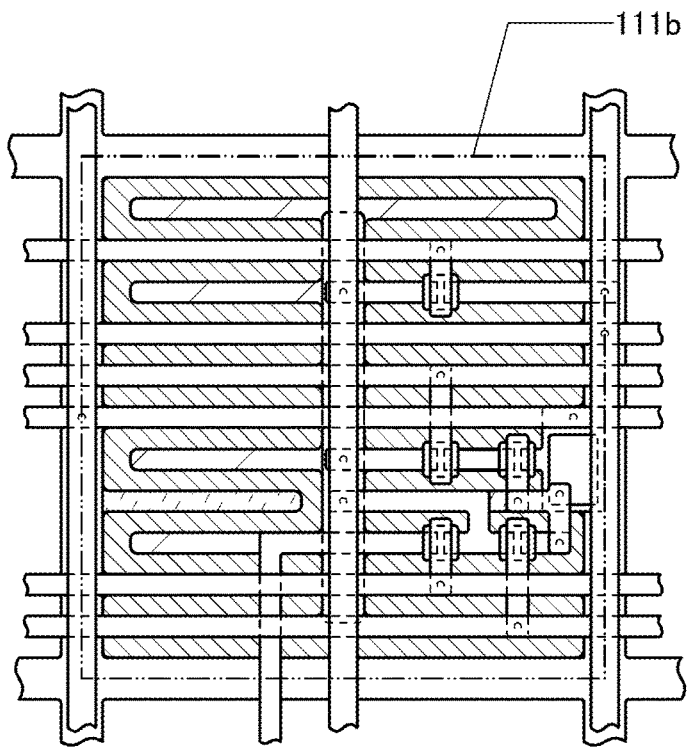
FIGS. 16A and 16B illustrate pixel configuration examples.
Figure 16B:
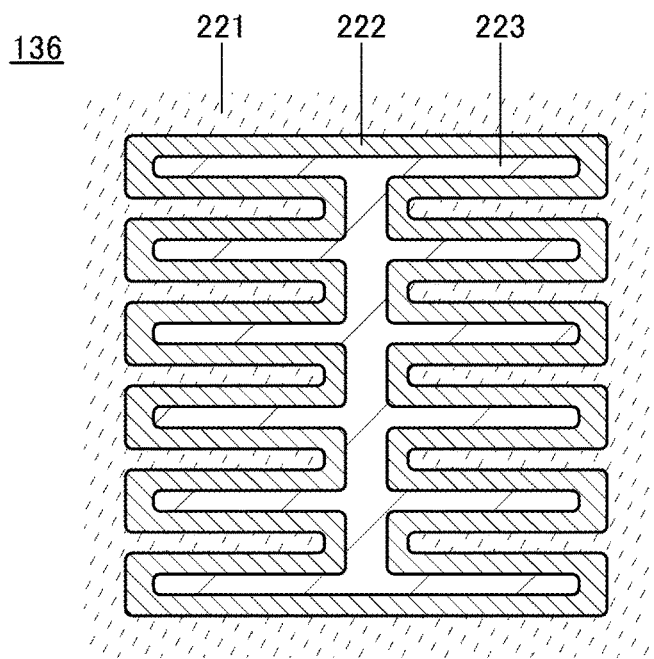
Figure 17A:
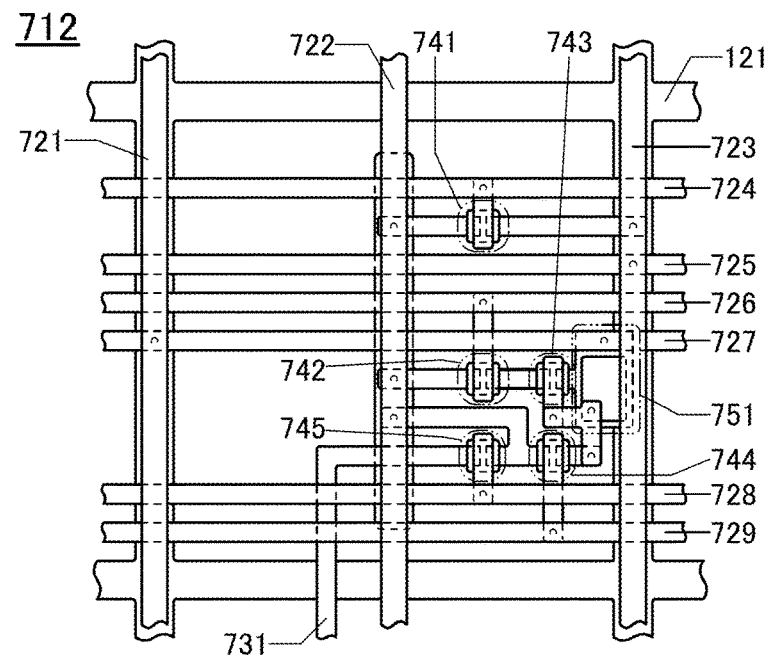
FIG. 17A is a plan view of a pixel driver circuit and FIG. 17B is a pixel circuit diagram.
Figure 17B:
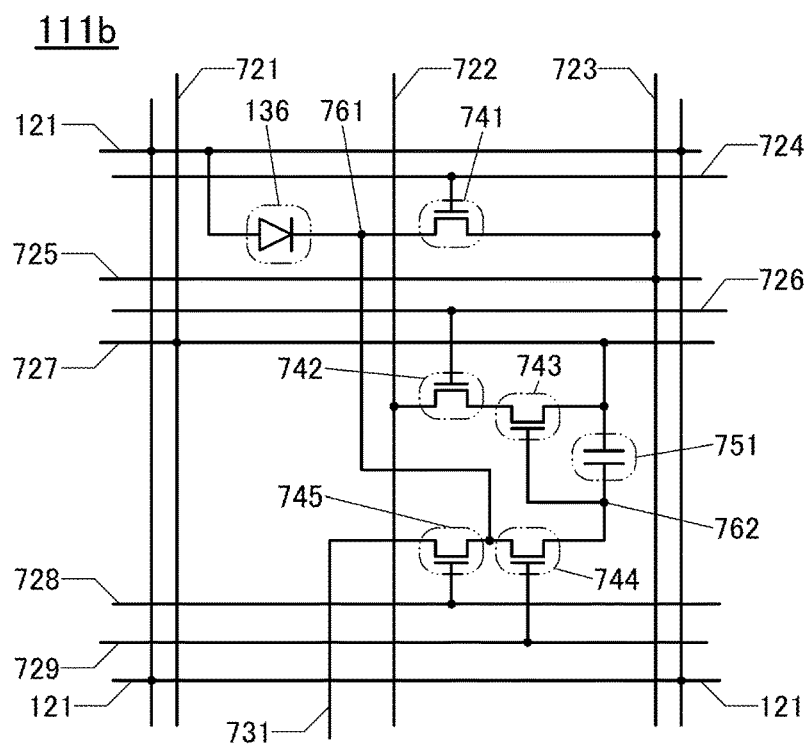
Figure 18:
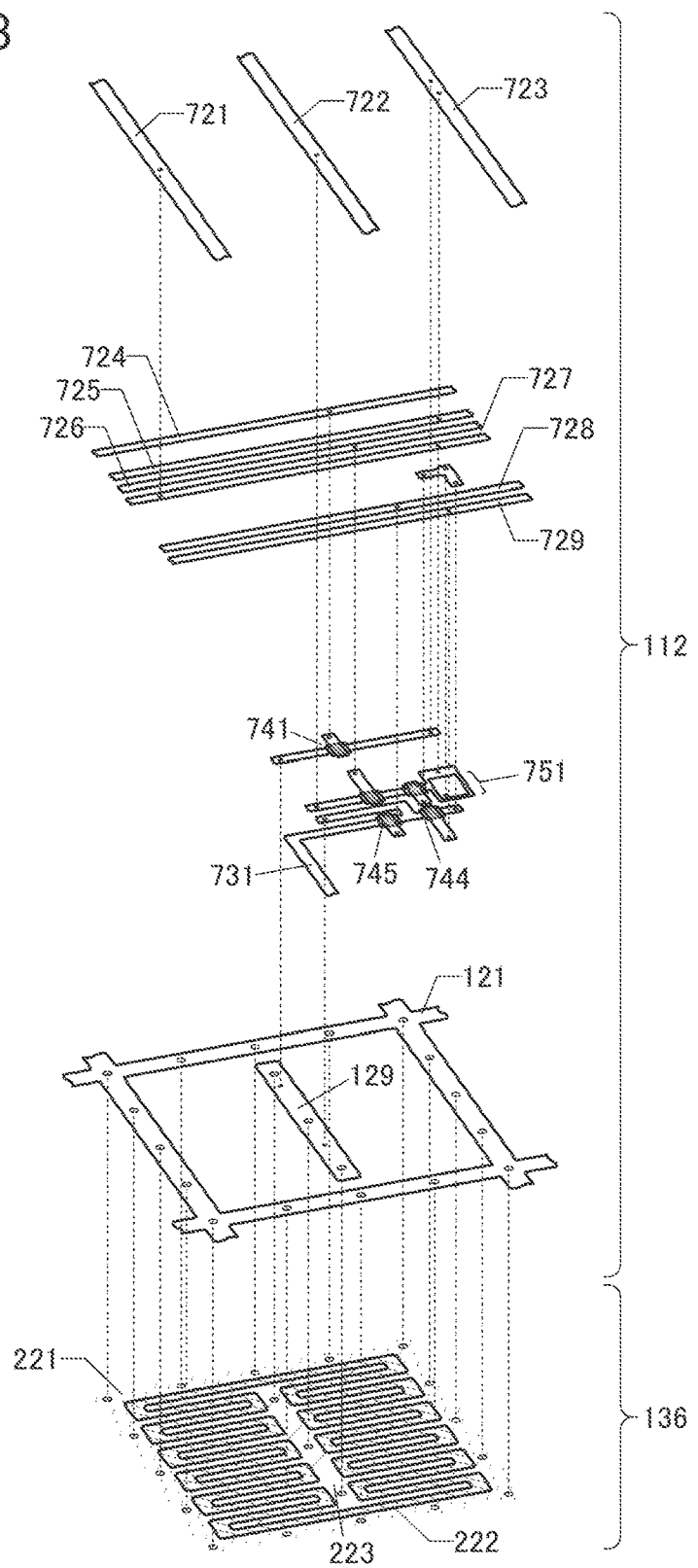
FIG. 18 is a perspective view illustrating a pixel configuration example.

FIG. 16A is a plan view of the pixel 111b. FIG. 16B is a plan view of the photoelectric conversion element 136. FIG. 17A is a plan view of the pixel driver circuit 712. FIG. 17B is a circuit diagram of the pixel 111b. FIG. 18 is a perspective view illustrating a configuration of the pixel 111b. The pixel 111b includes the pixel driver circuit 712 over the photoelectric conversion element 136.

The pixel 111b includes functional elements such as a transistor 741, a transistor 742, a transistor 743, a transistor 744, a transistor 745, a capacitor 751, and the photoelectric conversion element 136. Among the functional elements included in the pixel 111b, the functional elements except the photoelectric conversion element 136 constitute the pixel driver circuit 712. The pixel driver circuit 712 is electrically connected to the photoelectric conversion element 136 (see FIGS. 17A and 17B). The pixel driver circuit 712 has a function of generating an analog signal that corresponds to the amount of light received by the photoelectric conversion element 136.

In the pixel 111b, one electrode (e.g., a cathode) of the photoelectric conversion element 136 is electrically connected to a node 761, and the other electrode (e.g., an anode) of the photoelectric conversion element 136 is electrically connected to a wiring 121. One of a source and a drain of the transistor 741 is electrically connected to the node 761, and the other of the source and the drain of the transistor 741 is electrically connected to a wiring 723. A gate of the transistor 741 is electrically connected to a wiring 724. One of a source and a drain of the transistor 742 is electrically connected to a wiring 722, and the other of the source and the drain of the transistor 742 is electrically connected to one of a source and a drain of the transistor 743. A gate of the transistor 742 is electrically connected to a wiring 726. The other of the source and the drain of the transistor 743 is electrically connected to a wiring 727, and a gate of the transistor 743 is electrically connected to a node 762. One of a source and a drain of the transistor 744 is electrically connected to the node 761, and the other of the source and the drain of the transistor 744 is electrically connected to the node 762. A gate of the transistor 744 is electrically connected to a wiring 729. One of a source and a drain of the transistor 745 is electrically connected to a wiring 731, and the other of the source and the drain of the transistor 745 is electrically connected to the node 761.

The wiring 731 is electrically connected to one of the source and the drain of the transistor 745 included in another pixel. For example, one of the source and the drain of the transistor 745 included in the pixel 111b in the n-th row may be electrically connected to one of the source and the drain of the transistor 745 included in the pixel 111b in the n+1-th row.

A gate of the transistor 745 is electrically connected to a wiring 728. One electrode of the capacitor 751 is electrically connected to the wiring 727, and the other electrode of the capacitor 751 is electrically connected to the node 762. The wiring 723 is electrically connected to a wiring 725. Although the wiring 725 may be omitted, the provision of the wiring 725 electrically connected to the plurality of wirings 723 can decrease variations in potential of the wirings 723 in the pixel portion 110, stabilize the operation of the imaging device 100, and improve the reliability of the imaging device 100. The other of the source and the drain of the transistor 741 may be electrically connected to the wiring 725 to allow the wiring 723 to be omitted.

The wiring 727 is electrically connected to a wiring 721. Although the wiring 721 may be omitted, the provision of the wiring 721 electrically connected to the wiring 727 can decrease variations in potential of the wirings 727 in the pixel portion 110, stabilize the operation of the imaging device 100, and improve the reliability of the imaging device 100. The other of the source and the drain of the transistor 743 and the one electrode of the capacitor 751 may be electrically connected to the wiring 721 to allow the wiring 727 to be omitted.

The transistor 744 can function as a transfer transistor for transferring a charge (potential) corresponding to the amount of light received by the photoelectric conversion element 136 to the node 762. The node 762 functions as a charge storage portion. The transistor 741 can function as a reset transistor for resetting a potential of the node 761 and a potential of the node 762. The transistor 743 can function as an amplifier transistor for amplifying a charge stored in the node 762. The transistor 742 can function as a reading transistor for reading a signal that has been amplified by the transistor 743.

For example, in the case where the one of the source and the drain of the transistor 745 included in the pixel 111b in the n-th row is electrically connected to the one of the source and the drain of the transistor 745 included in the pixel 111b in the n+1-th row, the node 761 included in the pixel 111b in the n-th row can be electrically connected to the node 761 included in the pixel 111b in the n+1-th row when the transistors 745 in the respective pixels are turned on. In other words, the photoelectric conversion element 136 included in the pixel 111b in the n-th row and the photoelectric conversion element 136 included in the pixel 111b in the n+1-th row can be parallel-connected by turning on the transistors 745 in the respective pixels. Parallel-connecting the plurality of photoelectric conversion elements 136 can substantially increase the light-receiving area of the imaging device 100. For example, an imaging time per frame can be shortened. Thus, the imaging device 100 capable of high-speed consecutive imaging can be provided. Furthermore, since the detection sensitivity is increased, the imaging device 100 with a wide dynamic range can be provided.

The wiring 121 has a function of supplying a potential VPD, for example. The wiring 721 and the wiring 727 each have a function of supplying a potential VPI, for example. The wiring 723 and the wiring 725 each have a function of supplying a potential VRS, for example. The wiring 724 has a function of supplying a potential VPR, for example. The wiring 726 has a function of supplying a potential SEL, for example. The wiring 728 has a function of supplying a potential PA, for example. The wiring 729 has a function of supplying a potential TX, for example.

The one of the source and the drain of the transistor 741 may be electrically connected to a wiring 129, and the wiring 129 may be electrically connected to an n-type semiconductor 223 (see FIG. 18).

The pixel 111b can supply an analog signal generated by the photoelectric conversion element 136 and the pixel driver circuit 712 to the wiring 722. Specifically, an analog signal determined in accordance with the amount of light received by the photoelectric conversion element 136 can be held in the node 762, amplified by the transistor 743, and then output to the wiring 722.

Figure 19:
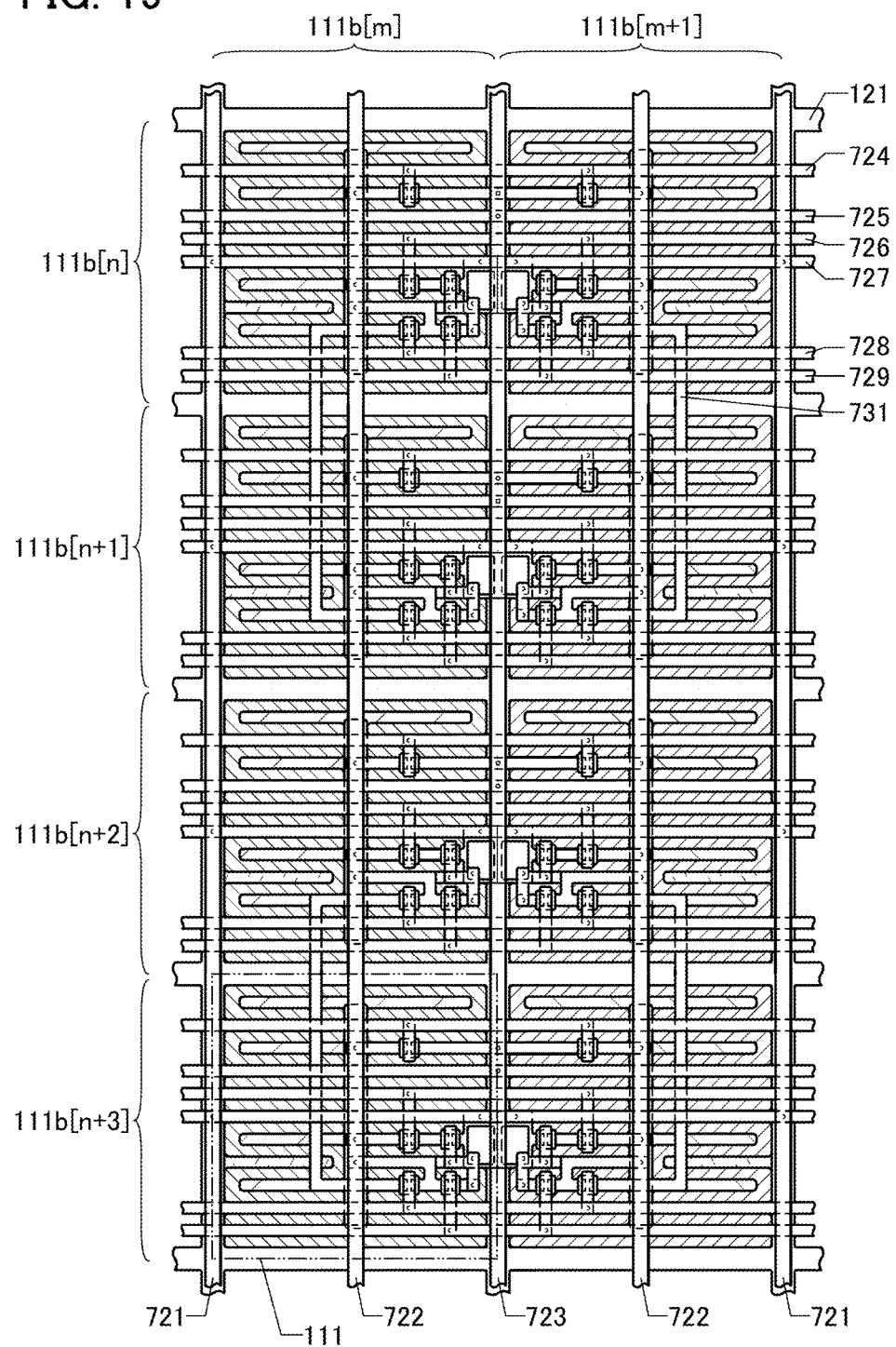
FIG. 19 illustrates an example where pixels are arranged in a matrix.
Figure 20:
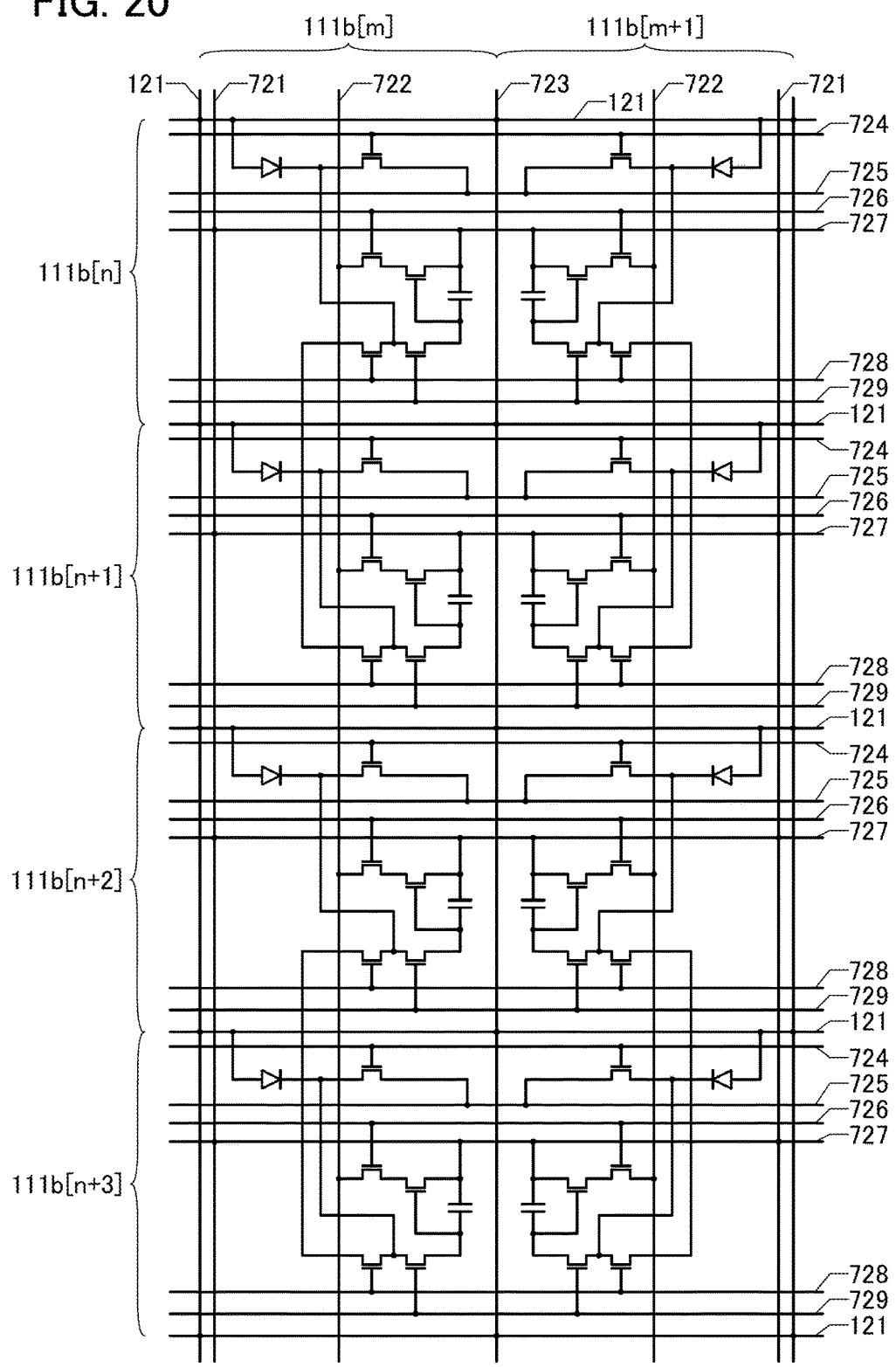
FIG. 20 illustrates a circuit configuration example of pixels arranged in a matrix.

An example of arranging the plurality of pixels 111b in a matrix is shown in FIG. 19 and FIG. 20. FIG. 19 is a plan view showing an example in which the pixels 111b are arranged in a matrix with four rows (n to n+3) and two columns (m and m+1). FIG. 20 is a circuit diagram corresponding to FIG. 19. FIG. 19 and FIG. 20 show an example in which the configuration of the pixel 111b in the column m (e.g., an odd number column) and the configuration of the pixel 111b in the column m+1 (e.g., an even number column) are different and mirror symmetrical. The wiring 723 in the m-th column and the wiring 723 in the m+1-th column are the same one wiring 723. Further, the wiring 721 in the m+1-th column and the wiring 721 in the m+2-th column (not shown) are the same one wiring 721.

In FIG. 19 and FIG. 20, the one of the source and the drain of the transistor 745 included in the pixel 111b in the n-th row is electrically connected via the wiring 731 to the one of the source and the drain of the transistor 745 included in the pixel 111b in the n+1-th row. In addition, the one of the source and the drain of the transistor 745 included in the pixel 111b in the n+2-th row is electrically connected via the wiring 731 to the one of the source and the drain of the transistor 745 included in the pixel 111b in the n+3-th row.

The above-described connection between the pixels 111b is not limited to the connection between adjacent pixels 111b. For example, the one of the source and the drain of the transistor 745 included in the pixel 111b in the n-th row may be electrically connected to the one of the source and the drain of the transistor 745 included in the pixel 111b in the n+2-th row.

Furthermore, the above-described connection between the pixels 111b may apply to three or more pixels 111b. For example, the one of the source and the drain of the transistor 745 included in the pixel 111b in the n-th row may be electrically connected to the one of the source and the drain of the transistor 745 included in the pixel 111b in the n+1-th row and the one of the source and the drain of the transistor 745 included in the n+2-th row.

This embodiment can be implemented in an appropriate combination with any of the structures described in the other embodiments.

(Embodiment 4)

Figure 22A:
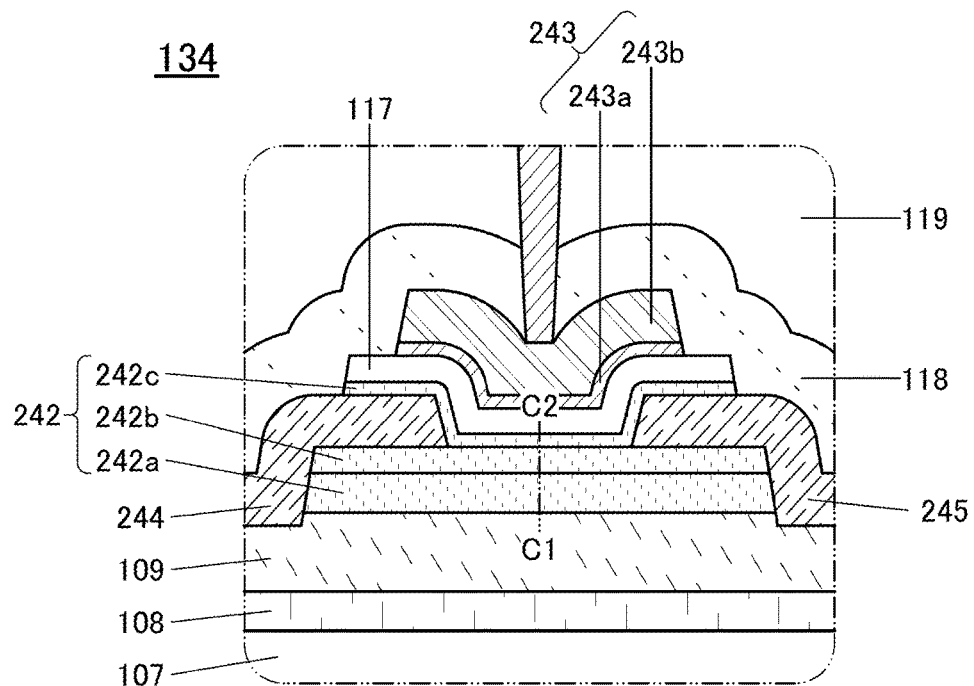
FIGS. 22A and 22B illustrate an example of a transistor.
Figure 22B:
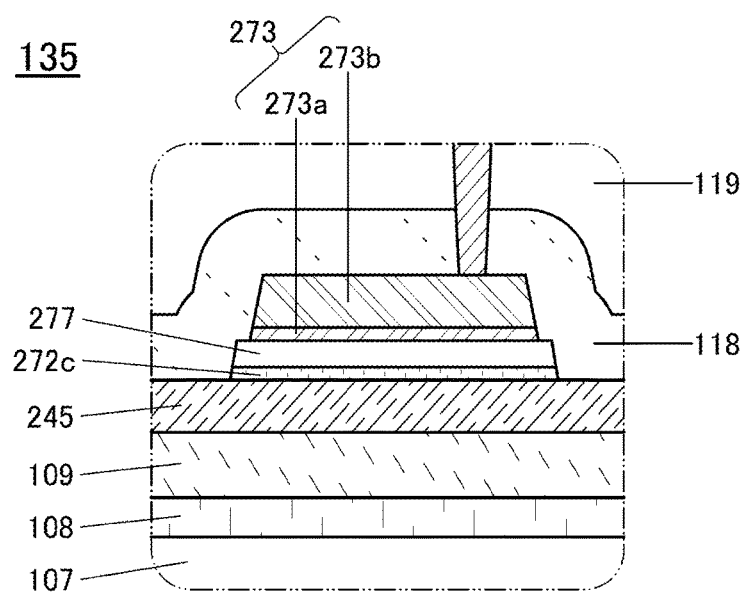
Figure 23:
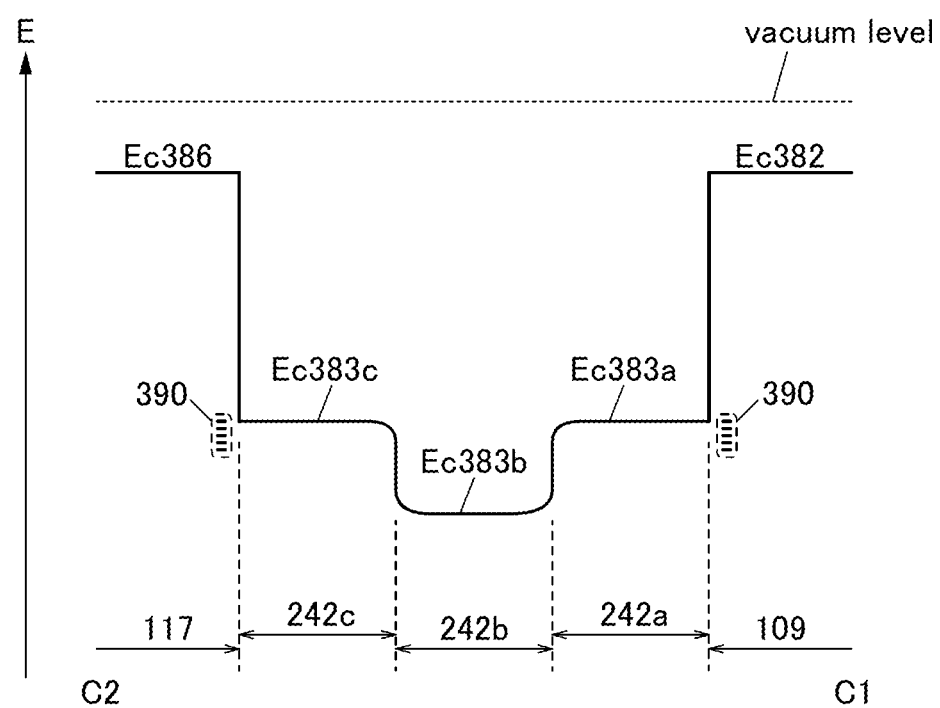
FIG. 23 illustrates an energy band structure.
Figure 24A:
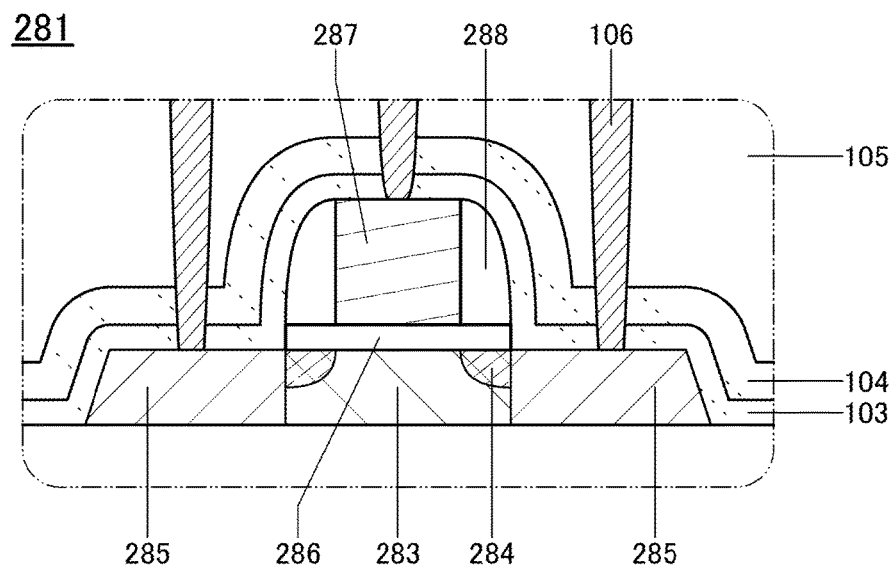
FIGS. 24A and 24B illustrate examples of a transistor.
Figure 24B:
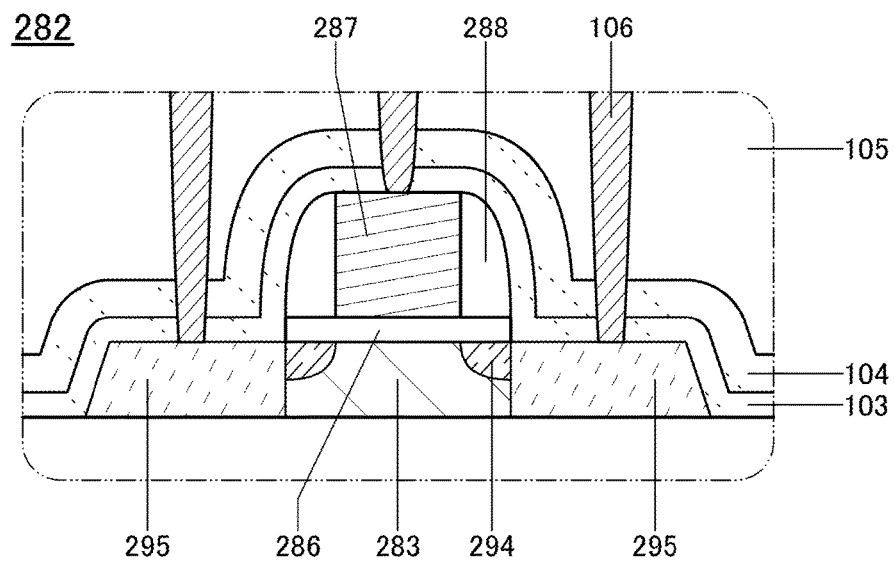

In this embodiment, an example in which the imaging device 100 described in the above embodiments includes a CMOS image sensor that is a type of solid-state image sensor will be described with reference to FIG. 21, FIGS. 22A and 22B, FIG. 23, FIGS. 24A and 24B, and FIGS. 25A and 25E. A pixel region 251 shown in FIG. 21 as a cross-sectional view corresponds to part of the pixel 111, the pixel 111a, or the pixel 111b in the imaging device 100. A peripheral circuit region 252 shown in FIG. 21 as a cross-sectional view corresponds to part of a peripheral circuit in the imaging device 100. FIG. 22A is an enlarged view of a transistor 134 in FIG. 21. FIG. 22B is an enlarged view of a capacitor 135 in FIG. 21. FIG. 24A is an enlarged view of a transistor 281 in FIG. 21. FIG. 24B is an enlarged view of a transistor 282 in FIG. 21. The transistor 134 in FIG. 21 corresponds to the transistor 541 in the pixel 111a, for example. Note that the structure of the transistor 134 described in this embodiment can be used for the other transistors described in the above embodiments.

The imaging device 100 described in this embodiment includes an insulating layer 102 over a substrate 101, and a photoelectric conversion element 136 having a pin junction over the insulating layer 102. As described in the above embodiments, the photoelectric conversion element 136 includes a p-type semiconductor 221, an i-type semiconductor 222, and an n-type semiconductor 223.

As the substrate 101, a glass substrate, a quartz substrate, a sapphire substrate, a ceramic substrate, a metal substrate, a semiconductor substrate, or the like can be used. Alternatively, a plastic substrate having heat resistance to the processing temperature of this embodiment may be used. Examples of the substrate include a semiconductor substrate (e.g., a single crystal substrate or a silicon substrate), a silicon on insulator (SOI) substrate, a stainless steel substrate, a substrate including stainless steel foil, a tungsten substrate, and a substrate including tungsten foil. As an example of a glass substrate, a barium borosilicate glass substrate, an aluminoborosilicate glass substrate, a soda lime glass substrate, or the like can be given.

After the photoelectric conversion element 136 and the pixel driver circuit 112 are formed, the substrate 101 may be removed by a mechanical polishing method, an etching method, or the like. In the case where a material that can transmit light to be detected by the photoelectric conversion element 136 is used as the substrate 101, light can be incident on the photoelectric conversion element 136 from the substrate 101 side.

The insulating layer 102 can be formed to have a single-layer structure or a multi-layer structure using an oxide material such as aluminum oxide, magnesium oxide, silicon oxide, silicon oxynitride, gallium oxide, germanium oxide, yttrium oxide, zirconium oxide, lanthanum oxide, neodymium oxide, hafnium oxide, or tantalum oxide; a nitride material such as silicon nitride, silicon nitride oxide, aluminum nitride, or aluminum nitride oxide; or the like. The insulating layer 102 can be formed by a sputtering method, a chemical vapor deposition (CVD) method, a thermal oxidation method, a coating method, a printing method, or the like.

Formation of the p-type semiconductor 221, the i-type semiconductor 222, and the n-type semiconductor 223 may be performed in the following manner: an i-type semiconductor 222 is formed over the insulating layer 102, a mask is formed over the i-type semiconductor 222, and impurity elements are selectively introduced into part of the i-type semiconductor 222. The impurity element can be introduced by an ion implantation method or an ion doping method, for example. The mask is removed after the impurity element is introduced.

The p-type semiconductor 221, the i-type semiconductor 222, and the n-type semiconductor 223 can be formed using a single crystal semiconductor, a polycrystalline semiconductor, a microcrystalline semiconductor, a nanocrystal semiconductor, a semi-amorphous semiconductor, an amorphous semiconductor, or the like. For example, amorphous silicon or microcrystalline germanium can be used. Alternatively, a compound semiconductor such as silicon carbide or gallium arsenide can be used.

In the case where silicon is used as a material for formation of the p-type semiconductor 221, the i-type semiconductor 222, and the n-type semiconductor 223, a Group 13 element can be used, for example, as an impurity element imparting p-type conductivity. As an impurity element imparting n-type conductivity, for example, a Group 15 element can be used.

In the case where the semiconductor layer is formed using SOI, for example, the insulating layer 102 may be a buried oxide (BOX) layer.

The imaging device 100 in this embodiment includes an insulating layer 103 and an insulating layer 104 over the p-type semiconductor 221, the i-type semiconductor 222, and the n-type semiconductor 223. The insulating layer 103 and the insulating layer 104 can be formed using a material and a method similar to those of the insulating layer 102. Note that one of the insulating layers 103 and 104 may be omitted or another insulating layer may be stacked thereover.

Further, in the imaging device 100 described in this embodiment, an insulating layer 105 having a flat surface is formed over the insulating layer 104. The insulating layer 105 can be formed using a material and a method similar to those of the insulating layer 102. It is also possible to use a low-dielectric constant material (a low-k material), a siloxane-based resin, phosphosilicate glass (PSG), borophosphosilicate glass (BPSG), or the like for the insulating layer 105. Further, the surface of the insulating layer 105 may be subjected to chemical mechanical polishing (CMP) treatment (hereinafter also referred to as CMP treatment). By the CMP treatment, unevenness of the surface can be reduced, and coverage with an insulating layer or a conductive layer formed later can be increased.

In a region including the insulating layer 103 to the insulating layer 105 which overlaps the p-type semiconductor 221, an opening 224 is formed. In a region including the insulating layer 103 to the insulating layer 105 which overlaps the n-type semiconductor 223, an opening 225 is formed. Contact plugs 106 are formed in the opening 224 and the opening 225. The contact plugs 106 are formed by filling the openings provided in the insulating layers with a conductive material. As the conductive material, for example, a conductive material with high embeddability, such as tungsten or polysilicon, can be used. Although not illustrated, the side surface and the bottom surface of the material can be covered with a barrier layer (a diffusion prevention layer) such as a titanium layer, a titanium nitride layer, or a stack of these layers. In this case, the barrier layer is regarded as part of the contact plug in some cases. The number of openings (224 and 225) to be formed or their arrangement are not particularly limited. Thus, an imaging device with high layout flexibility can be provided.

A wiring 121 and a wiring 129 are formed over the insulating layer 105. The wiring 121 is electrically connected to the p-type semiconductor 221 via the contact plug 106 in provided in the opening 224. The wiring 129 is electrically connected to the n-type semiconductor 223 via the contact plug 106 provided in the opening 225.

An insulating layer 107 is formed to cover the wiring 121 and the wiring 129. The insulating layer 107 can be formed using a material and a method that are similar to those of the insulating layer 105. A surface of the insulating layer 107 may be subjected to CMP treatment. The CMP treatment can reduce unevenness of the surface and increase coverage with an insulating layer or a conductive layer formed later.

The wiring 121 and the wiring 129 can be each formed with a single-layer structure or a stacked-layer structure using any of metals such as aluminum, titanium, chromium, nickel, copper, yttrium, zirconium, molybdenum, manganese, silver, tantalum, and tungsten, or an alloy containing any of these metals as its main component. For example, a single-layer structure of a copper film containing manganese; a two-layer structure in which an aluminum film is stacked over a titanium film; a two-layer structure in which an aluminum film is stacked over a tungsten film; a two-layer structure in which a copper film is stacked over a copper-magnesium-aluminum alloy film; a two-layer structure in which a copper film is stacked over a titanium film; a two-layer structure in which a copper film is stacked over a tungsten film; a three-layer structure in which a titanium film or a titanium nitride film, an aluminum film or a copper film, and a titanium film or a titanium nitride film are stacked in this order; a three-layer structure in which a molybdenum film or a molybdenum nitride film, an aluminum film or a copper film, and a molybdenum film or a molybdenum nitride film are stacked in this order; a three-layer structure in which a tungsten film, a copper film, and a tungsten film are stacked in this order; and the like can be given. Alternatively, an alloy film or a nitride film in which aluminum and one or more elements selected from titanium, tantalum, tungsten, molybdenum, chromium, neodymium, and scandium are combined may be used.

Note that a conductive material containing oxygen such as indium tin oxide (ITO), zinc oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added, or a conductive material containing nitrogen such as titanium nitride or tantalum nitride may be used. It is also possible to use a stacked-layer structure formed using a material containing the above metal element and conductive material containing oxygen. It is also possible to use a stacked-layer structure formed using a material containing the above metal element and conductive material containing nitrogen. It is also possible to use a stacked-layer structure formed using a material containing the above metal element, conductive material containing oxygen, and conductive material containing nitrogen.

The transistor 134, a transistor 289, and the capacitor 135 are formed over the insulating layer 107 with an insulating layer 108 and an insulating layer 109 positioned therebetween. Although not shown in FIG. 21, the transistors 131, 132, 133, and the like are formed over the insulating layer 107 with the insulating layers 108 and 109 positioned therebetween. In this embodiment, the transistor 134 and the transistor 289 are each a top-gate transistor; however, a bottom-gate transistor may be employed. The same applies to the other transistors not shown in FIG. 21.

Alternatively, an inverted staggered transistor or a forward staggered transistor can also be used as the transistors. It is also possible to use a dual-gate transistor, in which a semiconductor layer in which a channel is formed is interposed between two gate electrodes. Further, the transistor is not limited to a transistor having a single-gate structure; a multi-gate transistor having a plurality of channel formation regions, such as a double-gate transistor may be used.

A transistor with any of a variety of structures such as a planar type, a FIN-type, a Tri-Gate type, and the like can be used.

The above transistors may have the same structure or different structures. Note that the size (e.g., channel length and channel width) or the like of each transistor may be adjusted as appropriate. In the case where all of the plurality of transistors in the imaging device 100 have the same structure, the transistors can be formed concurrently in the same process.

The transistor 134 includes an electrode 243 that can function as a gate electrode, an electrode 244 that can function as one of a source electrode and a drain electrode, an electrode 245 that can function as the other of the source electrode and the drain electrode, an insulating layer 117 that can function as a gate insulating layer, and a semiconductor layer 242.

Figure 21:
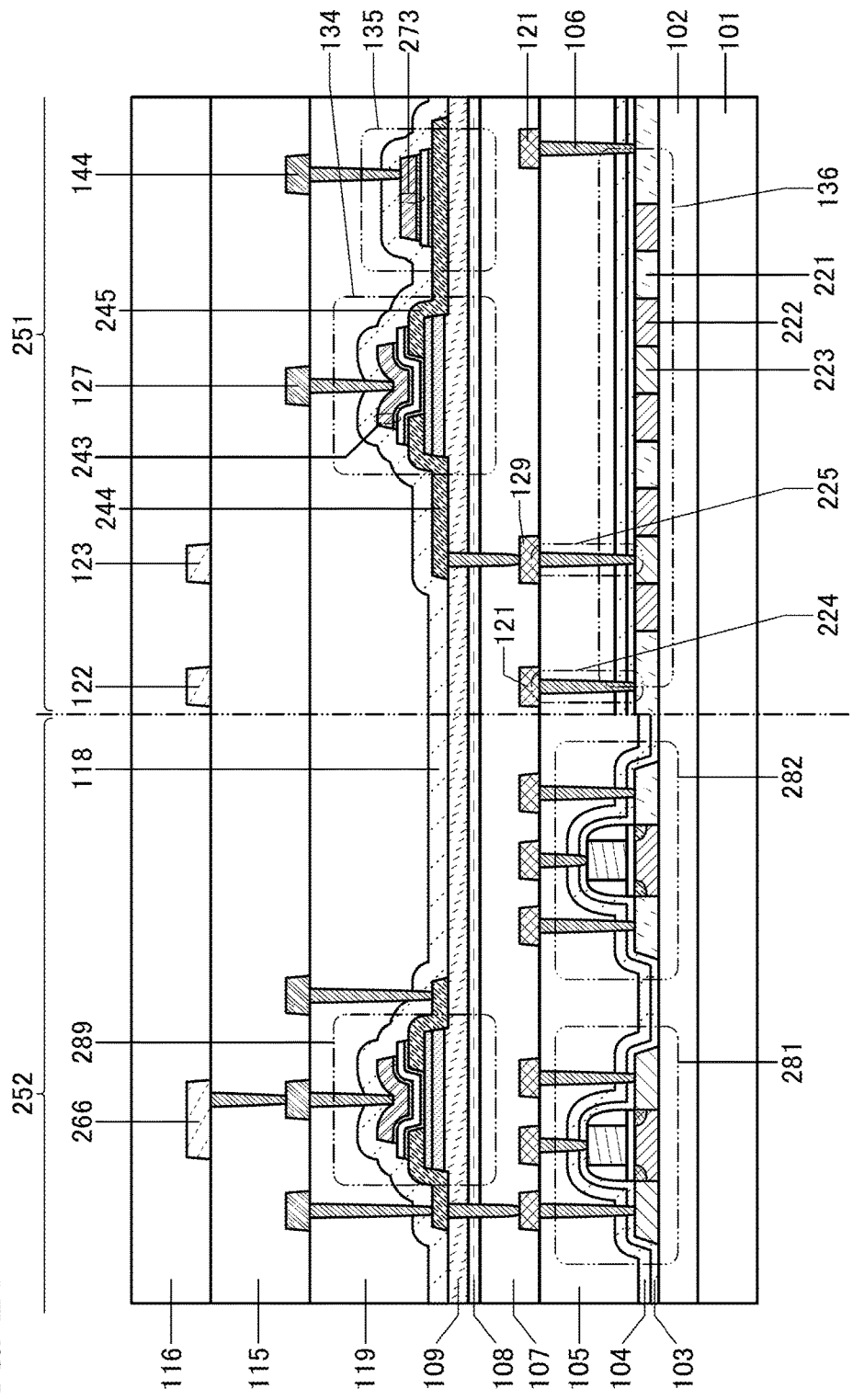
FIG. 21 illustrates a structure example of an imaging device.

In FIG. 21, the electrode 245 is used as both an electrode that functions as the other of the source electrode and the drain electrode of the transistor 134 and an electrode that can function as the one electrode of the capacitor 135. However, one embodiment of the present invention is not limited thereto. The electrode that functions as the other of the source electrode and the drain electrode of the transistor 134 and the electrode that can function as the one electrode of the capacitor 135 may be formed using different electrodes.

The capacitor 135 has a structure in which the electrode 245 that can function as the one electrode of the capacitor 135 and an electrode 273 that can function as the other electrode of the capacitor 135 overlap with each other with an insulating layer 277 and a semiconductor layer 272c positioned therebetween. In this embodiment, the electrode 273 is a stacked layer including an electrode 273a and an electrode 273b. The electrode 273 can be formed at the same time as the electrode 243. Thus, the electrode 273a can be formed at the same time as the electrode 243a and the electrode 273b can be formed at the same time as the electrode 243b. The insulating layer 277 and the semiconductor layer 272c can function as a dielectric. The insulating layer 277 can be formed at the same time as an insulating layer 117. The semiconductor layer 272c can be formed at the same time as a semiconductor layer 242c. One of the insulating layer 277 and the semiconductor layer 272c may be omitted.

The insulating layer 108 is preferably formed using an insulating film that has a function of preventing diffusion of impurities such as oxygen, hydrogen, water, alkali metal, and alkaline earth metal. Examples of the insulating film include silicon oxide, silicon oxynitride, silicon nitride, silicon nitride oxide, gallium oxide, hafnium oxide, yttrium oxide, aluminum oxide, aluminum oxynitride, and the like. When the insulating film is formed using silicon nitride, gallium oxide, hafnium oxide, yttrium oxide, aluminum oxide, or the like, diffusion of impurities from the photoelectric conversion element 136 side to the semiconductor layer 242 can be reduced. Note that the insulating layer 108 can be formed by a sputtering method, a CVD method, an evaporation method, a thermal oxidation method, or the like. The insulating layer 108 can be formed to have a single-layer structure or a stacked-layer structure including any of these materials.

The insulating layer 109 can be formed using a material and a method similar to those of the insulating layer 102. In the case where an oxide semiconductor is used for the semiconductor layer 242, an insulating layer containing oxygen in excess of the stoichiometric composition is preferably used for the insulating layer 109. From the insulating layer containing oxygen at a higher proportion than oxygen in the stoichiometric composition, part of oxygen is released by heating. The insulating layer containing oxygen in excess of that in the stoichiometric composition is an insulating layer of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis in which heat treatment is performed such that a temperature of a layer surface is higher than or equal to 100° C. and lower than or equal to 700° C., preferably higher than or equal to 100° C. and lower than or equal to 500° C.

The insulating layer containing oxygen at a higher proportion than the stoichiometric composition can be formed by treatment for adding oxygen to the insulating layer. The treatment for adding oxygen can be performed by heat treatment under an oxygen atmosphere or performed with an ion implantation apparatus, an ion doping apparatus, or a plasma treatment apparatus. As a gas for adding oxygen, an oxygen gas of $^{16}O_2$, $^{18}O_2$, or the like, a nitrous oxide gas, an ozone gas, or the like can be used. In this specification, the treatment for adding oxygen is also referred to as "oxygen doping treatment".

Each semiconductor layer in the transistor 134, the transistor 289, and the like can be formed using a single crystal semiconductor, a polycrystalline semiconductor, a microcrystalline semiconductor, a nanocrystal semiconductor, a semi-amorphous semiconductor, an amorphous semiconductor, or the like. For example, amorphous silicon or microcrystalline germanium can be used. Alternatively, a compound semiconductor such as silicon carbide, gallium arsenide, an oxide semiconductor, or a nitride semiconductor, an organic semiconductor, or the like can be used.

In this embodiment, an example in which an oxide semiconductor is used for the semiconductor layer 242 is described. Furthermore, in this embodiment, a case where the semiconductor layer 242 is a stacked layer including a semiconductor layer 242a, a semiconductor layer 242b, and the semiconductor layer 242c is described.

Each of the semiconductor layer 242a, the semiconductor layer 242b, and the semiconductor layer 242c is formed using a material containing either In or Ga or both of them. Typical examples are an In—Ga oxide (an oxide containing In and Ga), an In—Zn oxide (an oxide containing In and Zn), and an In-M-Zn oxide (an oxide containing In, an element M, and Zn: the element M is one or more kinds of metal elements selected from Al, Ti, Ga, Y, Zr, La, Ce, Nd, and Hf whose strength of bonding with oxygen is higher than that of In).

The semiconductor layer 242a and the semiconductor layer 242c are preferably formed using a material containing one or more kinds of metal elements contained in the semiconductor layer 242b. With the use of such a material, interface states at interfaces between the semiconductor layer 242a and the semiconductor layer 242b and between the semiconductor layer 242c and the semiconductor layer 242b are less likely to be generated. Accordingly, carriers are not likely to be scattered or captured at the interfaces, which results in an improvement in field-effect mobility of the transistor. Further, threshold-voltage variation of the transistor can be reduced. Thus, a semiconductor device having favorable electrical characteristics can be obtained.

Each of the thicknesses of the semiconductor layer 242a and the semiconductor layer 242c is greater than or equal to 3 nm and less than or equal to 100 nm, preferably greater than or equal to 3 nm and less than or equal to 50 nm. The thickness of the semiconductor layer 242b is greater than or equal to 3 nm and less than or equal to 200 nm, preferably greater than or equal to 3 nm and less than or equal to 100 nm, more preferably greater than or equal to 3 nm and less than or equal to 50 nm.

In the case where the semiconductor layer 242b is an In-M-Zn oxide and the semiconductor layer 242a and the semiconductor layer 242c are each an In-M-Zn oxide, the semiconductor layer 242a and the semiconductor layer 242c each have the atomic ratio where In:M:Zn=$x_1$:$y_1$:$z_1$, and the semiconductor layer 242b has an atomic ratio where In:M:Zn=$x_2$:$y_2$:$z_2$, for example. In that case, the compositions of the semiconductor layer 242a, the semiconductor layer 242c, and the semiconductor layer 242b are determined so that $y_1/x_1$ is large than $y_2/x_2$. It is preferable that the compositions of the semiconductor layer 242a, the semiconductor layer 242c, and the semiconductor layer 242b are determined so that $y_1/x_1$ is 1.5 times or more as large as $y_2/x_2$. It is further preferable that the compositions of the semiconductor layer 242a, the semiconductor layer 242c, and the semiconductor layer 242b are determined so that $y_1/x_1$ is twice or more as large as $y_2/x_2$. It is still further preferable that the compositions of the semiconductor layer 242a, the semiconductor layer 242c, and the semiconductor layer 242b are determined so that $y_1/x_1$ is three times or more as large as $y_2/x_2$. At this time, $y_1$ is preferably greater than or equal to $x_1$ in the semiconductor layer 242b, in which case stable electrical characteristics of a transistor can be achieved. However, when $y_1$ is three times or more as large as $x_1$, the field-effect mobility of the transistor is reduced; accordingly, $y_1$ is preferably smaller than three times $x_1$. When the semiconductor layer 242a and the semiconductor layer 242c have the above compositions, the semiconductor layer 242a and the semiconductor layer 242c can each be a layer in which oxygen vacancies are less likely to be generated than in the semiconductor layer 242b.

In the case where the semiconductor layer 242a and the semiconductor layer 242c are each an In-M-Zn oxide, the content percentages of In and an element M, not taking Zn and O into consideration, are preferably as follows: the content percentage of In is lower than 50 atomic % and the percentage of M is higher than or equal to 50 atomic %. The content percentages of In and M are more preferably as follows: the content percentage of In is lower than 25 atomic % and the content percentage of M is higher than or equal to 75 atomic %. In the case where the semiconductor layer 242b is an In-M-Zn oxide, the content percentages of In and element M, not taking Zn and O into consideration, are preferably as follows: the content percentage of In is higher than or equal to 25 atomic % and the content percentage of M is lower than 75 atomic %. The content percentages In and element M are more preferably as follows: the content percentage of In is higher than or equal to 34 atomic % and the content percentage of M is lower than 66 atomic %.

For example, an In—Ga—Zn oxide which is formed using a target having an atomic ratio of In:Ga:Zn=1:3:2, 1:3:4, 1:3:6, 1:6:4, or 1:9:6 or an In—Ga oxide which is formed using a target having an atomic ratio of In:Ga=1:9 can be used for each of the semiconductor layer 242a and the semiconductor layer 242c containing In or Ga. Furthermore, an In—Ga—Zn oxide which is formed using a target having an atomic ratio of In:Ga:Zn=3:1:2, 1:1:1, 5:5:6, or 4:2:4.1 can be used for the semiconductor layer 242b. Note that the atomic ratio of each of the semiconductor layer 242a, the semiconductor layer 242b, and the semiconductor layer 242c may vary within a range of ±20% of any of the above-described atomic ratios as an error.

In order to give stable electrical characteristics to the transistor including the semiconductor layer 242b, it is preferable that impurities and oxygen vacancies in the semiconductor layer 242b be reduced to obtained a highly purified semiconductor layer; accordingly, the semiconductor layer 242b can be regarded as an intrinsic or substantially intrinsic semiconductor layer. Furthermore, it is preferable that at least the channel formation region of the semiconductor layer 242b be a semiconductor layer that can be regarded as an intrinsic or substantially intrinsic semiconductor layer.

Note that the substantially intrinsic semiconductor layer refers to an oxide semiconductor layer in which the carrier density is lower than $1\times10^{17}/cm^3$, lower than $1\times10^{15}/cm^3$, or lower than $1\times10^{13}/cm^3$.

[Energy Band Structure of Oxide Semiconductor]

The function and effect of the semiconductor layer 242 that is a stacked layer including the semiconductor layer 242a, the semiconductor layer 242b, and the semiconductor layer 242c will be described with an energy band structure diagram shown in FIG. 23. FIG. 23 is the energy band structure diagram showing a portion along dashed-dotted line C1-C2 in FIG. 22A. Thus, FIG. 23 illustrates the energy band structure of a channel formation region of the transistor 134.

In FIG. 23, Ec382, Ec383a, Ec383b, Ec383c, and Ec386 are the energies of bottoms of the conduction band in the insulating layer 109, the semiconductor layer 242a, the semiconductor layer 242b, the semiconductor layer 242c, and the insulating layer 117, respectively.

Here, a difference in energy between the vacuum level and the bottom of the conduction band (the difference is also referred to as "electron affinity") corresponds to a value obtained by subtracting an energy gap from a difference in energy between the vacuum level and the top of the valence band (the difference is also referred to as an ionization potential). Note that the energy gap can be measured using a spectroscopic ellipsometer (UT-300 manufactured by HORIBA JOBIN YVON S.A.S.). The energy difference between the vacuum level and the top of the valence band can be measured using an ultraviolet photoelectron spectroscopy (UPS) device (VersaProbe manufactured by ULVAC-PHI, Inc.).

Note that an In—Ga—Zn oxide which is formed using a target having an atomic ratio of In:Ga:Zn=1:3:2 has an energy gap of approximately 3.5 eV and an electron affinity of approximately 4.5 eV. An In—Ga—Zn oxide which is formed using a target having an atomic ratio of In:Ga:Zn=1:3:4 has an energy gap of approximately 3.4 eV and an electron affinity of approximately 4.5 eV. An In—Ga—Zn oxide which is formed using a target having an atomic ratio of In:Ga:Zn=1:3:6 has an energy gap of approximately 3.3 eV and an electron affinity of approximately 4.5 eV. An In—Ga—Zn oxide which is formed using a target having an atomic ratio of In:Ga:Zn=1:6:2 has an energy gap of approximately 3.9 eV and an electron affinity of approximately 4.3 eV. An In—Ga—Zn oxide which is formed using a target having an atomic ratio of In:Ga:Zn=1:6:8 has an energy gap of approximately 3.5 eV and an electron affinity of approximately 4.4 eV. An In—Ga—Zn oxide which is formed using a target having an atomic ratio of In:Ga:Zn=1:6:10 has an energy gap of approximately 3.5 eV and an electron affinity of approximately 4.5 eV. An In—Ga—Zn oxide which is formed using a target having an atomic ratio of In:Ga:Zn=1:1:1 has an energy gap of approximately 3.2 eV and an electron affinity of approximately 4.7 eV. An In—Ga—Zn oxide which is formed using a target having an atomic ratio of In:Ga:Zn=3:1:2 has an energy gap of approximately 2.8 eV and an electron affinity of approximately 5.0 eV.

Since the insulating layer 109 and the insulating layer 117 are insulators, Ec382 and Ec386 are closer to the vacuum level (have a smaller electron affinity) than Ec383a, Ec383b, and Ec383c.

Further, Ec383a is closer to the vacuum level than Ec383b. Specifically, Ec383a is preferably located closer to the vacuum level than Ec383b by 0.05 eV or more, 0.07 eV or more, 0.1 eV or more, or 0.15 eV or more and 2 eV or less, 1 eV or less, 0.5 eV or less, or 0.4 eV or less.

Further, Ec383c is closer to the vacuum level than Ec383b. Specifically, Ec383c is preferably located closer to the vacuum level than Ec383b by 0.05 eV or more, 0.07 eV or more, 0.1 eV or more, or 0.15 eV or more and 2 eV or less, 1 eV or less, 0.5 eV or less, or 0.4 eV or less.

In the vicinity of an interface between the semiconductor layer 242a and the semiconductor layer 242b and the vicinity of an interface between the semiconductor layer 242b and the semiconductor layer 242c, mixed regions are formed; thus, the energy of the bottom of the conduction band continuously changes. In other words, no state or few states exist at these interfaces.

Accordingly, electrons transfer mainly through the semiconductor layer 242b in the stacked-layer structure having the above energy band structure. Therefore, even when an interface state exists at an interface between the semiconductor layer 242a and the insulating layer 109 or an interface between the semiconductor layer 242c and the insulating layer 117, the interface state hardly influences the transfer of the electrons. In addition, the interface state does not exist or hardly exists at the interface between the semiconductor layer 242a and the semiconductor layer 242b and at the interface between the semiconductor layer 242c and the semiconductor layer 242b; thus, transfer of electrons are not prohibited in the region. Accordingly, high field-effect mobility can be obtained in the transistor 134 having the above stacked-layer structure of the oxide semiconductor layers.

Note that although trap states 390 due to impurities or defects might be formed in the vicinity of the interface between the semiconductor layer 242a and the insulating layer 109 and in the vicinity of the interface between the semiconductor layer 242c and the insulating layer 117 as shown in FIG. 23, the semiconductor layer 242b can be separated from the trap states owing to the existence of the semiconductor layer 242a and the semiconductor layer 242c.

In particular, in the transistor 134 described in this embodiment, an upper surface and a side surface of the semiconductor layer 242b are in contact with the semiconductor layer 242c, and a bottom surface of the semiconductor layer 242b is in contact with the semiconductor layer 242a (not shown in FIG. 22A but FIG. 35C can be referred). In this manner, the semiconductor layer 242b is surrounded by the semiconductor layer 242a and the semiconductor layer 242c, whereby the influence of the trap state can be further reduced.

However, in the case where an energy difference between Ec383a or Ec383c and Ec383b is small, electrons in the semiconductor layer 242b might reach the trap states by passing over the energy gap. The electrons are trapped by the trap states, which generates a negative fixed charge at the interface with the insulating layer, causing the threshold voltage of the transistor to be shifted in the positive direction.

Therefore, each of the energy differences between Ec383a and Ec383b and between Ec383c and Ec383b is preferably set to be larger than or equal to 0.1 eV, more preferably larger than or equal to 0.15 eV, in which case a change in the threshold voltage of the transistor can be reduced and the transistor can have favorable electrical characteristics.

Each of the band gaps of the semiconductor layer 242a and the semiconductor layer 242c is preferably larger than that of the semiconductor layer 242b.

With one embodiment of the present invention, a transistor with a small variation in electrical characteristics can be provided. Accordingly, a semiconductor device with a small variation in electrical characteristics can be provided. With one embodiment of the present invention, a transistor with high reliability can be provided. Accordingly, a semiconductor device with high reliability can be provided.

An oxide semiconductor has a band gap of 2 eV or more; therefore, a transistor including an oxide semiconductor in a semiconductor layer in which a channel is formed has an extremely small off-state current. Specifically, the off-state current per micrometer of channel width at room temperature can be lower than $1 \times 10^{-20}$ A, preferably lower than $1 \times 10^{-22}$ A, more preferably lower than $1 \times 10^{-24}$ A. That is, the on/off ratio of the transistor can be greater than or equal to 20 digits and less than or equal to 150 digits.

With one embodiment of the present invention, a transistor with small power consumption can be provided. Accordingly, a semiconductor device or an imaging device with low power consumption can be provided.

A transistor that includes an oxide semiconductor in its semiconductor layer (such a transistor is also referred to as "OS transistor") has a very low off-state current. Thus, the use of OS transistors as the transistors 133 and 134 can make the capacitor 135 smaller. Alternatively, parasitic capacitance of a transistor or transistors and the like can be used as a substitute for the capacitor 135, without providing the capacitor 135. In this way, the light-receiving area of the photoelectric conversion element 136 can be increased. Furthermore, the use of an OS transistor as at least one of the transistor 131 and the transistor 132 can decrease flow of an unintended current (also referred to as leakage current or leak current) between the wiring 123 and the wiring 124 (see FIGS. 4A and 4B). Accordingly, power consumption of the imaging device 100 can be reduced. In addition, noise mixed in the wiring 123 and the wiring 124 can be reduced, whereby the quality of images captured by the imaging device 100 can be improved. Furthermore, the imaging device 100 can have high reliability.

The use of OS transistors as the transistors 541, 542, and 543 can miniaturize the capacitors 551 and 552. Alternatively, parasitic capacitance of a transistor or transistors and the like can be used as substitutes for the capacitors 551 and 552, without providing the capacitors 551 and 552. In this way, the light-receiving area of the photoelectric conversion element 136 can be increased. Furthermore, the use of an OS transistor as at least one of the transistor 544 and the transistor 545 can decrease a leak current flowing between the wiring 528 and the wiring 529 (see FIG. 12). Accordingly, power consumption of the imaging device 100 can be reduced. In addition, noise mixed in the wiring 528 and the wiring 529 can be reduced, whereby the quality of images captured by the imaging device 100 can be improved. Furthermore, the imaging device 100 can have high reliability.

The use of an OS transistor as the transistor 744 can miniaturize the capacitor 751. Alternatively, parasitic capacitance of a transistor or transistors and the like can be used as a substitute for the capacitor 751, without providing the capacitor 751. In this way, the light-receiving area of the photoelectric conversion element 136 can be increased. The use of OS transistors as the transistors 741 and 745 can reduce noise mixed in the nodes 761 and 762. Furthermore, the use of an OS transistor as at least one of the transistor 742 and the transistor 743 can decrease a leak current flowing between the wiring 722 and the wiring 727 (see FIG. 17). Accordingly, power consumption of the imaging device 100 can be reduced. In addition, noise mixed in the wiring 722 and the wiring 727 can be reduced, whereby the quality of images captured by the imaging device 100 can be improved. Furthermore, the imaging device 100 can have high reliability.

According to one embodiment of the present invention, an imaging device or a semiconductor device with high detection sensitivity can be provided. Further, according to one embodiment of the present invention, an imaging device or a semiconductor device with a wide dynamic range can be provided.

Furthermore, since an oxide semiconductor has a wide bandgap, a semiconductor device including an oxide semiconductor can be used in a wide range of ambient temperature. With one embodiment of the present invention, an imaging device or a semiconductor device with a wide temperature range can be provided.

Note that the above-described three-layer structure is an example. For example, a two-layer structure without either one of the semiconductor layer 242a and the semiconductor layer 242c may be employed.

[Oxide Semiconductor]

Here, an oxide semiconductor film applicable to the semiconductor layer 242 will be described in detail.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film will be described.

The CAAC-OS film is one of oxide semiconductor films having a plurality of c-axis aligned crystal parts.

With a transmission electron microscope (TEM), a combined analysis image (also referred to as a high-resolution TEM image) of a bright-field image and a diffraction pattern of the CAAC-OS film is observed. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer has a form reflecting unevenness of a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

According to the high-resolution plan-view TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle ($2\theta$) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an $InGaZnO_4$ crystal is analyzed by an out-of-plane method, a peak of $2\theta$ may also be observed at around 36°, in addition to the peak of $2\theta$ at around 31°. The peak of $2\theta$ at around 36° indicates that a crystal having no c-axis alignment is included in part of the CAAC-OS film. It is preferable that in the CAAC-OS film, a peak of $2\theta$ appear at around 31° and a peak of $2\theta$ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film will be described.

A microcrystalline oxide semiconductor film has a region where a crystal part is observed in a high resolution TEM image and a region where a crystal part is not clearly observed in a high resolution TEM image. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a high resolution TEM image of the nc-OS film, a grain boundary cannot be found clearly in the nc-OS film sometimes for example.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. A diffraction pattern like a halo pattern appears in a selected-area electron diffraction pattern of the nc-OS film obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots is shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. Note that there is no regularity of crystal orientation between different crystal parts in the nc-OS film; hence, the nc-OS film has a higher density of defect states than the CAAC-OS film.

Next, an amorphous oxide semiconductor film will be described.

The amorphous oxide semiconductor film has disordered atomic arrangement and no crystal part. For example, the amorphous oxide semiconductor film does not have a specific state as in quartz.

In the high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Further, a halo pattern is shown but a spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be seen. Furthermore, in the high-resolution TEM image, there are a region where a crystal part is clearly observed and a region where a crystal part is not observed. In the a-like OS film, crystallization by a slight amount of electron beam used for TEM observation occurs and growth of the crystal part is found sometimes. In contrast, crystallization by a slight amount of electron beam used for TEM observation is less observed in the nc-OS film having good quality.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers including three In—O layers and six Ga—Zn—O layers are layered in the c-axis direction. Accordingly, the spacing between these adjacent layers is equivalent to the lattice spacing on the (009) plane (also referred to as d value). The value is calculated to 0.29 nm from crystal structure analysis. Thus, focusing on lattice fringes in the high-resolution TEM image, each of lattice fringes in which the lattice spacing therebetween is greater than or equal to 0.28 nm and less than or equal to 0.30 nm corresponds to the a-b plane of the $InGaZnO_4$ crystal.

The density of an oxide semiconductor film might vary depending on its structure. For example, if the composition of an oxide semiconductor film is determined, the structure of the oxide semiconductor film can be estimated from a comparison between the density of the oxide semiconductor film and the density of a single crystal oxide semiconductor film having the same composition as the oxide semiconductor film. For example, the density of the a-like OS film is higher than or equal to 78.6% and lower than 92.3% of the density of the single crystal oxide semiconductor having the same composition. For example, the density of each of the nc-OS film and the CAAC-OS film is higher than or equal to 92.3% and lower than 100% of the density of the single crystal oxide semiconductor having the same composition. Note that it is difficult to deposit an oxide semiconductor film whose density is lower than 78% of the density of the single crystal oxide semiconductor film.

Specific examples of the above description will be given below. For example, for an oxide semiconductor film with an atomic ratio of In:Ga:Zn=1:1:1, the density of single-crystal $InGaZnO_4$ with a rhombohedral crystal structure is 6.357 $g/cm^3$. Thus, for example, for the oxide semiconductor film with an atomic ratio of In:Ga:Zn=1:1:1, the density of an a-like OS film is higher than or equal to 5.0 $g/cm^3$ and lower than 5.9 $g/cm^3$. In addition, for example, for the oxide semiconductor film with an atomic ratio of In:Ga:Zn=1:1:1, the density of an nc-OS film or a CAAC-OS film is higher than or equal to 5.9 $g/cm^3$ and lower than 6.3 $g/cm^3$.

Note that single crystals with the same composition do not exist in some cases. In such a case, by combining single crystals with different compositions at a given proportion, it is possible to calculate density that corresponds to the density of a single crystal with a desired composition. The density of the single crystal with a desired composition may be calculated using weighted average with respect to the combination ratio of the single crystals with different compositions. Note that it is preferable to combine as few kinds of single crystals as possible for density calculation.

Note that an oxide semiconductor film may be a stacked film including two or more films of an amorphous oxide semiconductor film, an a-like OS film, a microcrystalline oxide semiconductor film, and a CAAC-OS film, for example.

Even when the oxide semiconductor film is a CAAC-OS film, a diffraction pattern similar to that of an nc-OS film or the like is partly observed in some cases. Therefore, whether or not a CAAC-OS film is favorable can be determined by the proportion of a region where a diffraction pattern of a CAAC-OS film is observed in a predetermined area (also referred to as proportion of CAAC). For a high quality CAAC-OS film, for example, the proportion of CAAC is higher than or equal to 50%, preferably higher than or equal to 80%, more preferably higher than or equal to 90%, still more preferably higher than or equal to 95%. Note that the proportion of a region where a diffraction pattern different from that of a CAAC-OS film is observed is referred to as the proportion of non-CAAC.

As an example of an oxide semiconductor that can be used for the semiconductor layer $242a$, the semiconductor layer $242b$, and the semiconductor layer $242c$, an oxide containing indium can be given. An oxide can have a high carrier mobility (electron mobility) by containing indium, for example. An oxide semiconductor preferably contains an element M. The element M is preferably aluminum, gallium, yttrium, tin, or the like. Other elements which can be used as the element M are boron, silicon, titanium, iron, nickel, germanium, yttrium, zirconium, molybdenum, lanthanum, cerium, neodymium, hafnium, tantalum, tungsten, magnesium, and the like. Note that two or more of the above elements may be used in combination as the element M. The element M is an element having a high bonding energy with oxygen, for example. The element M is an element that can increase the energy gap of the oxide, for example. Further, the oxide semiconductor preferably contains zinc. When the oxide contains zinc, the oxide is easily to be crystallized, for example.

Note that the oxide semiconductor is not limited to the oxide containing indium. The oxide semiconductor may be, for example, zinc tin oxide, gallium tin oxide, or gallium oxide.

For the oxide semiconductor, an oxide with a wide energy gap is used. For example, the energy gap of the oxide semiconductor is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

Influence of impurities in the oxide semiconductor will be described below. In order to obtain stable electrical characteristics of a transistor, it is effective to reduce the concentration of impurities in the oxide semiconductor to have lower carrier density so that the oxide semiconductor is highly purified. The carrier density of the oxide semiconductor is set to be lower than $1\times10^{17}/cm^3$, lower than $1\times10^{15}/cm^3$, or lower than $1\times10^{13}/cm^3$. In order to reduce the concentration of impurities in the oxide semiconductor, the concentration of impurities in a film which is adjacent to the oxide semiconductor is preferably reduced.

For example, silicon in the oxide semiconductor might serve as a carrier trap or a carrier generation source. The silicon concentration in the oxide semiconductor measured by secondary ion mass spectrometry (SIMS) is lower than $1\times10^{19}$ atoms/cm$^3$, preferably lower than $5\times10^{18}$ atoms/cm$^3$, more preferably lower than $2\times10^{18}$ atoms/cm$^3$.

Furthermore, when hydrogen is contained in the oxide semiconductor, the carrier density is increased in some cases. Thus, the concentration of hydrogen in the oxide semiconductor, which is measured by SIMS, can be set to lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. When nitrogen is contained in the oxide semiconductor, the carrier density is increased in some cases. The concentration of nitrogen in the oxide semiconductor measured by SIMS is set to be lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

In order to reduce the hydrogen concentration in the oxide semiconductor, the hydrogen concentrations in the insulating layer 109 and the insulating layer 117 that are in contact with the semiconductor layer 242 are preferably reduced. The hydrogen concentration in the insulating layer 109 and the insulating layer 117 measured by SIMS is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. In order to reduce the nitrogen concentration in the oxide semiconductor, the nitrogen concentrations in the insulating layer 109 and the insulating layer 117 are preferably reduced. The nitrogen concentration in the insulating layer 109 and the insulating layer 117 measured by SIMS is lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

In this embodiment, first, the semiconductor layer $242a$ is formed over the insulating layer 109, and the semiconductor layer $242b$ is formed over the semiconductor layer $242a$.

A sputtering method is preferably used for formation of the oxide semiconductor layers. As a sputtering method, an RF sputtering method, a DC sputtering method, an AC sputtering method, or the like can be used. A DC sputtering method or an AC sputtering method can achieve uniform deposition as compared to an RF sputtering method.

In this embodiment, as the semiconductor layer $242a$, 20-nm-thick In—Ga—Zn oxide is deposited by a sputtering method using an In—Ga—Zn oxide target (In:Ga:Zn=1:3:2). Note that the constituent elements and compositions applicable to the semiconductor layer $242a$ are not limited thereto.

The oxygen doping treatment may be performed after the formation of the semiconductor layer $242a$.

Next, the semiconductor layer $242b$ is formed over the semiconductor layer $242a$. In this embodiment, as the semiconductor layer $242b$, 30-nm-thick In—Ga—Zn oxide is deposited by a sputtering method using an In—Ga—Zn oxide target (In:Ga:Zn=1:1:1). Note that the constituent elements and compositions applicable to the semiconductor layer $242b$ are not limited thereto.

The oxygen doping treatment may be performed after the formation of the semiconductor layer $242b$.

Next, heat treatment may be performed to further reduce the impurities such as moisture or hydrogen contained in the semiconductor layer $242a$ and the semiconductor layer $242b$, so that the semiconductor layer $242a$ and the semiconductor layer $242b$ are highly purified.

For example, the semiconductor layer $242a$ and the semiconductor layer $242b$ are subjected to heat treatment in a reduced-pressure atmosphere, an inert gas atmosphere of nitrogen, a rare gas, or the like, an oxidation atmosphere, or an ultra dry air atmosphere (the moisture amount is 20 ppm (−55° C. by conversion into a dew point) or less, preferably 1 ppm or less, more preferably 10 ppb or less, in the case where the measurement is performed by a dew point meter in a cavity ring down laser spectroscopy (CRDS) system). Note that the oxidation atmosphere refers to an atmosphere including an oxidation gas such as oxygen, ozone, or nitrogen oxide at 10 ppm or higher. The inert gas atmosphere refers to an atmosphere including the oxidation gas at lower than 10 ppm and is filled with nitrogen or a rare gas.

By heat treatment, oxygen included in the insulating layer 109 can be diffused into the semiconductor layer 242a and the semiconductor layer 242b, concurrently with the release of impurities, so that oxygen vacancies in the semiconductor layer 242a and the semiconductor layer 242b can be reduced. Note that the heat treatment may be performed in such a manner that heat treatment is performed in an inert gas atmosphere, and then another heat treatment is performed in an atmosphere containing an oxidizing gas at 10 ppm or more, 1% or more, or 10% or more. The heat treatment may be performed at any time after the semiconductor layer 242b is formed. For example, the heat treatment may be performed after the semiconductor layer 242b is selectively etched.

The heat treatment can be performed at a temperature higher than or equal to 250° C. and lower than or equal to 650° C., preferably higher than or equal to 300° C. and lower than or equal to 500° C. The treatment time is shorter than or equal to 24 hours. Heat treatment for over 24 hours is not preferable because the productivity is reduced.

Next, a resist mask is formed over the semiconductor layer 242b, and with use of the resist mask, part of the semiconductor layer 242a and part of the semiconductor layer 242b are etched selectively. At this time, the insulating layer 109 might be partly etched, thereby having a projection.

Either of a dry etching method or a wet etching method may be used for etching of the semiconductor layer 242a and the semiconductor layer 242b, or both of them may be used. After the etching, the resist mask is removed.

In the transistor 134, the electrode 244 and the electrode 245 that are in contact with part of the semiconductor layer 242b are provided over the semiconductor layer 242b. The electrode 244 and the electrode 245 (including another electrode or wiring that is formed in the same layer as these electrodes) can be formed using a material and a method similar to those of the wiring 121.

In addition, the transistor 134 includes the semiconductor layer 242c over the semiconductor layer 242b, the electrode 244, and the electrode 245. The semiconductor layer 242c is partly in contact with each of the semiconductor layer 242b, the electrode 244, and the electrode 245.

In this embodiment, the semiconductor layer 242c is formed by a sputtering method using an In—Ga—Zn oxide target (In:Ga:Zn=1:3:2). Note that the constituent elements and compositions applicable to the semiconductor layer 242c are not limited thereto. For example, oxide gallium may be used for the semiconductor layer 242c. Furthermore, oxygen doping treatment may be performed on the semiconductor layer 242c.

Furthermore, in the transistor 134, the insulating layer 117 is provided over the semiconductor layer 242c. The insulating layer 117 can function as a gate insulating layer. The insulating layer 117 can be formed using a material and a method similar to those of the insulating layer 102. The oxygen doping treatment may be performed on the insulating layer 117.

After the semiconductor layer 242c and the insulating layer 117 are formed, a mask is formed over the insulating layer 117, and parts of the semiconductor layer 242c and the insulating layer 117 are selectively etched, so that the semiconductor layer 242c and the insulating layer 117 may be formed into island shapes.

Moreover in the transistor 134, the electrode 243 is provided over the insulating layer 117. The electrode 243 (including another electrode or wiring that is formed in the same layer as this electrode) can be formed using a material and a method similar to those of the wiring 121.

In this embodiment, an example in which the electrode 243 has a stacked-layer structure including an electrode 243a and an electrode 243b is shown. For example, the electrode 243a is formed using tantalum nitride, and the electrode 243b is formed using copper. The electrode 243a functions as a barrier layer to prevent copper diffusion. Thus, a semiconductor device with high reliability can be obtained.

Moreover, the transistor 134 includes an insulating layer 118 covering the electrode 243. The insulating layer 118 can be formed using a material and a method similar to those of the insulating layer 102. The insulating layer 118 may be subjected to oxygen doping treatment. Furthermore, a surface of the insulating layer 118 may be subjected to CMP treatment.

In addition, an insulating layer 119 is formed over the insulating layer 118. The insulating layer 119 can be formed using a material and a method that are similar to those of the insulating layer 105. A surface of the insulating layer 119 may be subjected to CMP treatment. By the CMP treatment, unevenness of the surface can be reduced, and coverage with an insulating layer or a conductive layer formed later can be increased. In addition, an opening is formed in parts of the insulating layer 119 and the insulating layer 118. A contact plug is formed in the opening.

A wiring 127 and a wiring 144 (including another electrode or wiring that is formed in the same layer as these wirings) are formed over the insulating layer 119. The wiring 144 is electrically connected to the electrode 273 via the contact plug in the opening provided through the insulating layer 119 and the insulating layer 118. The wiring 127 is electrically connected to the electrode 243 via the contact plug in the opening provided through the insulating layer 119 and the insulating layer 118.

The imaging device 100 includes an insulating layer 115 to cover the wiring 127 and the wiring 144 (including another electrode or wiring formed in the same layer as these wirings). The insulating layer 115 can be formed using a material and a method similar to those of the insulating layer 105. A surface of the insulating layer 115 may be subjected to CMP treatment. By the CMP treatment, unevenness of the surface can be reduced, and coverage with an insulating layer or a conductive layer formed later can be increased. In addition, an opening is formed in part of the insulating layer 115.

Further, the wiring 122, the wiring 123, and the wiring 266 (including another electrode or wiring that is formed in the same layer as these wirings) are formed over the insulating layer 115.

Each of the wiring 122, the wiring 123, and the wiring 266 (including another electrode or wiring formed in the same layer as these wirings) can be electrically connected to another wiring or another electrode via a contact plug in an opening formed through the insulating layer.

Further, an insulating layer 116 is provided to cover the wiring 122, the wiring 123, and the wiring 266. The insulating layer 116 can be formed using a material and a method similar to those of the insulating layer 105. A surface of the insulating layer 116 may be subjected to CMP treatment.

FIG. 24A is an enlarged cross-sectional view of the transistor 281 illustrated in FIG. 21 as an example of a transistor included in a peripheral circuit. FIG. 24B is an enlarged cross-sectional view of the transistor 282 illustrated in FIG. 21. In this embodiment, the transistor 281 is a p-channel transistor, and the transistor 282 is an n-channel transistor, for example.

The transistor 281 includes an i-type semiconductor 283 in which a channel is formed, p-type semiconductors 285, an insulating layer 286, an electrode 287, and sidewalls 288. At a region overlapping with the sidewall 288 in the i-type semiconductor 283, low-concentration p-type impurity regions 284 are provided.

The i-type semiconductor 283 included in the transistor 281 can be formed in a step of forming the i-type semiconductor 222 in the photoelectric conversion element 136 at the same time. The p-type semiconductor 285 included in the transistor 281 can be formed in a step of forming the p-type semiconductor 221 in the photoelectric conversion element 136 at the same time.

The insulating layer 286 can function as a gate insulating layer. The electrode 287 can function as a gate electrode. The low-concentration p-type impurity regions 284 can be formed in such a manner that an impurity element is added with the use of the electrode 287 as a mask after formation of the electrode 287 and before the formation of the sidewalls 288. In other words, the low-concentration p-type impurity regions 284 can be formed in a self-aligned manner. The low-concentration p-type impurity regions 284 have the same conductivity type as that of the p-type semiconductor 285, and lower concentration of impurities imparting conductivity type than the p-type semiconductor 285.

The transistor 282 has a structure similar to that of the transistor 281; however, there is a difference in that low-concentration n-type impurity regions 294 and an n-type semiconductor 295 are provided, instead of the low-concentration p-type impurity regions 284 and the p-type semiconductor 285.

The n-type semiconductor 295 included in the transistor 282 can be formed in a step of forming the n-type semiconductor 223 in the photoelectric conversion element 136 at the same time. As in the case of the transistor 281, the low-concentration n-type impurity regions 294 can be formed in a self-aligned manner. The low-concentration n-type impurity regions 294 have the same conductivity type as that of the n-type semiconductor 295 and lower concentration of impurities imparting the conductivity type than the n-type semiconductor 295.

Although the variety of films such as the metal film, the semiconductor film, the inorganic insulating film which are disclosed in this specification and the like can be formed by a sputtering method or a plasma chemical vapor deposition (CVD) method, such films may be formed by another method, for example, a thermal CVD method. A metal organic chemical vapor deposition (MOCVD) method or an atomic layer deposition (ALD) method, for example, may be employed as a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied at a time to the chamber, in which the pressure is set to an atmospheric pressure or a reduced pressure, and react with each other in the vicinity of the substrate or over the substrate.

Deposition by an ALD method may be performed in such a manner that source gases for reaction are sequentially introduced into the chamber, in which the pressure is set to an atmospheric pressure or a reduced pressure, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute field effect transistor (FET).

The variety of films such as the metal film, the semiconductor film, and the inorganic insulating film which have been disclosed in the embodiment can be formed by a thermal CVD method such as a MOCVD method or an ALD method. For example, for forming an In—Ga—Zn—O film, trimethylindium, trimethylgallium, and dimethylzinc are used. The chemical formula of trimethylindium is $In(CH_3)_3$. The chemical formula of trimethylindium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium, and diethylzinc (chemical formula: $Zn(C_2H_5)_2$) can be used instead of dimethylzinc.

For example, in the case where a hafnium oxide film is formed with a deposition apparatus employing ALD, two kinds of gases, i.e., ozone ($O_3$) as an oxidizer and a source material gas which is obtained by vaporizing liquid containing a solvent and a hafnium precursor compound (hafnium alkoxide or hafnium amide such as tetrakis(dimethylamide) hafnium (TDMAH)) are used. The chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed by a deposition apparatus using an ALD method, two kinds of gases, e.g., $H_2O$ as an oxidizer and a source gas which is obtained by vaporizing liquid containing a solvent and an aluminum precursor compound (e.g., trimethylaluminum (TMA)) are used. The chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed by a deposition apparatus using an ALD method, hexachlorodisilane is adsorbed on a surface where a film is to be formed, chlorine contained in the adsorbate is removed, and radicals of an oxidizing gas (e.g., $O_2$ or dinitrogen monoxide) are supplied to react with the adsorbate.

For example, in the case where a tungsten film is formed using a deposition apparatus employing ALD, a $WF_6$ gas and a $B_2H_6$ gas are sequentially introduced a plurality of times to form an initial tungsten film, and then a $WF_6$ gas and an $H_2$ gas are alternately introduced, so that a tungsten film is formed. Note that an $SiH_4$ gas may be used instead of a $B_2H_6$ gas.

For example, in the case where an oxide semiconductor film, e.g., an In—Ga—Zn—O film is formed using a deposition apparatus employing ALD, an $In(CH_3)_3$ gas and an $O_3$ gas are sequentially introduced a plurality of times to form an In—O layer, a $Ga(CH_3)_3$ gas and an $O_3$ gas are alternately introduced to form a GaO layer, and then a $Zn(CH_3)_2$ gas and an $O_3$ gas are alternately introduced to form a ZnO layer. Note that the order of these layers is not limited to this example. A mixed compound layer such as an In—Ga—O layer, an In—Zn—O layer, or a Ga—Zn—O layer may be formed by using these gases. Note that although an $H_2O$ gas which is obtained by bubbling water with an inert gas such as Ar may be used instead of an $O_3$ gas, it is preferable to use an $O_3$ gas, which does not contain H. Further, instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

This embodiment can be implemented in an appropriate combination with any of the structures described in the other embodiments.

(Embodiment 5)

The peripheral circuit and the pixel circuit can be provided with, as appropriate, a logic circuit such as an OR circuit, an AND circuit, a NAND circuit, and a NOR circuit, an inverter circuit, a buffer circuit, a shift register circuit, a flip-flop circuit, an encoder circuit, a decoder circuit, an amplifier circuit, an analog switch circuit, an integrator circuit, a differentiation circuit, a memory element, and the like.

In this embodiment, an example of a CMOS circuit that can be used for the peripheral circuit and the pixel circuit, or the like will be described with reference to FIGS. 25A to 25E. In the circuit diagrams in FIGS. 25A to 25E, the indication of "OS" is given beside a transistor in order to clearly demonstrate that the transistor includes an oxide semiconductor.

Figure 25A:
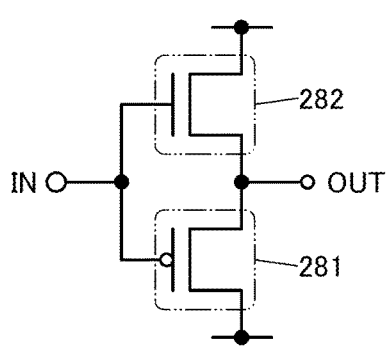
FIGS. 25A to 25E each illustrate an example of a circuit configuration.

The CMOS circuit shown in FIG. 25A has a configuration of what is called an inverter circuit in which the p-channel transistor 281 and the n-channel transistor 282 are connected in series and in which gates of the transistors are connected to each other.

Figure 25B:
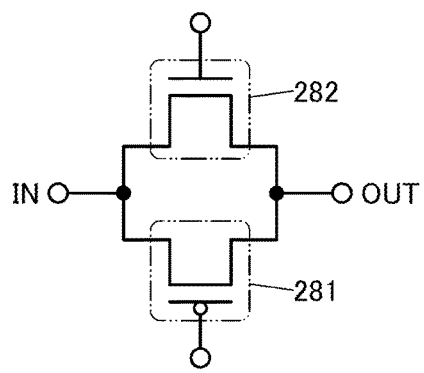

The CMOS circuit shown in FIG. 25B has a configuration of what is called an analog switch circuit in which the p-channel transistor 281 and the n-channel transistor 282 are connected in parallel.

Figure 25C:
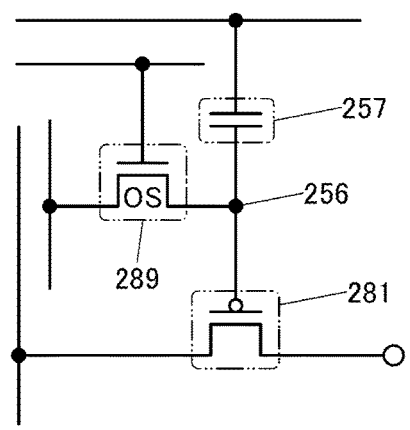

The circuit shown in FIG. 25C has a configuration of what is called a memory element in which one of a source and a drain of the n-channel transistor 289 is connected to a gate of the p-channel transistor 281 and one electrode of a capacitor 257. The circuit shown in FIG. 25D has a configuration of what is called a memory element in which one of a source and a drain of the n-channel transistor 289 is connected to one electrode of the capacitor 257.

Figure 25D:
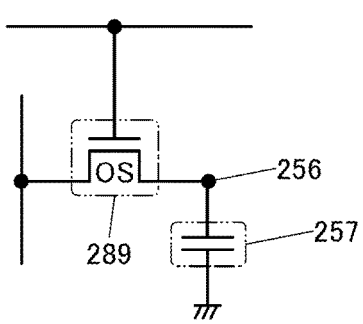

In each of the circuits shown in FIGS. 25C and 25D, charge injected from the other of the source and the drain of the transistor 289 can be stored in a node 256. The transistor 289 is a transistor including an oxide semiconductor, which enables charge to be stored in the node 256 for a long period. The transistor 281 may also be a transistor including an oxide semiconductor in a semiconductor layer in which a channel is formed.

Figure 25E:
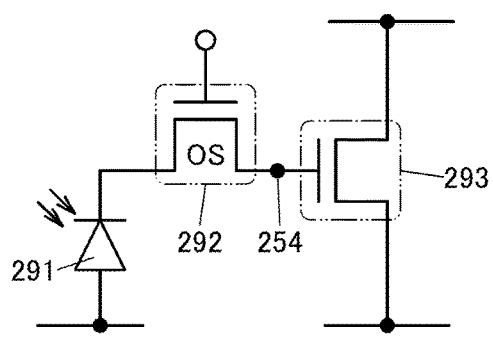

The circuit shown in FIG. 25E has a configuration of an optical sensor. In FIG. 25E, one of a source and a drain of a transistor 292 using an oxide semiconductor for a semiconductor layer in which a channel is formed is electrically connected to a photodiode 291, and the other of the source and the drain of the transistor 292 is electrically connected to a gate of a transistor 293 through a node 254. The transistor 292 using an oxide semiconductor for a semiconductor layer in which a channel is formed has the extremely small amount of off-state current; thus, the potential of the node 254 that is determined depending on the amount of received light hardly changes. Thus, an imaging device which is less likely to be affected by noise can be provided.

Figure 26A:
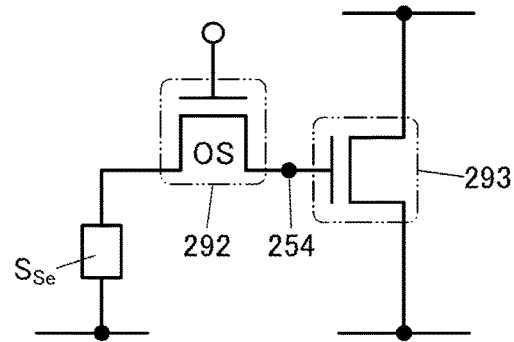
FIGS. 26A to 26C illustrate examples of an optical sensor.

As an example, a circuit diagram in which the photodiode 291 in the optical sensor shown in FIG. 25E is a selenium-based semiconductor element $S_{Se}$ is shown in FIG. 26A.

The selenium-based semiconductor element $S_{Se}$ is an element which is capable of conducting photoelectric conversion utilizing a phenomenon called avalanche multiplication, in which a plurality of electrons can be taken from one incident phonon by application of voltage. Therefore, in the optical sensor including the selenium-based semiconductor element $S_{Se}$, the amount of taken electrons is large as compared to the amount of incident light; therefore, a highly sensitive sensor can be obtained.

For the selenium-based semiconductor element $S_{Se}$, a selenium-based semiconductor including an amorphous structure or a selenium-based semiconductor including a crystalline structure can be used. For example, the selenium-based semiconductor including a crystalline structure may be obtained in such a manner that a selenium-based semiconductor including an amorphous structure is deposited and subjected to heat treatment. Note that it is preferable that the crystal grain diameter of the selenium-based semiconductor including a crystalline structure be smaller than a pixel pitch because variation in characteristics of the pixels is reduced and the image quality of an image to be obtained becomes uniform.

A selenium-based semiconductor including a crystalline structure among the selenium-based semiconductor elements $S_{Se}$ has a characteristic of having a light absorption coefficient in a wide wavelength range. Therefore, the selenium-based semiconductor including a crystalline structure can be used as an imaging element for light in a wide wavelength range, such as visible light, ultraviolet light, X-rays, and gamma rays, and can be used as what is called a direct conversion element, which is capable of directly converting light in a short wavelength range, such as X-rays and gamma rays, into charge.

Figure 26B:
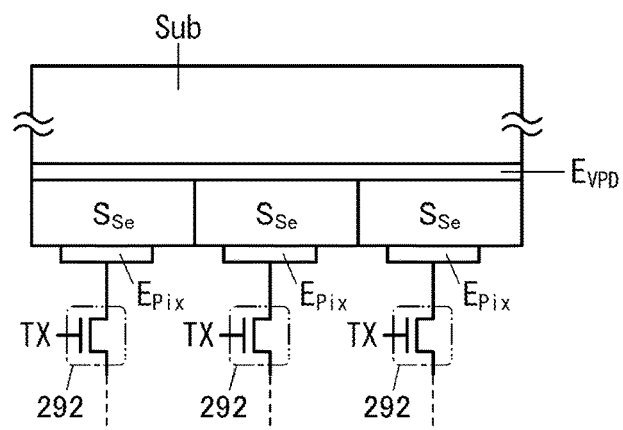

FIG. 26B is a cross-sectional schematic view corresponding to part of the circuit configuration of FIG. 26A. FIG. 26B illustrates the transistors 292, electrodes $E_{Pix}$ connected to the transistors 292, the selenium-based semiconductor elements $S_{Se}$, an electrode $E_{VPD}$, and a substrate Sub.

Light is emitted from the side where the electrode $E_{VPD}$ and the substrate Sub are formed toward the selenium-based semiconductor elements $S_{Se}$. Therefore, the electrode $E_{VPD}$ and the substrate Sub preferably transmit light. Indium tin oxide can be used for the electrode $E_{VPD}$, and a glass substrate can be used as the substrate Sub.

The selenium-based semiconductor elements $S_{Se}$ and the electrodes $E_{VPD}$ stacked over the selenium-based semiconductor elements $S_{Se}$ can be used without being processed in their shapes in accordance with each pixel. A step for processing the shape can be omitted, leading to a reduction in the manufacturing cost and improvement in the manufacturing yield.

For example, a chalcopyrite-based semiconductor can be used for the selenium-based semiconductor element $S_{Se}$. Specifically, $CuIn_{1-x}Ga_xSe_2$ (0≤x≤1, abbreviated to CIGS) can be used, for example. CIGS can be formed by an evaporation method, a sputtering method, or the like.

The selenium-based semiconductor element $S_{Se}$ formed using a chalcopyrite-based semiconductor can perform avalanche multiplication by being applied with a voltage of several volts (from 5 V to 20 V). By application of voltage to the selenium-based semiconductor element $S_{Se}$, the movement of signal charge generated owing to light irradiation can have high linearity. Note that when the thickness of the selenium-based semiconductor element $S_{Se}$ is smaller than or equal to 1 µm, the application voltage can be made smaller.

Note that in the case where the thickness of the selenium-based semiconductor element $S_{Se}$ is small, dark current flows at the time of application of voltage; however, providing a layer for inhibiting dark current from flowing in the CIGS that is a chalcopyrite-based semiconductor (hole-injection barrier layer) can prevent the dark current from flowing. An oxide semiconductor such as gallium oxide can be used for the hole-injection barrier layer. The thickness of the hole-injection barrier layer is preferably smaller than that of the selenium-based semiconductor element $S_{Se}$.

Figure 26C:
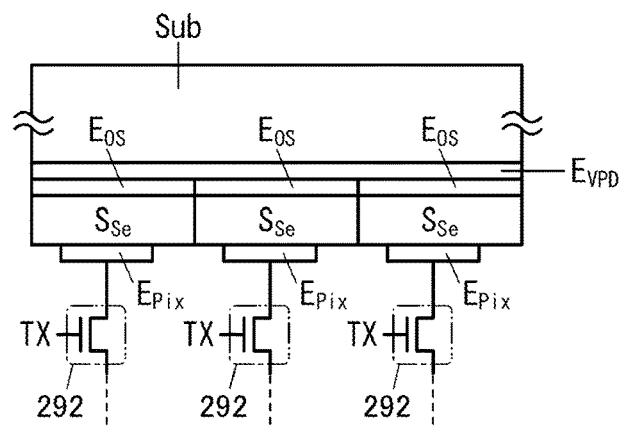

FIG. 26C is a schematic cross-sectional view different from that of FIG. 26B. FIG. 26C shows hole-injection barrier layers $E_{OS}$ together with the transistors 292, the electrodes $E_{Pix}$ connected to the transistors 292, the selenium-based semiconductor elements $S_{Se}$, the electrode $E_{VPD}$, and the substrate Sub.

As described above, the use of the selenium-based semiconductor element $S_{Se}$ as a sensor can reduce the manufacturing cost and characteristic variation among pixels and improve the manufacturing yield; as a result, a highly sensitive sensor can be obtained. Thus, an imaging device with which highly accurate imaging data can be obtained can be provided.

Note that the selenium-based semiconductor element $S_{Se}$ described in this embodiment can be used as the photoelectric conversion element described in the other embodiments.

Figure 27:
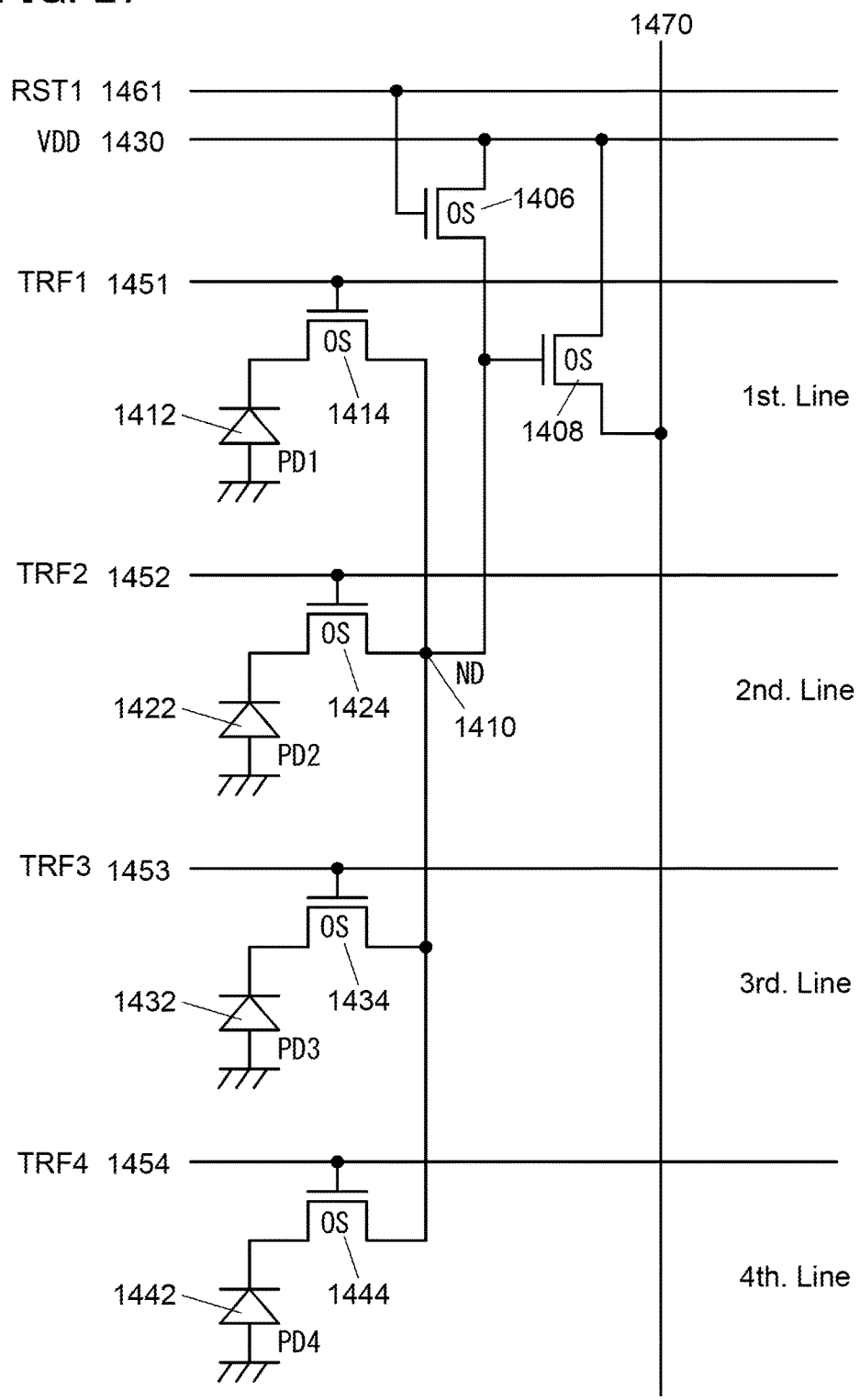
FIG. 27 illustrates an example of a circuit configuration.

FIG. 27 shows an example of a circuit configuration in which one reset transistor, one amplifier transistor, and one reset line are each shared by longitudinally adjacent four optical sensors (pixels) (hereinafter such circuit is referred to as a longitudinal four pixels sharing type circuit). Sharing the transistors and wiring can reduce the number of transistors and wirings, which leads to miniaturization due to reduction in the occupied area per pixel or decrease in noise due to increase in the light-receiving area of a photodiode.

In FIG. 27, a gate of a transistor 1414 is electrically connected to a wiring 1451 (TRF1), a gate of a transistor 1424 is electrically connected to a wiring 1452 (TRF2), a gate of a transistor 1434 is electrically connected to a wiring 1453 (TRF3), and a gate of a transistor 1444 is electrically connected to a wiring 1454 (TRF4). One of a source and a drain of the transistor 1414 is electrically connected to a photodiode 1412 (PD1), one of a source and a drain of the transistor 1424 is electrically connected to a photodiode 1422 (PD2), one of a source and a drain of the transistor 1434 is electrically connected to a photodiode 1432 (PD3), and one of a source and a drain of the transistor 1444 is electrically connected to a photodiode 1442 (PD4). The other of the source and the drain of each of the transistor 1414, the transistor 1424, the transistor 1434, and the transistor 1444 is electrically connected to a node 1410 (ND).

One of a source and a drain of a transistor 1406 and a gate of a transistor 1408 are electrically connected to the node 1410. A gate of the transistor 1406 is electrically connected to a wiring 1461 (RST1). The other of the source and the drain of the transistor 1406 and one of a source and a drain of the transistor 1408 are electrically connected to a wiring 1430 (VDD). The other of the source and the drain of the transistor 1408 is electrically connected to a wiring 1470.

Figure 28:
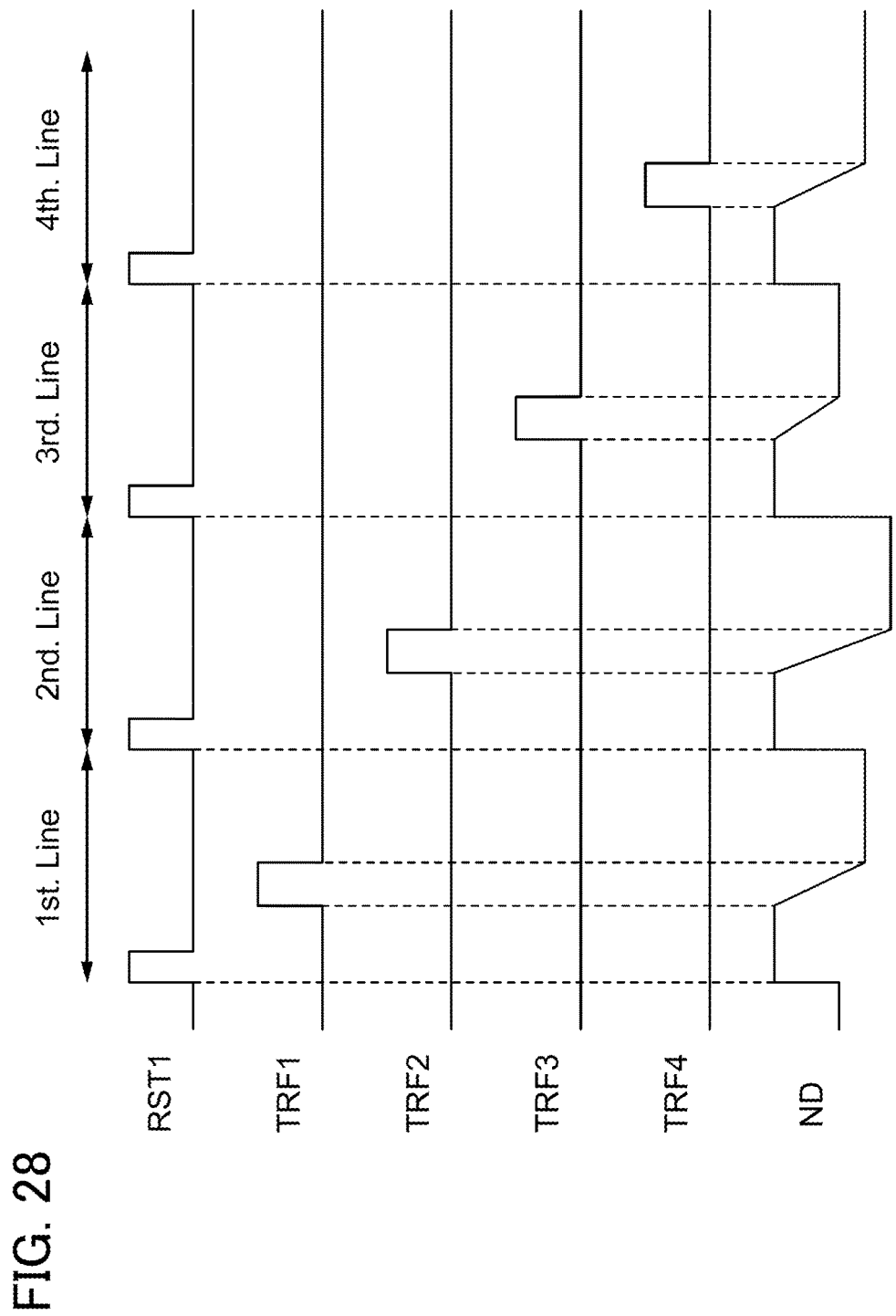
FIG. 28 illustrates an example of circuit operation.

Next, an operation example of the longitudinal four pixels sharing type circuit illustrated in FIG. 27 will be described with reference to a timing chart of FIG. 28. In driving of the first line, first, a potential that turns on the transistor 1406 (e.g., an H potential) is supplied to the wiring 1461 (RST1), whereby the transistor 1406 is turned on. Then, the potential of the node 1410 becomes VDD.

Subsequently, a potential that turns off the transistor 1406 (e.g., an L potential) is supplied to the wiring 1461, whereby the transistor 1406 is turned off. At this time, in the case where the node 1410 has no other current path, the potential of the node 1410 is held at VDD.

Subsequently, a potential that turns on the transistor 1414 (e.g., the H potential) is supplied to the wiring 1451 (TRF1), whereby the transistor 1414 is turned on. At this time, when the photodiode 1412 (PD1) receives light, a current corresponding to the amount of received light flows through the photodiode 1412 and the transistor 1414, and the potential of the node 1410 is lowered. Subsequently, a potential that turns off the transistor 1414 (e.g., the L potential) is supplied to the wiring 1451 (TRF1), and when the transistor 1414 is turned off, the potential of the node 1410 is held. The potential of the node 1410 at this time is output to the wiring 1470 via the transistor 1408.

In driving of the second line, first, the potential that turns on the transistor 1406 is supplied again to the wiring 1461, whereby the transistor 1406 is turned on. Then, the potential of the node 1410 becomes VDD. Subsequently, the potential that turns off the transistor 1406 is supplied to the wiring 1461, whereby the transistor 1406 is turned off.

Subsequently, a potential that turns on the transistor 1424 is supplied to the wiring 1452 (TRF2), whereby the transistor 1424 is turned on. At this time, when the photodiode 1422 (PD2) receives light, a current corresponding to the amount of received light flows through the photodiode 1422 and the transistor 1424, and the potential of the node 1410 is lowered. Subsequently, a potential that turns off the transistor 1424 (e.g., the L potential) is supplied to the wiring 1452 (TRF2), and when the transistor 1424 is turned off, the potential of the node 1410 is held. The potential of the node 1410 at this time is output to the wiring 1470 via the transistor 1408.

In driving of the third line, first, the potential that turns on the transistor 1406 is supplied again to the wiring 1461, whereby the transistor 1406 is turned on. Then, the potential of the node 1410 becomes VDD. Subsequently, the potential that turns off the transistor 1406 is supplied to the wiring 1461, whereby the transistor 1406 is turned off.

Subsequently, a potential that turns on the transistor 1434 is supplied to the wiring 1453 (TRF3), whereby the transistor 1434 is turned on. At this time, when the photodiode 1432 (PD3) receives light, a current corresponding to the amount of received light flows through the photodiode 1432 and the transistor 1434, and the potential of the node 1410 is lowered. Subsequently, a potential that turns off the transistor 1434 (e.g., the L potential) is supplied to the wiring 1453 (TRF3), and when the transistor 1434 is turned off, the potential of the node 1410 is held. The potential of the node 1410 at this time is output to the wiring 1470 via the transistor 1408.

In driving of the fourth line, first, the potential that turns on the transistor 1406 is supplied again to the wiring 1461, whereby the transistor 1406 is turned on. Then, the potential of the node 1410 becomes VDD. Subsequently, the potential that turns off the transistor 1406 is supplied to the wiring 1461, whereby the transistor 1406 is turned off.

Subsequently, a potential that turns on the transistor 1444 is supplied to the wiring 1454 (TRF4), whereby the transistor 1444 is turned on. At this time, when the photodiode 1442 (PD4) receives light, a current corresponding to the amount of received light flows through the photodiode 1442 and the transistor 1444, and the potential of the node 1410 is lowered. Subsequently, a potential that turns off the transistor 1444 (e.g., the L potential) is supplied to the wiring 1454 (TRF4), and when the transistor 1444 is turned off, the potential of the node 1410 is held. The potential of the node 1410 at this time is output to the wiring 1470 via the transistor 1408.

In the above-described manner, the longitudinal four pixels sharing type circuit illustrated in FIG. 27 can be operated.

Figure 29A:
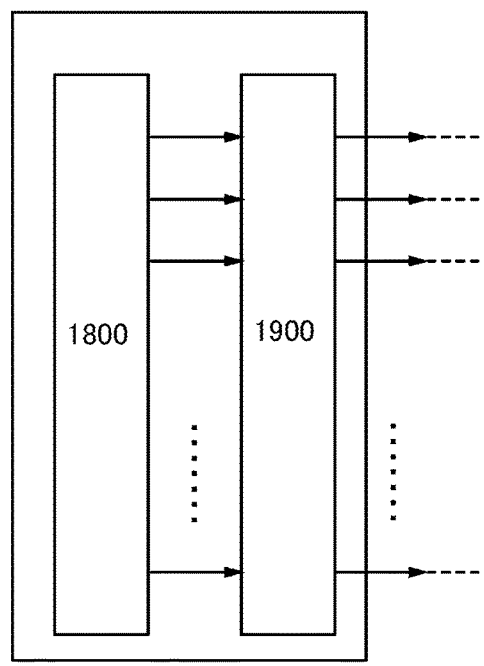
FIGS. 29A and 29B illustrate examples of a circuit configuration.
Figure 29B:
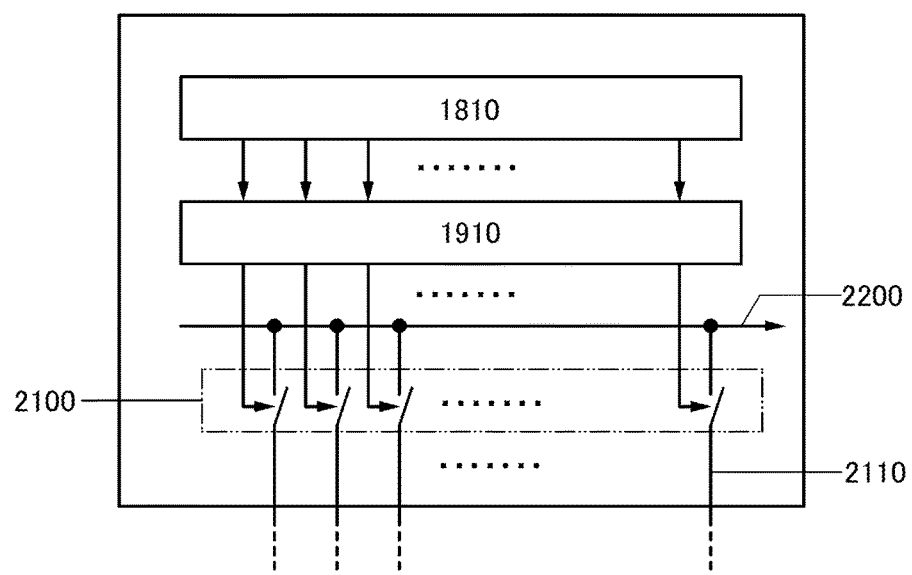

For the peripheral circuit, a circuit in which a shift register circuit 1800 and a buffer circuit 1900 are combined, shown in FIG. 29A, may be provided. Alternatively, for the peripheral circuit, a circuit in which a shift register circuit 1810, a buffer circuit 1910, and an analog switch circuit 2100 are combined, as shown in FIG. 29B, may be provided. Vertical output lines 2110 are selected by the analog switch circuit 2100, and output signals are output to an output line 2200. The analog switch circuit 2100 can be sequentially selected by the shift register circuit 1810 and the buffer circuit 1910.

Figure 30A:
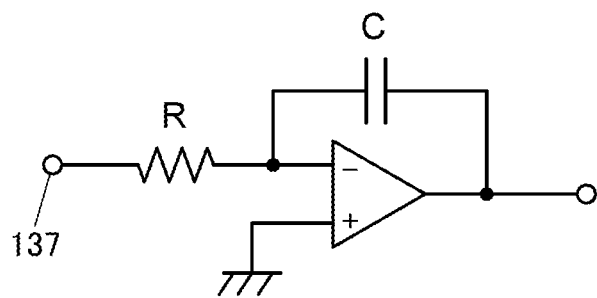
FIGS. 30A to 30C each illustrate an example of a circuit configuration.
Figure 30B:
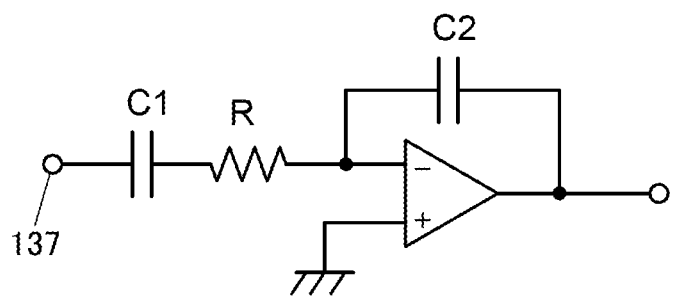
Figure 30C:
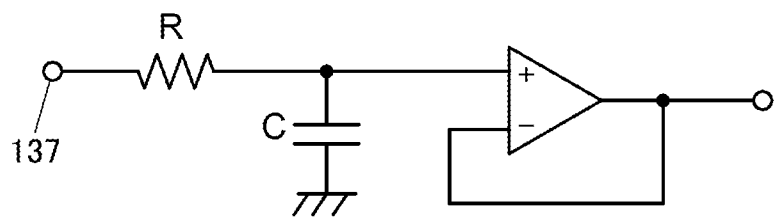

In the circuit diagram shown in the above embodiment, an integrator circuit shown in FIG. 30A, 30B, or 30C may be connected to the wiring 123, the wiring 528, the wiring 722, the wiring 1470 or the like. The circuit enables an S/N ratio of a reading signal (analog signal) to be increased, which makes it possible to sense weaker light. In other words, the sensitivity of the imaging device can be increased.

FIG. 30A illustrates an integrator circuit including an operational amplifier circuit (also referred to as an op-amp). An inverting input terminal of the operational amplifier circuit is connected to an input terminal 137 through a resistor R. A non-inverting input terminal of the operational amplifier circuit is grounded. An output terminal of the operational amplifier circuit is connected to the inverting input terminal of the operational amplifier circuit through a capacitor C.

FIG. 30B illustrates an integrator circuit including an operational amplifier circuit having a configuration different from that in FIG. 30A. An inverting input terminal of the operational amplifier circuit is connected to the input terminal 137 through the resistor R and a capacitor C1. A non-inverting input terminal of the operational amplifier circuit is grounded. An output terminal of the operational amplifier circuit is connected to the inverting input terminal of the operational amplifier circuit through a capacitor C2.

FIG. 30C illustrates an integrator circuit including an operational amplifier circuit having a configuration different from those in FIGS. 30A and 30B. A non-inverting input terminal of the operational amplifier circuit is connected to the input terminal 137 through the resistor R. An output terminal of the operational amplifier circuit is connected to an inverting input terminal of the operational amplifier circuit. The resistor R and the capacitor C constitute a CR integrator circuit. The operational amplifier circuit constitutes a unity gain buffer.

This embodiment can be implemented in an appropriate combination with any of the structures described in the other embodiments.

(Embodiment 6)

Figure 36:
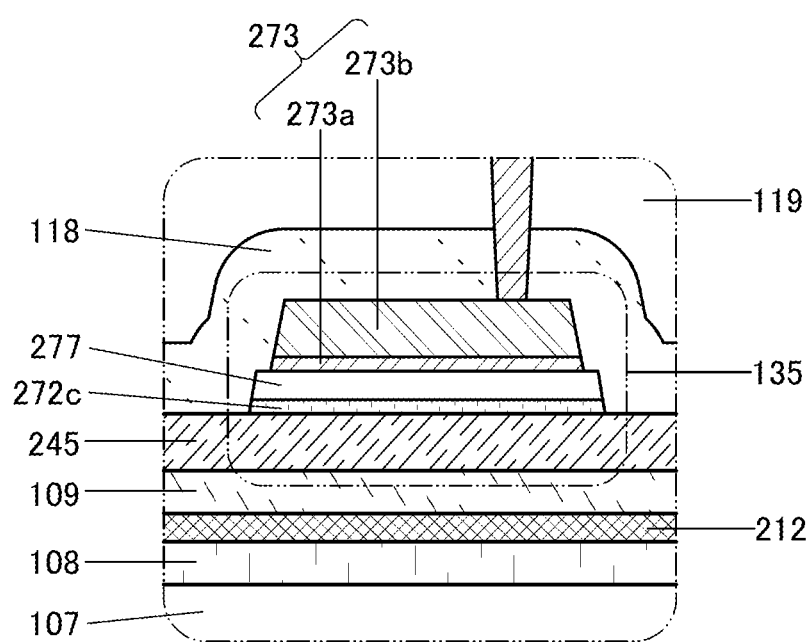
FIG. 36 illustrates one embodiment of a capacitor.

In this embodiment, a structure example of a transistor that can be used in place of the transistor described in the above embodiments will be described with reference to FIGS. 31A1, 31A2, 31B1, and 31B2, FIGS. 32A1, 32A2, 32A3, 32B1, and 32B2, FIGS. 33A to 33C, FIGS. 34A to 34C, and FIGS. 35A to 35C, and a structure example of a node will be described with reference to FIG. 36.

<Bottom-gate Transistor>

A transistor 410 shown in FIG. 31A1 as an example is a channel-protective transistor that is a type of bottom-gate transistor. The transistor 410 includes an electrode 246 that can function as a gate electrode over an insulating layer 109. The transistor 410 includes a semiconductor layer 242 over the electrode 246 with an insulating layer 117 positioned therebetween. The electrode 246 can be formed using a material and a method similar to those of the wiring 121.

The transistor 410 includes an insulating layer 209 that can function as a channel protective layer over a channel formation region in the semiconductor layer 242. The insulating layer 209 can be formed using a material and a method that are similar to those of the insulating layer 117. Part of an electrode 244 and part of an electrode 245 are formed over the insulating layer 209.

With the insulating layer 209 provided over the channel formation region, the semiconductor layer 242 can be prevented from being exposed at the time of forming the electrode 244 and the electrode 245. Thus, the semiconductor layer 242 can be prevented from being reduced in thickness at the time of forming the electrode 244 and the electrode 245. According to one embodiment of the present invention, a transistor with favorable electrical characteristics can be provided.

A transistor 411 illustrated in FIG. 31A2 is different from the transistor 410 in that an electrode 213 that can function as a back gate electrode is provided over an insulating layer 118. The electrode 213 can be formed using a material and a method that are similar to those of the wiring 121.

In general, the back gate electrode is formed using a conductive layer and positioned so that the channel formation region of the semiconductor layer is positioned between the gate electrode and the back gate electrode. Thus, the back gate electrode can function in a manner similar to that of the gate electrode. The potential of the back gate electrode may be the same as that of the gate electrode or may be a GND potential or a predetermined potential. By changing the potential of the back gate electrode independently of the potential of the gate electrode, the threshold voltage of the transistor can be changed.

The electrodes 246 and 213 can both function as gate electrodes. Thus, the insulating layers 117, 209, and 118 can all function as gate insulating layers.

In the case where one of the electrode 246 and the electrode 213 is simply referred to as a "gate electrode", the other can be referred to as a "back gate electrode". For example, in the transistor 411, in the case where the electrode 213 is referred to as a "gate electrode", the electrode 246 may be referred to as a "back gate electrode". In the case where the electrode 213 is used as a "gate electrode", the transistor 411 can be considered as a kind of top-gate transistor. Furthermore, one of the electrode 246 and the electrode 213 may be referred to as a "first gate electrode", and the other may be referred to as a "second gate electrode".

By providing the electrode 246 and the electrode 213 with the semiconductor layer 242 positioned therebetween and setting the potentials of the electrode 246 and the electrode 213 to be the same, a region of the semiconductor layer 242 through which carriers flow is enlarged in the film thickness direction; thus, the number of transferred carriers is increased. As a result, the on-state current and the field-effect mobility of the transistor 411 are increased.

Therefore, the transistor 411 has large on-state current for the area occupied thereby. That is, the area occupied by the transistor 411 can be small for required on-state current. With one embodiment of the present invention, the area occupied by a transistor can be reduced. Therefore, with one embodiment of the present invention, a semiconductor device having a high degree of integration can be provided.

Furthermore, the gate electrode and the back gate electrode are formed using conductive layers and thus each have a function of preventing an electric field generated outside the transistor from influencing the semiconductor layer in which the channel is formed (in particular, an electric field blocking function against static electricity and the like). When the back gate electrode is formed larger than the semiconductor layer such that the semiconductor layer is covered with the back gate electrode, the electric field blocking function can be enhanced.

Since the electrode 246 and the electrode 213 each have a function of blocking an electric field generated outside, charges of charged particles and the like generated on the insulating layer 109 side or above the electrode 213 do not influence the channel formation region in the semiconductor layer 242. Therefore, degradation in a stress test (e.g., a negative gate bias temperature (−GBT) stress test in which negative charges are applied to a gate) can be reduced, and changes in the rising voltages of on-state current at different drain voltages can be reduced. Note that this effect can be obtained when the electrodes 246 and 213 have the same potential or different potentials.

The BT stress test is one kind of accelerated test and can evaluate, in a short time, a change caused by long-term use (i.e., a change over time) in characteristics of transistors. In particular, the amount of change in threshold voltage of the transistor between before and after the BT stress test is an important indicator when examining the reliability of the transistor. If the amount of change in the threshold voltage between before and after the BT stress test is small, the transistor has higher reliability.

By providing the electrode 246 and the electrode 213 and setting the potentials of the electrode 246 and the electrode 213 to be the same, the change in threshold voltage is reduced. Accordingly, variation in electrical characteristics among a plurality of transistors is also reduced.

The transistor including the back gate electrode has a smaller change in threshold voltage by a positive GBT stress test in which positive electric charge is applied to a gate than a transistor including no back gate electrode.

In the case where light is incident on the back gate electrode side, when the back gate electrode is formed using a light-blocking conductive film, light can be prevented from entering the semiconductor layer from the back gate electrode side. Therefore, photodegradation of the semiconductor layer can be prevented and deterioration in electrical characteristics of the transistor, such as a shift of the threshold voltage, can be prevented.

With one embodiment of the present invention, a transistor with high reliability can be provided. Moreover, a semiconductor device with high reliability can be provided.

A transistor 420 shown in FIG. 31B1 as an example is a channel-protective transistor that is a type of bottom-gate transistor. The transistor 420 has substantially the same structure as the transistor 410 but is different from the transistor 410 in that the insulating layer 209 covers the semiconductor layer 242. Furthermore, the semiconductor layer 242 is electrically connected to the electrode 244 in the opening which is formed by selectively removing part of the insulating layer 209 overlapping the semiconductor layer 242. Furthermore, the semiconductor layer 242 is electrically connected to the electrode 245 in the opening which is formed by selectively removing part of the insulating layer 209 overlapping the semiconductor layer 242. A region of the insulating layer 209 which overlaps the channel formation region can function as a channel protective layer.

A transistor 421 illustrated in FIG. 31B2 is different from the transistor 420 in that the electrode 213 that can function as a back gate electrode is provided over the insulating layer 118.

With the insulating layer 209, the semiconductor layer 242 can be prevented from being exposed at the time of forming the electrode 244 and the electrode 245. Thus, the semiconductor layer 242 can be prevented from being reduced in thickness at the time of forming the electrode 244 and the electrode 245.

The distance between the electrode 244 and the electrode 246 and the distance between the electrode 245 and the electrode 246 in the transistors 420 and 421 are longer than those in the transistors 410 and 411. Thus, the parasitic capacitance generated between the electrode 244 and the electrode 246 can be reduced. The parasitic capacitance generated between the electrode 245 and the electrode 246 can also be reduced. According to one embodiment of the present invention, a transistor with favorable electrical characteristics can be provided.

<Top-gate Transistor>

A transistor 430 shown in FIG. 32A1 as an example is a type of top-gate transistor. The transistor 430 includes the semiconductor layer 242 over the insulating layer 109; the electrode 244 in contact with part of the semiconductor layer 242 and the electrode 245 in contact with part of the semiconductor layer 242, over the semiconductor layer 242 and the insulating layer 109; the insulating layer 117 over the semiconductor layer 242, the electrode 244, and the electrode 245; and the electrode 246 over the insulating layer 117.

Since, in the transistor 430, the electrode 246 overlaps with neither the electrode 244 nor the electrode 245, the parasitic capacitance generated between the electrode 246 and the electrode 244 and the parasitic capacitance generated between the electrode 246 and the electrode 245 can be reduced. After the formation of the electrode 246, an impurity element 255 is introduced into the semiconductor layer 242 using the electrode 246 as a mask, so that an impurity region can be formed in the semiconductor layer 242 in a self-aligned manner (see FIG. 32A3). According to one embodiment of the present invention, a transistor with favorable electrical characteristics can be provided.

The introduction of the impurity element 255 can be performed with an ion implantation apparatus, an ion doping apparatus, or a plasma treatment apparatus.

As the impurity element 255, for example, at least one kind of element of Group 13 elements and Group 15 elements can be used. In the case where an oxide semiconductor is used for the semiconductor layer 242, it is possible to use at least one kind of element of a rare gas, hydrogen, and nitrogen as the impurity element 255.

A transistor 431 illustrated in FIG. 32A2 is different from the transistor 430 in that the electrode 213 and an insulating layer 217 are provided. The transistor 431 includes the electrode 213 formed over the insulating layer 109 and the insulating layer 217 formed over the electrode 213. As described above, the electrode 213 can function as a back gate electrode. Thus, the insulating layer 217 can function as a gate insulating layer. The insulating layer 217 can be formed using a material and a method that are similar to those of the insulating layer 117.

The transistor 431 as well as the transistor 411 has large on-state current for the area occupied thereby. That is, the area occupied by the transistor 431 can be small for required on-state current. With one embodiment of the present invention, the area occupied by a transistor can be reduced. Therefore, with one embodiment of the present invention, a semiconductor device having a high degree of integration can be provided.

A transistor 440 shown in FIG. 32B1 as an example is a type of top-gate transistor. The transistor 440 is different from the transistor 430 in that the semiconductor layer 242 is formed after the formation of the electrode 244 and the electrode 245. A transistor 441 illustrated in FIG. 32B2 is different from the transistor 440 in that the electrode 213 and the insulating layer 217 are provided. Thus, in the transistors 440 and 441, part of the semiconductor layer 242 is formed over the electrode 244 and another part of the semiconductor layer 242 is formed over the electrode 245.

The transistor 441 as well as the transistor 411 has large on-state current for the area occupied thereby. That is, the area occupied by the transistor 441 can be small for required on-state current. With one embodiment of the present invention, the area occupied by a transistor can be reduced. Therefore, with one embodiment of the present invention, a semiconductor device having a high degree of integration can be provided.

Also in the transistors 440 and 441, after the formation of the electrode 246, the impurity element 255 is introduced into the semiconductor layer 242 using the electrode 246 as a mask, so that an impurity region can be formed in the semiconductor layer 242 in a self-aligned manner. According to one embodiment of the present invention, a transistor with favorable electrical characteristics can be provided. Furthermore, according to one embodiment of the present invention, a semiconductor device having a high degree of integration can be provided.

<S-channel Transistor>

A transistor 450 illustrated in FIGS. 33A to 33C has a structure in which a top surface and side surface of the semiconductor layer 242b are covered with the semiconductor layer 242c. FIG. 33A is the top view of the transistor 450. FIG. 33B is a cross-sectional view (in the channel length direction) taken along dashed-dotted line X1-X2 in FIG. 33A. FIG. 33C is a cross-sectional view (in the channel width direction) taken along dashed-dotted line Y1-Y2 in FIG. 33A.

With the semiconductor layer 242b provided on the projection of the insulating layer 109, the side surface of the semiconductor layer 242b can be covered with the electrode 243. Thus, the transistor 450 has a structure in which the semiconductor layer 242b can be electrically surrounded by electric field of the electrode 243. In this way, the structure of a transistor in which the semiconductor layer in which the channel is formed is electrically surrounded by the electric field of the conductive film is called a surrounded channel (s-channel) structure. A transistor having an s-channel structure is referred to as an s-channel transistor.

In the transistor with an s-channel structure, a channel is formed in the whole (bulk) of the semiconductor layer 242b in some cases. In the s-channel structure, the drain current of the transistor is increased, so that a larger amount of on-state current can be obtained. Furthermore, the entire channel formation region of the semiconductor layer 242b can be depleted by the electric field of the electrode 243. Accordingly, off-state current of the transistor with an s-channel structure can be further reduced.

When the projecting portion of the insulating layer 109 is increased in height, and the channel width is shortened, the effects of the s-channel structure to increase the on-state current and reduce the off-state current can be enhanced. Part of the semiconductor layer 242a exposed in the formation of the semiconductor layer 242b may be removed. In this case, the side surfaces of the semiconductor layer 242a and the semiconductor layer 242b may be aligned to each other.

As in a transistor 451 illustrated in FIGS. 34A to 34C, the electrode 213 may be provided below the semiconductor layer 242 with an insulating layer interposed therebetween. FIG. 34A is a top view of the transistor 451. FIG. 34B is a cross-sectional view taken along the dashed-dotted line X1-X2 in FIG. 34A. FIG. 34C is a cross-sectional view taken along the dashed-dotted line Y1-Y2 in FIG. 34A.

As in a transistor 452 illustrated in FIGS. 35A to 35C, a layer 214 may be provided over the electrode 243. FIG. 35A is a top view of the transistor 452. FIG. 35B is a cross-sectional view taken along the dashed-dotted line X1-X2 in FIG. 35A. FIG. 35C is a cross-sectional view taken along the dashed-dotted line Y1-Y2 in FIG. 35A.

The layer 214 is provided over the insulating layer 119 in FIGS. 35B and 35C; however, the layer 214 may be provided over the insulating layer 118. When the layer 214 is formed using a material having a light-blocking property, change in characteristics or decrease in reliability of the transistor, which is caused by light irradiation, can be prevented. When the layer 214 is formed at least larger than the semiconductor layer 242b such that the semiconductor layer 242b is covered with the layer 214, the above effects can be improved. The layer 214 can be formed using an organic material, an inorganic material, or a metal material. In the case where the layer 214 is formed using a conductive material, voltage can be supplied to the layer 214 or the layer 214 may be set to an electrically-floating state.

The electrode 245 becomes a floating state when the transistor 134 is turned off, and the capacitor 135 described in the above embodiments becomes easily affected by an ambient potential change such as noise. In other words, when the transistor 134 is turned off, the potential of the electrode 245 that can function as the node 152 may change owing to the influence of an ambient electric field such as noise.

<Node 152>

As illustrated in a cross-sectional view of FIG. 36, the provision of an electrode 212 below the electrode 245 included in the capacitor 135 with an insulating layer positioned therebetween can suppress a change in potential of the electrode 245 that can function as the node 152. The electrode 212 can be formed using a material and a method that are similar to those of the wiring 121.

This embodiment can be implemented in an appropriate combination with any of the structures described in the other embodiments.

(Embodiment 7)

In this embodiment, examples of an electronic device including an imaging device of one embodiment of the present invention will be described.

Examples of an electronic device including the imaging device of one embodiment of the present invention are as follows: display devices such as televisions and monitors, lighting devices, desktop personal computers and laptop personal computers, word processors, image reproduction devices which reproduce still images and moving images stored in recording media such as digital versatile discs (DVDs), portable CD players, radios, tape recorders, headphone stereos, stereos, navigation systems, table clocks, wall clocks, cordless phone handsets, transceivers, mobile phones, car phones, portable game consoles, tablet terminals, large game machines such as pinball machines, calculators, portable information terminals, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, electric power tools such as chain saws, smoke detectors, medical equipment such as dialyzers, facsimiles, printers, multifunction printers, automated teller machines (ATM), and vending machines. Further, industrial equipment such as guide lights, traffic lights, belt conveyors, elevators, escalators, industrial robots, power storage systems, and power storage devices for leveling the amount of power supply and smart grid can be given. In addition, moving objects and the like driven by electric motors using power from a power storage unit or the like are also included in the category of electronic devices. Examples of the moving objects are electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats, ships, submarines, helicopters, aircrafts, rockets, artificial satellites, space probes, planetary probes, and spacecrafts.

Figure 37A:
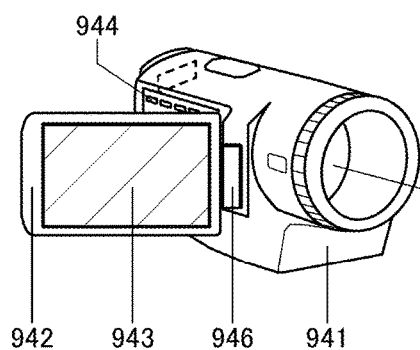
FIGS. 37A to 37F each illustrate an electronic device of one embodiment of the present invention.

FIG. 37A shows a video camera, which includes a first housing 941, a second housing 942, a display portion 943, operation switches 944, a lens 945, a joint 946, and the like. The operation switches 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942. The imaging device of one embodiment of the present invention can be provided in a focus position of the lens 945.

Figure 37B:
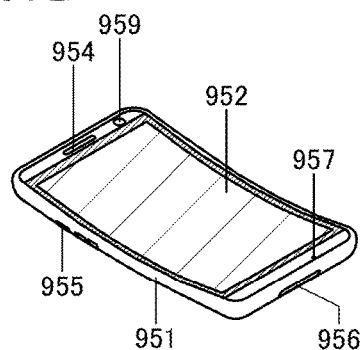

FIG. 37B shows a mobile phone, which includes a display portion 952, a microphone 957, a speaker 954, a camera 959, an input/output terminal 956, an operation switch 955, and the like in a housing 951. The imaging device of one embodiment of the present invention can be used for the camera 959.

Figure 37C:
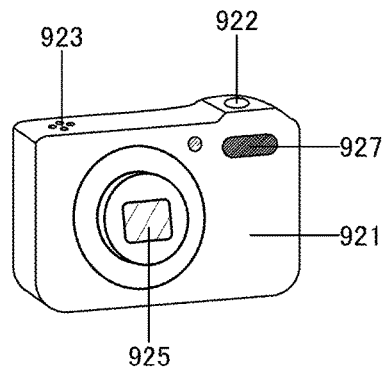

FIG. 37C shows a digital camera, which includes a housing 921, a shutter button 922, a microphone 923, a light-emitting portion 927, a lens 925, and the like. The imaging device of one embodiment of the present invention can be provided in a focus position of the lens 925.

Figure 37D:
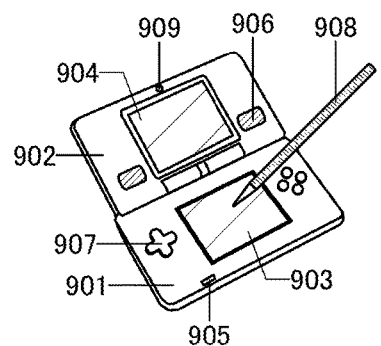

FIG. 37D illustrates a portable game console, which includes a housing 901, a housing 902, a display portion 903, a display portion 904, a microphone 905, a speaker 906, an operation switch 907, a stylus 908, a camera 909, and the like. Although the portable game console in FIG. 37D has the two display portions 903 and 904, the number of display portions included in a portable game console is not limited to this. The imaging device of one embodiment of the present invention can be used for the camera 909.

Figure 37E:
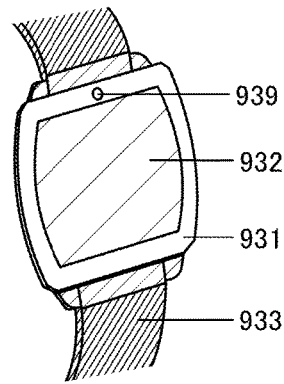

FIG. 37E shows a wrist-watch-type information terminal, which includes a housing 931, a display portion 932, a wristband 933, a camera 939, and the like. The display portion 932 may be a touch panel. The imaging device of one embodiment of the present invention can be used for the camera 939.

Figure 37F:
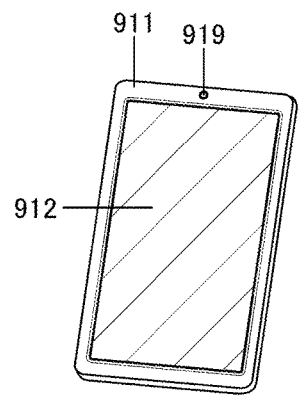

FIG. 37F shows a portable data terminal, which includes a first housing 911, a display portion 912, a camera 919, and the like. A touch panel function of the display portion 912 enables input and output of information. The imaging device of one embodiment of the present invention can be used for the camera 919.

Needless to say, the examples are not limited to the above-described electronic devices as long as the imaging device of one embodiment of the present invention is included.

This embodiment can be implemented in an appropriate combination with any of the structures described in the other embodiments.

This application is based on Japanese Patent Application serial no. 2014-132831 filed with Japan Patent Office on Jun. 27, 2014 and Japanese Patent Application serial no. 2014-138703 filed with Japan Patent Office on Jul. 4, 2014, the entire contents of which are hereby incorporated by reference.

What is claimed is:

1. An imaging device comprising:
   a pixel comprising:
   a first photoelectric conversion element; and
   a circuit comprising:
      a first transistor;
      a second transistor;
      a third transistor;
      a fourth transistor;
      a fifth transistor;
      a first capacitor; and
      a second capacitor,
   wherein one of a source and a drain of the first transistor is electrically connected to the first photoelectric conversion element, wherein the other of the source and the drain of the first transistor is electrically connected to one of a source and a drain of the second transistor and one electrode of the first capacitor, wherein one of a source and a drain of the third transistor is electrically connected to a gate of the fourth transistor, the other electrode of the first capacitor, and one electrode of the second capacitor, wherein the other of the source and the drain of the third transistor is electrically connected to the other electrode of the second capacitor, and wherein one of a source and the drain of the fourth transistor is electrically connected to one of a source and a drain of the fifth transistor.

2. The imaging device according to claim 1,
wherein the first photoelectric conversion element comprises an n-type semiconductor, a p-type semiconductor, and an i-type semiconductor, and
wherein a total area of a part of the i-type semiconductor overlapped with neither a metal material nor a semiconductor material that is comprised in the circuit is greater than or equal to 65% of an area of the whole i-type semiconductor in a plan view.

3. The imaging device according to claim 1,
wherein the first photoelectric conversion element comprises an n-type semiconductor, a p-type semiconductor, and an i-type semiconductor, and
wherein a total area of a part of the i-type semiconductor not overlapped with a light-blocking material comprised in the circuit is greater than or equal to 65% of an area of the whole i-type semiconductor in a plan view.

4. The imaging device according to claim 1,
wherein a semiconductor comprised in each of the first to fifth transistors is an oxide semiconductor.

5. imaging device according to claim 1,
wherein the first photoelectric conversion element comprises an n-type semiconductor, a p-type semiconductor, and an i-type semiconductor, and
wherein a semiconductor comprised in each of the first to fifth transistors has a band gap different from a band gap of the i-type semiconductor.

6. The imaging device according to claim 1,
wherein the first photoelectric conversion element comprises selenium.

7. The imaging device according to claim 1, comprising:
a second photoelectric conversion element,
wherein the first photoelectric conversion element and the second photoelectric conversion element each comprise an i-type semiconductor, and
wherein the i-type semiconductor comprised in the first photoelectric conversion element and the i-type semiconductor comprised in the second photoelectric conversion element are next to each other with an n-type semiconductor or a p-type semiconductor positioned therebetween.

8. An electronic device comprising:
the imaging device according to claim 1; and
one of a display device, an operation switch, a microphone, and a speaker.

9. An imaging device comprising:
a first pixel and a second pixel each comprising:
  a photoelectric conversion element; and
  a circuit comprising:
    a first transistor;
    a second transistor;
    a third transistor, one of a source and a drain of the third transistor electrically connected to one of a source and a drain of the second transistor;
    a fourth transistor;
    a fifth transistor, one of a source and a drain of the fifth transistor directly connected to the photoelectric conversion element, one of a source and a drain of the first transistor, and one of a source and a drain of the fourth transistor; and
    a capacitor, one electrode of the capacitor electrically connected to a gate of the third transistor and the other of the source and the drain of the fourth transistor, and the other electrode of the capacitor electrically connected to the other of the source and the drain of the third transistor,
wherein the other of the source and the drain of the fifth transistor of the first pixel is electrically connected to the other of the source and the drain of the fifth transistor of the second pixel.

10. The imaging device according to claim 9,
wherein the photoelectric conversion element comprises an n-type semiconductor, a p-type semiconductor, and an i-type semiconductor, and
wherein a total area of a part of the i-type semiconductor overlapped with neither a metal material nor a semiconductor material that is comprised in the circuit is greater than or equal to 65% of an area of the whole i-type semiconductor in a plan view.

11. The imaging device according to claim 9,
wherein the photoelectric conversion element comprises an n-type semiconductor, a p-type semiconductor, and an i-type semiconductor, and
wherein a total area of a part of the i-type semiconductor not overlapped with a light-blocking material comprised in the circuit is greater than or equal to 65% of an area of the whole i-type semiconductor in a plan view.

12. The imaging device according to claim 9,
wherein a semiconductor comprised in each of the first to fifth transistors is an oxide semiconductor.

13. The imaging device according to claim 9,
wherein the photoelectric conversion element comprises an n-type semiconductor, a p-type semiconductor, and an i-type semiconductor, and
wherein a semiconductor comprised in each of the first to fifth transistors has a band gap different from a band gap of the i-type semiconductor.

14. The imaging device according to claim 9,
wherein the photoelectric conversion element comprises selenium.

15. The imaging device according to claim 9,
wherein the photoelectric conversion elements of the first pixel and the second pixel each comprise an i-type semiconductor, and
wherein the i-type semiconductor comprised in the photoelectric conversion element of the first pixel and the i-type semiconductor comprised in the photoelectric conversion element of the second pixel are next to each other with an n-type semiconductor or a p-type semiconductor positioned therebetween.

16. An electronic device comprising:
the imaging device according to claim 9; and
one of a display device, an operation switch, a microphone, and a speaker.

17. An imaging device comprising:
a first photoelectric conversion element comprising an n-type semiconductor and a p-type semiconductor; and a circuit comprising a first transistor, a second transistor, a third transistor, a fourth transistor, a fifth transistor, a first capacitor, a second capacitor, a first wiring, a second wiring, a third wiring, a fourth wiring, a fifth wiring, a sixth wiring, a seventh wiring, an eighth wiring, and a ninth wiring, wherein the first wiring is electrically connected to one of the n-type semiconductor and the p-type semiconductor, wherein the other of the n-type semiconductor and the p-type semiconductor is electrically connected to one of a source and a drain of the first transistor, wherein a gate of the first transistor is electrically connected to the second wiring, wherein the other of the source and the drain of the first transistor is electrically connected to a first node, wherein one of a source and a drain of the second transistor is electrically connected to the first node, wherein the other of the source and the drain of the second transistor is electrically connected to the third wiring, wherein a gate of the second transistor is electrically connected to the fourth wiring, wherein one of a source and a drain of the third transistor is electrically connected to the fifth wiring, wherein the other of the source and the drain of the third transistor is electrically connected to a second node, wherein a gate of the third transistor is electrically connected to the sixth wiring, wherein one electrode of the first capacitor is electrically connected to the second node, wherein the other electrode of the first capacitor is electrically connected to the first node, wherein one electrode of the second capacitor is electrically connected to the fifth wiring, wherein the other electrode of the second capacitor is electrically connected to the second node, wherein a gate of the fourth transistor is electrically connected to the second node, wherein one of a source and a drain of the fourth transistor is electrically connected to the seventh wiring, wherein the other of the source and the drain of the fourth transistor is electrically connected to one of a source and a drain of the fifth transistor, wherein the other of the source and the drain of the fifth transistor is electrically connected to the eighth wiring, and wherein a gate of the fifth transistor is electrically connected to the ninth wiring.

18. The imaging device according to claim 17,
wherein the first photoelectric conversion element comprises an i-type semiconductor, and
wherein a total area of a part of the i-type semiconductor overlapped with neither a metal material nor a semiconductor material that is comprised in the circuit is greater than or equal to 65% of an area of the whole i-type semiconductor in a plan view.

19. The imaging device according to claim 17,
wherein the first photoelectric conversion element comprises an i-type semiconductor, and
wherein a total area of a part of the i-type semiconductor not overlapped with a light-blocking material comprised in the circuit is greater than or equal to 65% of an area of the whole i-type semiconductor in a plan view.

20. The imaging device according to claim 17,
wherein a semiconductor comprised in each of the first to fifth transistors is an oxide semiconductor.

21. The imaging device according to claim 17,
wherein the first photoelectric conversion element comprises an i-type semiconductor, and
wherein a semiconductor comprised in each of the first to fifth transistors has a band gap different from a band gap of the i-type semiconductor.

22. The imaging device according to claim 17, comprising:
a second photoelectric conversion element,
wherein the first photoelectric conversion element and the second photoelectric conversion element each comprise an i-type semiconductor, and
wherein the i-type semiconductor comprised in the first photoelectric conversion element and the i-type semiconductor comprised in the second photoelectric conversion element are next to each other with the n-type semiconductor or the p-type semiconductor positioned therebetween.

23. An electronic device comprising:
the imaging device according to claim 17; and
one of a display device, an operation switch, a microphone, and a speaker.

24. An imaging device comprising:
a first photoelectric conversion element comprising an n-type semiconductor and a p-type semiconductor; and
a circuit comprising a first transistor, a second transistor, a third transistor, a fourth transistor, a fifth transistor, a capacitor, a first wiring, a second wiring, a third wiring, a fourth wiring, a fifth wiring, a sixth wiring, a seventh wiring, an eighth wiring, and a ninth wiring, wherein the first wiring is electrically connected to one of the n-type semiconductor and the p-type semiconductor, wherein the other of the n-type semiconductor and the p-type semiconductor is directly connected to a first node, wherein one of a source and a drain of the first transistor is directly connected to the first node, wherein a gate of the first transistor is electrically connected to the second wiring, wherein the other of the source and the drain of the first transistor is electrically connected to the seventh wiring, wherein one of a source and a drain of the second transistor is electrically connected to the eighth wiring, wherein the other of the source and the drain of the second transistor is electrically connected to one of a source and a drain of the third transistor, wherein a gate of the second transistor is electrically connected to the third wiring, wherein the other of the source and the drain of the third transistor is electrically connected to the fourth wiring, wherein a gate of the third transistor is electrically connected to a second node, wherein one of a source and a drain of the fourth transistor is directly connected to the first node, wherein the other of the source and the drain of the fourth transistor is electrically connected to the second node, wherein a gate of the fourth transistor is electrically connected to the sixth wiring, wherein one of a source and a drain of the fifth transistor is electrically connected to the ninth wiring, wherein the other of the source and the drain of the fifth transistor is directly connected to the first node, wherein one electrode of the capacitor is electrically connected to the second node, wherein the other electrode of the capacitor is electrically connected to the fourth wiring, and wherein a gate of the fifth transistor is electrically connected to the fifth wiring.

25. The imaging device according to claim 24,
wherein the first photoelectric conversion element comprises an i-type semiconductor, and
wherein a total area of a part of the i-type semiconductor overlapped with neither a metal material nor a semiconductor material that is comprised in the circuit is greater than or equal to 65% of an area of the whole i-type semiconductor in a plan view.

26. The imaging device according to claim 24,
wherein the first photoelectric conversion element comprises an i-type semiconductor, and
wherein a total area of a part of the i-type semiconductor not overlapped with a light-blocking material comprised in the circuit is greater than or equal to 65% of an area of the whole i-type semiconductor in a plan view.

27. The imaging device according to claim 24,
wherein a semiconductor comprised in each of the first to fifth transistors is an oxide semiconductor.

28. The imaging device according to claim 24,
wherein the first photoelectric conversion element comprises an i-type semiconductor, and
wherein a semiconductor comprised in each of the first to fifth transistors has a band gap different from a band gap of the i-type semiconductor.

29. The imaging device according to claim 24, comprising:
a second photoelectric conversion element,
wherein the first photoelectric conversion element and the second photoelectric conversion element each comprise an i-type semiconductor, and
wherein the i-type semiconductor comprised in the first photoelectric conversion element and the i-type semiconductor comprised in the second photoelectric conversion element are next to each other with the n-type semiconductor or the p-type semiconductor positioned therebetween.

30. An electronic device comprising:
the imaging device according to claim 24; and
one of a display device, an operation switch, a microphone, and a speaker.

* * * * *